(12) United States Patent
Chornenky

(10) Patent No.: US 10,719,079 B2
(45) Date of Patent: Jul. 21, 2020

(54) ASYNCHRONOUS CLOCK-LESS DIGITAL LOGIC PATH PLANNING APPARATUS AND METHOD

(71) Applicant: NOKOMIS, INC., Charleroi, PA (US)

(72) Inventor: T. Eric Chornenky, Carmichaels, PA (US)

(73) Assignee: NOKOMIS, INC., Charleroi, PA (US)

( * ) Notice: Subject to any disclaimer, the term of this patent is extended or adjusted under 35 U.S.C. 154(b) by 130 days.

(21) Appl. No.: 15/820,358

(22) Filed: Nov. 21, 2017

(65) Prior Publication Data

US 2018/0373248 A1  Dec. 27, 2018

Related U.S. Application Data

(60) Provisional application No. 62/588,177, filed on Nov. 17, 2017, provisional application No. 62/604,076, filed on Jun. 22, 2017.

(51) Int. Cl.

| | |
|---|---|
| *G06F 3/06* | (2006.01) |
| *G06F 15/00* | (2006.01) |
| *G11C 7/22* | (2006.01) |
| *G11C 7/10* | (2006.01) |
| *G06F 7/76* | (2006.01) |
| *G11C 5/02* | (2006.01) |
| *H03K 19/177* | (2020.01) |
| *G05D 1/00* | (2006.01) |

(Continued)

(52) U.S. Cl.
CPC ....... *G05D 1/0088* (2013.01); *B60R 16/0231* (2013.01); *G05D 1/0278* (2013.01); *G06F 3/061* (2013.01); *G06F 3/0604* (2013.01); *G06F 3/0659* (2013.01); *G06F 3/0688* (2013.01); *G06F 7/76* (2013.01); *G06F 15/00* (2013.01); *G11C 5/025* (2013.01); *G11C 7/10* (2013.01); *G11C 7/22* (2013.01); *H03K 19/177* (2013.01); *G11C 7/106* (2013.01); *G11C 7/109* (2013.01); *G11C 7/1087* (2013.01); *H03K 3/037* (2013.01)

(58) Field of Classification Search
CPC ............... G05D 1/0088; G05D 1/0278; B60R 16/0231; G06F 3/0659; G06F 15/00; G06F 7/76; G06F 3/0604; G06F 3/061; G06F 3/0688; G11C 7/1087; G11C 7/109; G11C 7/106; G11C 7/22; G11C 7/10; G11C 5/025; H03K 3/037; H03K 19/177
See application file for complete search history.

(56) References Cited

U.S. PATENT DOCUMENTS

| | | |
|---|---|---|
| 5,003,200 A | 3/1991 | Sakamoto |
| 5,243,238 A | 9/1993 | Kean |

(Continued)

OTHER PUBLICATIONS

James Morra; Achronix's Success Reflects Growth for FPGA Accelerators; Electronic Design; Jun. 15, 2017; www.electronicdesign.com/embedded-revolution/achronixs-success-reflects-growth-fpga-accelerators?NL=ED-001&Issue=ED-001_20170616_ED-001_368&SFVC4ENEWS=42&CL=ARTICLE_2_B&UTM_RID=cpg05000004741574&utm_campaign=11630&utm_mediium=email&elq2=cb9da943223489t83e018b5d622430d.

*Primary Examiner* — Daniel D Chang
(74) *Attorney, Agent, or Firm* — AP Patents

(57) ABSTRACT

A hybrid of initial time consuming phase of a Single Directional Dijkstra's Algorithm is embodied on an unclocked CMOS logic chip using a parallelized approach with Asynchronous Digital Logic (ADL). The chip includes a a plurality of addressable configurable cells arranged as a multidimensional orthogonal array. The cell array only executes mathematical operations based on a communication between immediately adjacent cells.

20 Claims, 36 Drawing Sheets

(51) Int. Cl.
*G05D 1/02* (2020.01)
*B60R 16/023* (2006.01)
*H03K 3/037* (2006.01)

(56) References Cited

U.S. PATENT DOCUMENTS

| | | | |
|---|---|---|---|
| 7,157,934 B2 * | 1/2007 | Teifel | H03K 19/17736 |
| | | | 326/38 |
| 7,880,499 B2 * | 2/2011 | Manohar | H03K 19/17728 |
| | | | 326/39 |
| 8,013,629 B2 | 9/2011 | Dalrymple et al. | |
| 2003/0011398 A1 | 1/2003 | Herr | |
| 2010/0033228 A1 | 2/2010 | Gershenfeld et al. | |
| 2010/0102848 A1 | 4/2010 | Gershenfeld et al. | |
| 2010/0185837 A1 | 7/2010 | Dalrymple et al. | |
| 2012/0025868 A1 | 2/2012 | Gershenfeld et al. | |
| 2012/0062277 A1 | 3/2012 | Dalrymple et al. | |
| 2015/0042377 A1 * | 2/2015 | Satou | H03K 19/17732 |
| | | | 326/16 |
| 2016/0328011 A1 | 11/2016 | Raghavan | |
| 2018/0001472 A1 | 1/2018 | Konidaris et al. | |

* cited by examiner

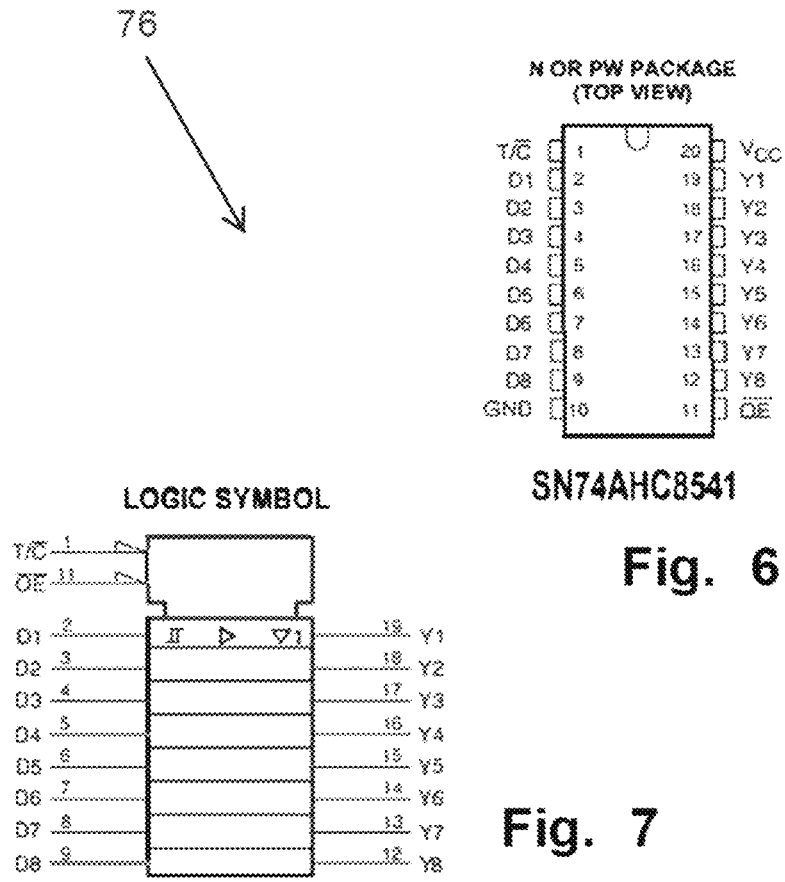
Fig. 6
Fig. 7
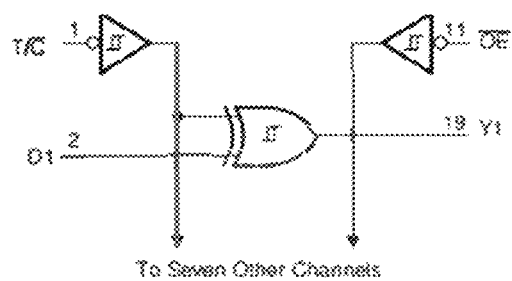
**Fig. 8

16-BIT NON-INVERTING SCHMITT-TRIGGER BUFFER WITH 3-STATE OUTPUTS

Gated D latch without unneeded/unused ~Q output
D is binary data in. E is enable Symbol for a gated D latch Gated D latch truth table

| E/C | D | Q | Comment |
|---|---|---|---|
| 0 | X | $Q_{prev}$ | No change |
| 1 | 0 | 0 | Reset |
| 1 | 1 | 1 | Set |

The truth table shows that when the enable input is 0, the D input has no effect on the output. When E is high, the output equals D.

| Binary | Gray |
|--------|------|
| 0000 | 0000 |
| 0001 | 0001 |
| 0010 | 0011 |
| 0011 | 0010 |
| 0100 | 0110 |
| 0101 | 0111 |
| 0110 | 0101 |
| 0111 | 0100 |
| 1000 | 1100 |
| 1001 | 1101 |
| 1010 | 1111 |
| 1011 | 1110 |
| 1100 | 1010 |
| 1101 | 1011 |
| 1110 | 1001 |
| 1111 | 1000 |

Fig. 36

ASYNCHRONOUS CLOCK-LESS DIGITAL LOGIC PATH PLANNING APPARATUS AND METHOD

CROSS-REFERENCE TO RELATED APPLICATIONS

The present non-provisional application is related to and claims benefit of and priority from provisional U.S. patent application No. 62/588,177, titled "Asynchronous Clockless Digital Logic Path Planning Apparatus and Method" and filed on Nov. 17, 2017 by inventor T. Eric Chornenky, the entire contents of which are hereby incorporated by reference thereto. This present non-provisional application is related to and claims benefit of and priority from U.S. Provisional Patent Application Ser. No. 62/604,076, titled "Asynchronous Clock-less Digital Logic Path Planning Apparatus and Method" and filed on Jun. 22, 2017 by inventor Eric Chornenky, the entire contents of which are hereby incorporated by reference thereto.

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND

1. Technical Field

The subject matter relates to asynchronous processing chips. It further relates to path planning for self-directed vehicles, path optimization advisement or selection for humans, and robots.

2. Description of Related Art

The following background information may present examples of specific aspects of the prior art (e.g., without limitation, approaches, facts, or common wisdom) that, while expected to be helpful to further educate the reader as to additional aspects of the prior art, is not to be construed as limiting the present subject matter, or any embodiments thereof, to anything stated or implied therein or inferred thereupon.

Generally, self-directed vehicles (i.e. vehicles operated without presence of a human being inside the vehicles) can include Unmanned Ground Vehicles (UGV), Unmanned Aerial Vehicles (UAV), Unmanned (naval) Surface Vehicles (USV), Quadcopters, Drones, robots, self-driving autos, pick and place robots in a crowded environment, and delivery robots. An explosion in the use of these vehicles has made designers and users acutely aware of the need and desirability for semi-autonomous or fully autonomous real-time control systems for these applications. Traditional approaches generally can require significant computing power and/or computing time, translating directly to physical watt-hours and kilograms of added weight needed to accomplish this task. As a result, fast response times may not been achievable with ubiquitous lightweight small land and air vehicles being developed for use worldwide.

For these vehicles, depth and breadth of required planning can range from simple avoidance maneuvers to multi-simultaneous path allocations rivaling or even exceeding the complexity experienced in Chess. Optimizations for minimal time-to-target, fuel usage, safety margins, multiple simultaneous coordinated vehicle path planning, and/or path length minimization add to the difficulty of the problem. Current technology can require 10's to 100's and even occasionally 1000's of watts when implementing GPU boards with an associated large heavy power source, (and associated cooling capacity), resulting in a system that may not meet the Size, Weight and Power (SWaP) requirements of large drones, much less medium to small units.

Traditionally, addressing and solving such problems has been performed on standard sequential or parallelized clock-based digital/computational logic platforms requiring substantial processing power, memory, and/or processing time. Current leading edge research has proposed and studied well known power-intensive Register-Transfer-Logic (RTL) based FPGA designs, CPU hardware and software designs, and/or Graphics Processing Units (GPU) based approaches to achieve results, sometimes with limited parallelism. Specialized software/firmware configurations can be required to enable these general-purpose platforms to better conform to the requirements of a solution embodied within them. This approach, requiring substantial power and volume using even the most up-to-date low-voltage semiconductor dies, with chip process geometries well below 32 nm trace widths, remains a poorly suited solution for single small autonomous mobile robots or drones. Current embodiments of such systems are on board level or PC level scales with SWaP parameters of one order of magnitude to several orders of magnitude larger than the invention solution. The requirements scale up exponentially for a swarm of such units moving in a coordinated fashion to achieve a common 'understood' objective without excessive intercommunication and processing latency.

Therefore, there is at least a need for a new or improved technology embodied in hardware and software to at least address this onerous open-ended tasking.

There is at least a further need to fully enable or increase the potential capabilities of self-directed vehicles.

BRIEF DESCRIPTION OF THE DRAWINGS

The accompanying drawings are incorporated in and constitute part of the specification and illustrate various embodiments. In the drawings:

FIG. 6 illustrates a pin designation of an exemplary Schmitt trigger circuit with an output enable feature to a tri-state bus allowing multiple output circuits to be connected to the same bus and communicating using the same bus by enabling only one output circuit at a time;

FIG. 7 illustrates a logic symbol of the Schmitt trigger of FIG. 6;

FIG. 8 illustrates a schematic circuit of the Schmitt trigger of FIG. 6;

Figure 34A:
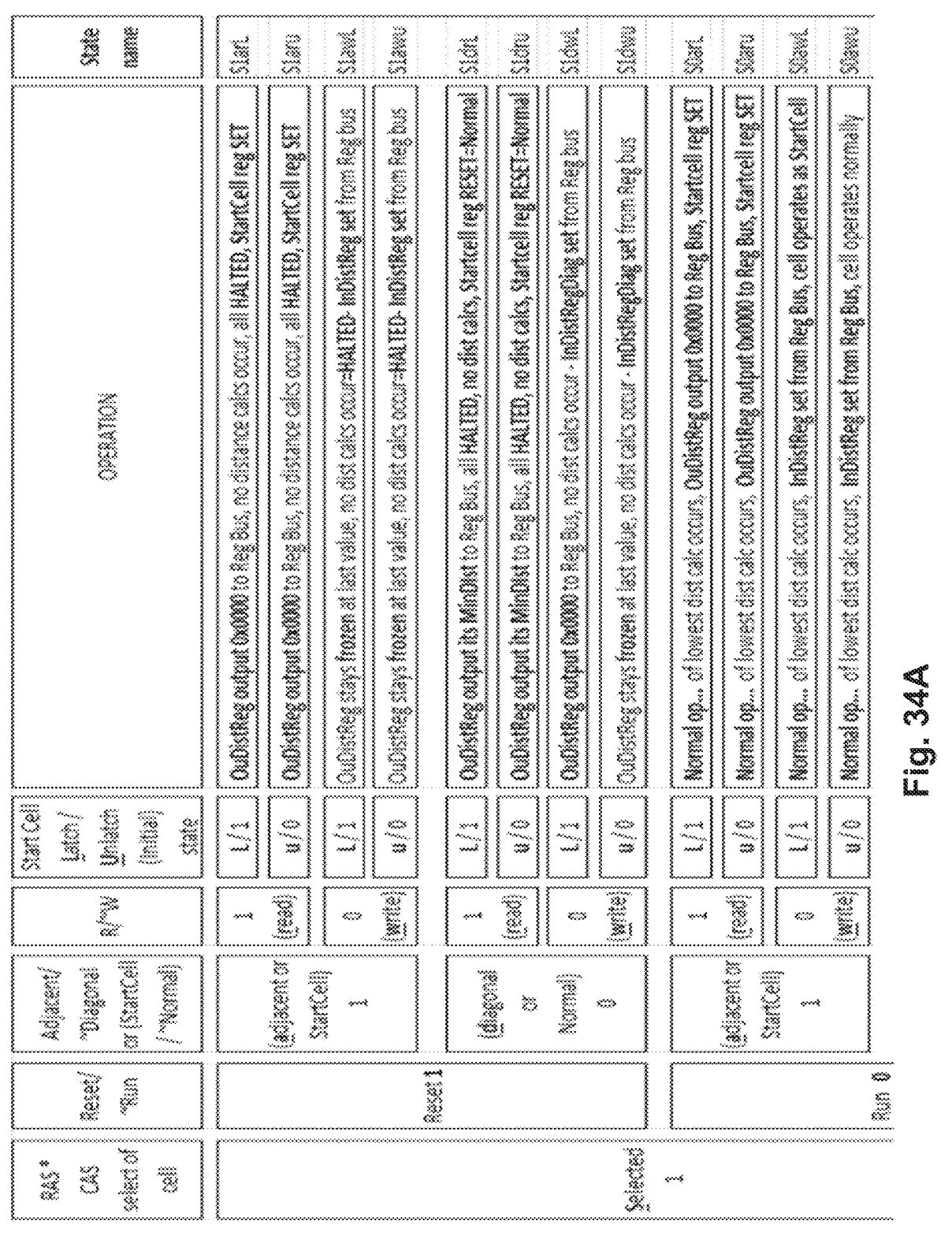
Figure 34B:
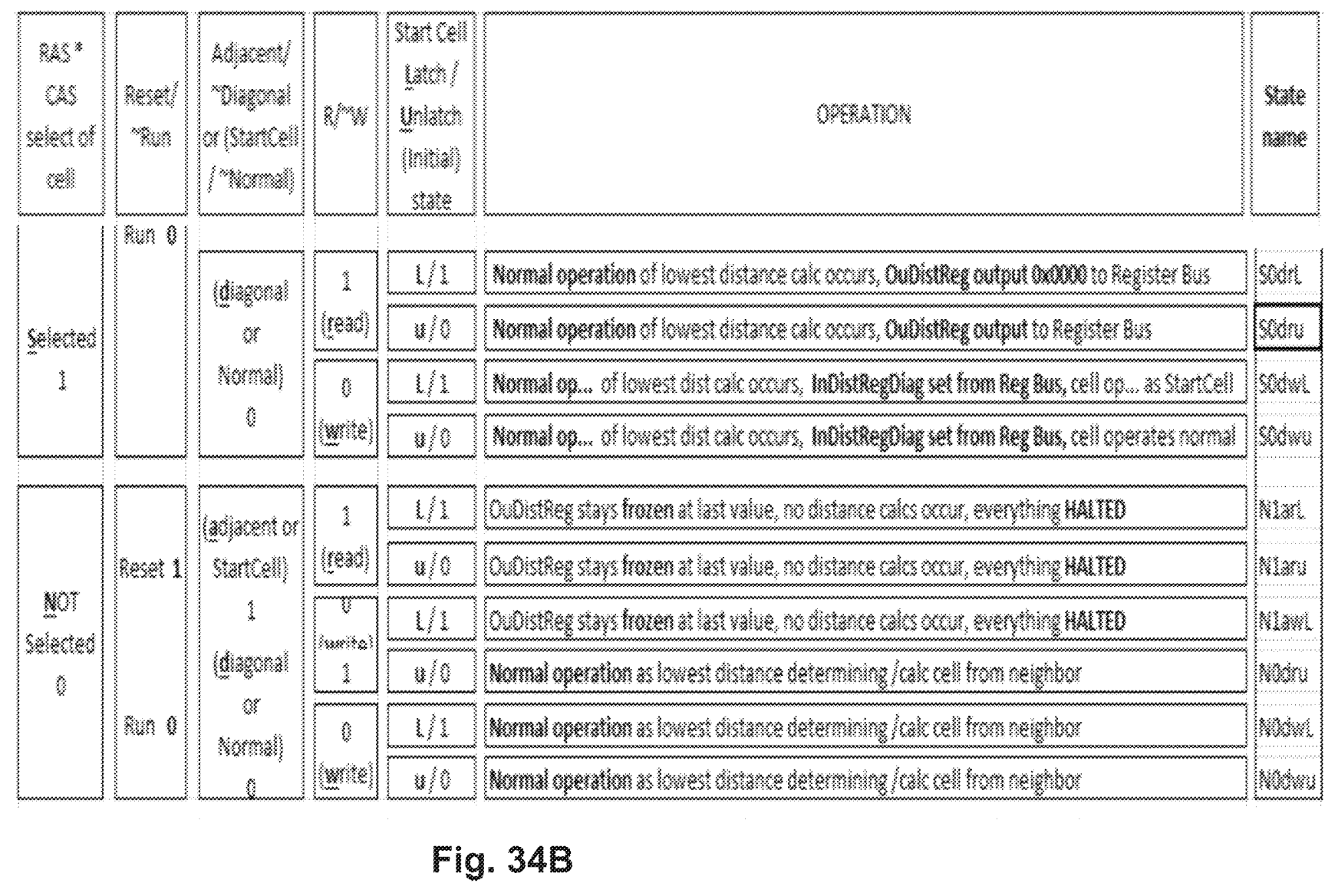

FIG. 34 illustrates an exemplary truth table of all possible control line and cell states and functionality, with State names chosen for reference purposes;

Figure 35:
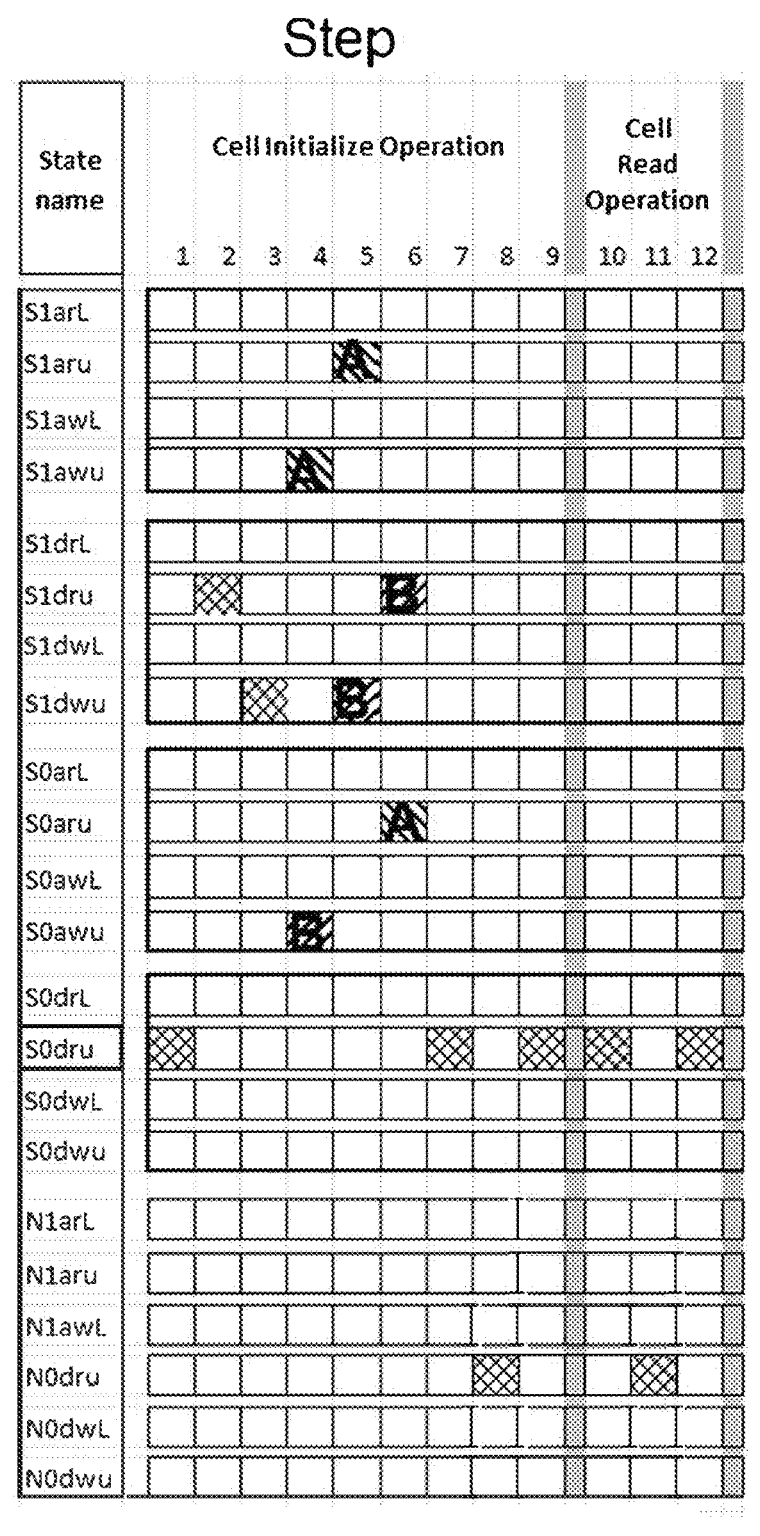

FIG. 35 illustrates an exemplary state change sequence to load, execute, read and write cell results;

FIG. 36 illustrates a sequence of bit combinations that can achieve all possible numeric values by changing only 1 bit at a time.

DETAILED DESCRIPTION OF EXEMPLARY EMBODIMENTS

Figure 1:
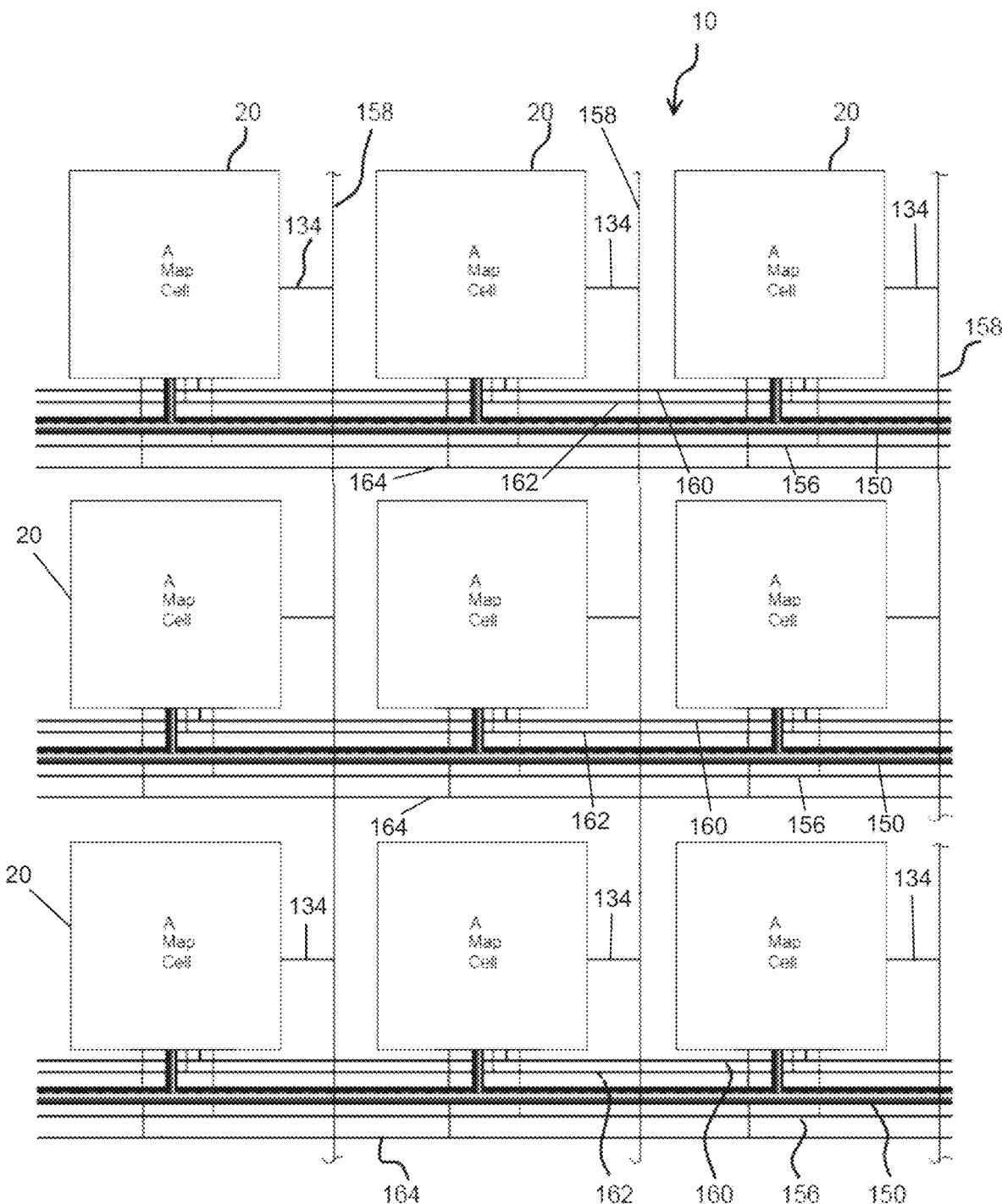
FIG. 1 illustrates connections of an exemplary 3×3 cell array section connected to the array data bus and Control Lines.

Prior to proceeding to the more detailed description of the present subject matter, it should be noted that, for the sake of clarity and understanding, identical components which have identical functions have been identified with identical reference numerals throughout the several views illustrated in the drawing figures.

The following detailed description is merely exemplary in nature and is not intended to limit the described examples or the application and uses of the described examples. As used herein, the words "example", "exemplary" or "illustrative" means "serving as an example, instance, or illustration." Any implementation described herein as "example", "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

References in the specification to "an embodiment", "an example" and similar phrases mean that a particular feature, structure, or characteristic described in connection with the embodiment or variation, is included in at least an embodiment or variation of the invention. The phrase "in an embodiment", "in an example" or similar phrases, as used in various places in the specification, are not necessarily meant to refer to the same embodiment or the same variation.

The terms and words used in the following description and claims are not limited to the bibliographical meanings, but, are merely used to enable a clear and consistent understanding of the exemplary embodiments. Accordingly, it should be apparent to those skilled in the art that the following description of exemplary embodiments are provided for illustration purpose only and not for the purpose of limiting the invention as defined by the appended claims and their equivalents.

Furthermore, there is no intention to be bound by any expressed or implied theory presented in the preceding technical field, background, or the following detailed description. It is also to be understood that the specific devices and processes illustrated in the attached drawings, and described in the following specification, are simply examples of the inventive concepts defined in the appended claims. Hence, specific dimensions and other physical characteristics relating to the examples disclosed herein are not to be considered as limiting, unless the claims expressly state otherwise.

Unless defined, all terms (including technical and scientific terms) used herein have the same meaning as common understood by one of ordnary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defned herein.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

The term "without a use of any clock", when used in this specification and appended claims, refers to a structure that does not use any clock component or a circuit, that may be called as a self-clocking circuit, configured to generate a time delay.

It is to be understood that the singular forms "a," "an," and "the" include plural referents unless the context clearly dictates otherwise. Thus, for example, reference to "a cell" includes reference to one or more of such cells.

The particular embodiments of the present disclosure generally provide devices, systems and methods directed to asynchronous, clock-less data processors or co-processors.

The particular embodiments of the present disclosure generally provide devices, systems and methods directed to circuits performing useful numerical and or logical operations using distributed scalable processing elements individually containing substantially identical memory and processing elements.

The particular embodiments of the present disclosure generally provide distributed scalable processing elements which communicate to their neighbors in their local neighborhood using separate local data buses.

The particular embodiments of the present disclosure generally provide distributed scalable processing elements which continuously communicate results to their local neighbors.

The particular embodiments of the present disclosure generally provide distributed scalable processing elements which continuously receive results from their local neighbors.

The particular embodiments of the present disclosure generally provide distributed scalable processing elements which continuously communicate results to their local neighbors.

The particular embodiments of the present disclosure generally provide distributed scalable processing elements which continuously both receive results from and communicate results to their local neighbors.

The particular embodiments of the present disclosure generally provide distributed scalable processing elements which simultaneously process data.

The particular embodiments of the present disclosure generally provide distributed scalable processing elements which continuously process data.

The particular embodiments of the present disclosure generally provide distributed scalable processing elements which usefully process data independent of each other without external coordination being provided.

The particular embodiments of the present disclosure generally provide distributed scalable processing elements which simultaneously receive data from their local neighbors, simultaneously process that data, and simultaneously communicate the processed results of the received data from their local neighbors to their local neighbors.

The particular embodiments of the present disclosure generally provide distributed scalable processing elements which continuously receive data from their local neighbors, continuously process that data, and continuously communicate the processed results of the received data from their local neighbors to their local neighbors.

The particular embodiments of the present disclosure generally provide distributed scalable processing elements which continuously, simultaneously, clocklessly, and asynchronously receive data from their local neighbors, continuously, simultaneously, clocklessly, and asynchronously process that data, and continuously, simultaneously, clocklessly, and asynchronously communicate the processed results of the received data from their local neighbors to these same local neighbors.

The particular embodiments of the present disclosure generally provide distributed scalable processing elements which may continuously, simultaneously, clocklessly, and asynchronously operate at differing speeds but eventually yield the correct results.

The particular embodiments of the present disclosure generally provide distributed scalable processing elements which may further be comprised of processing elements which may continuously, simultaneously, clocklessly, and asynchronously operate at differing speeds but eventually yield the correct results.

In particular embodiments, the devices, systems and/or methods employ a hybrid of the initial time consuming phase of a Single Directional Dijkstra's Algorithm embodied on an unclocked CMOS logic chip using a Parallelized approach with Asynchronous Digital Logic (ADL). The chip includes a plurality of addressable configurable cells arranged as a multidimensional orthogonal array. The cell array only executes mathetical operations based on a communication between immediately adjacent cells. This approach can bypass the technological challenges of SWaP reduction associated with traditional processor technologies. The design may be implemented for example in a small 180 nm process geometries chip under 10 mm×10 mm area to solve the multipath optimization approach using the Dijkstra Algorithm and achieving SWaP reductions. Orders of magnitude more reduction can be had by applying more expensive process geometries at or below 32 nm.

In particular embodiments, an unsynchronized Parallel-Processing Clock-less Asynchronous Digital Logic (ADL) approach is employed in control device(s) and/or program logic. The design is based on a difficult but proven asynchronous logic technology, implemented at a scale to achieve the lowest possible power usage, and fastest possible solution time, thus providing maximum system platform and. self-directed hardware based mission versatility, for example enabling lower power, lighter, smaller robotic platforms. Whether using state-of-the-art ultra-small, fast and low-power newer 14-nm processes or more common older 180-nm inexpensive industry standard IC process geometries, the subject matter is embodied as a highly specialized single chip, co-processor, or Multi-chip-Module (MCM) solution that can achieve the beneficial and necessary reductions in total SWaP required for even the smallest self-directed vehicles. The employed asynchronous, parallelized, clockless approach is a non-standard approach as compared to traditional approaches.

In particular embodiments, a custom-designed clock-less, parallel processing asynchronous-digital-logic approach is employed to create a high-speed, low-power, 'low-level' path-planning/shortest path(s) finding, single-purpose dedicated processing chip to quickly and simultaneously search the current best path(s) to target.

In particular embodiments, an instantiated Single-Directional variant of the Dijkstra Algorithm (SDDA) is implemented in an array of ADL unit cells on a 180-nm process die with an estimated node cell size of under 82 microns.

In particular embodiments, other variants such as a dual-directional Dijkstra Algorithm are contemplated. More complex variants would typically require more design time and effort on the part of the chip designer and chip design software.

Figure 3:
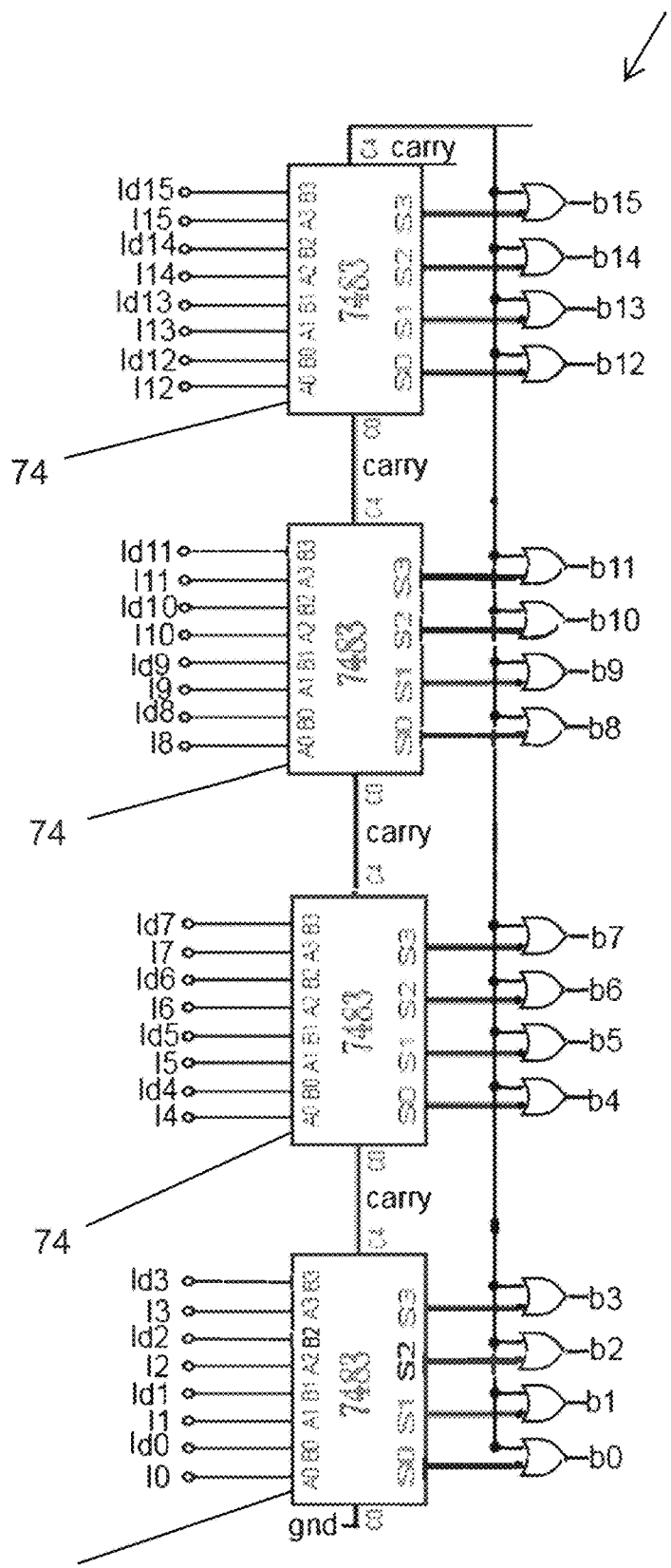
FIG. 3 illustrates an exemplary approach of combining 4-bit adders of FIG. 4 to achieve a 16-bit adder circuit with a feature forcing an output to the highest value during an overflow condition.
Figure 4:
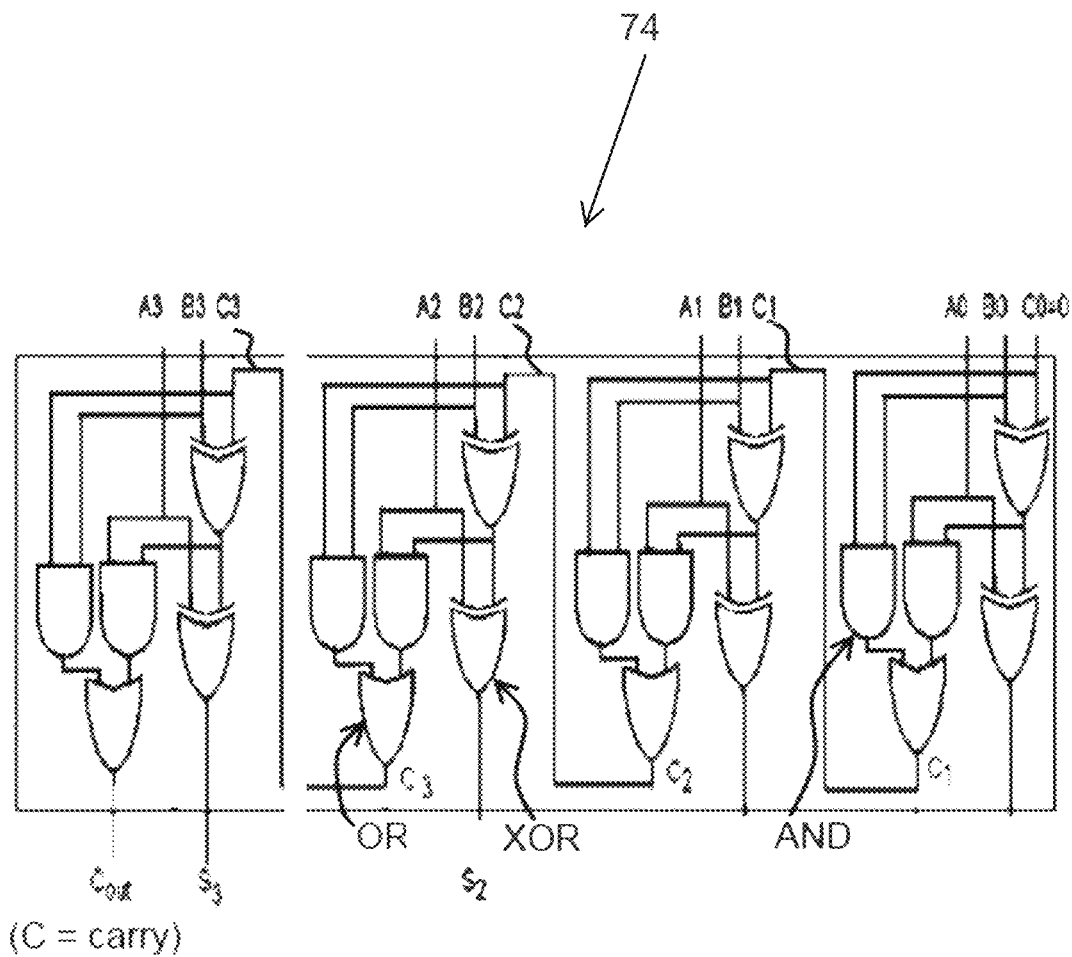
FIG. 4 illustrates an exemplary 4-bit adder circuit.
Figure 5:
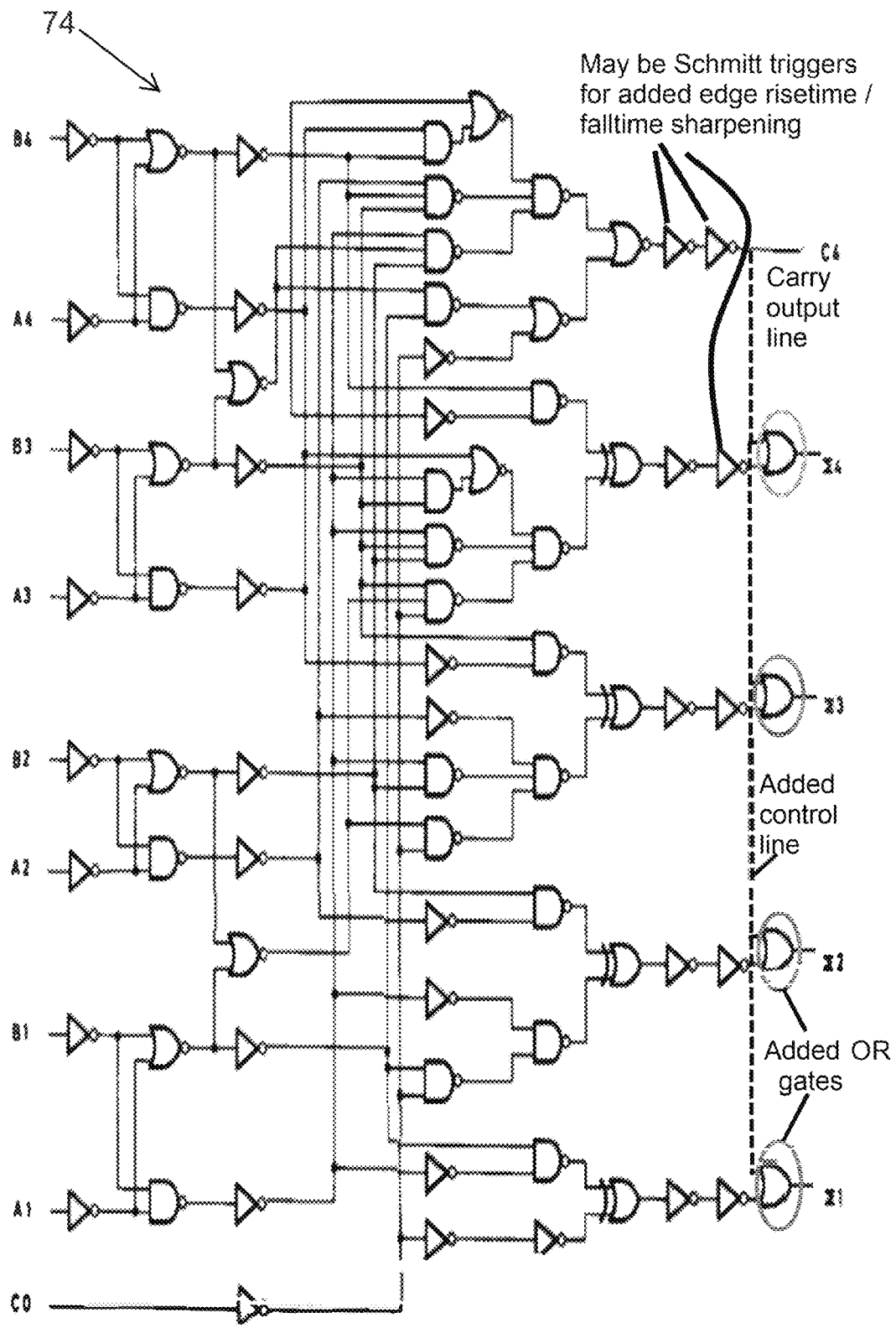
FIG. 5 illustrates an exemplary 4-bit adder circuit of FIG. 4 with Schmitt triggers to reduce current draw under some conditions and an additional circuit forcing all outputs high when an overflow or carry condition of addition of input line values is present.
Figures 9A, 9B:
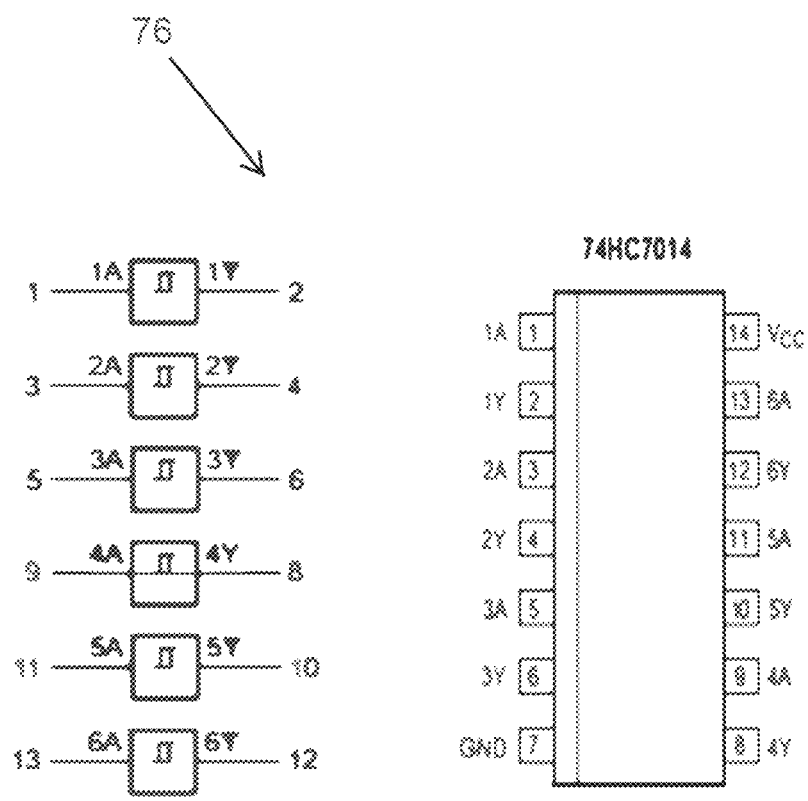
FIG. 9A illustrates a logic element of an exemplary Schmitt trigger circuit without an output enable feature.
FIG. 9B illustrates a symbolic representation of the Schmitt trigger of FIG. 9A.

Now in a reference to the drawings, FIGS. 1-17 illustrate an embodiment of a cell array core 10 for a reconfigurable, asynchronous, and clock-less co-processor 200 where the cell array core 10 only executes arithmetical operations and a method of using such co-processor 200 with cell array core 10 to determine a shortest travel path for a self-directed vehicle 350. The cell array core 10 comprises a plurality of addressable configurable cells 20 arranged as a multidimensional orthogonal array. FIG. 1 illustrates a 3×3 cell array or a cell array core 10, although any cell array core size can be used. In a particular reference to FIGS. 2 and 10, each cell 20 from the plurality of addressable configurable cells 20 comprises a cell input/output (I/O) interface 30 to interface only with immediately adjacent cells 20. I/O interface 30 comprises a plurality of orthogonal cell inputs 32, 34, 36, and 38, a plurality of a diagonal cell inputs 42, 44, 46, and 48, a plurality of orthogonal cell outputs 52, 54, 56, and 58, a plurality of a diagonal cell outputs 62, 64, 66, and 68. As it will be explained in more details below, each cell input is coupled to or is connected to one output from a respective immediately adjacent cell 20. The cell 20 also comprises a plurality of 16-bit input adders 72. Each 16-bit input adder 72 from the plurality of 16-bit input adders 72 being in a 16-bit register connection with one cell input from the plurality of cell I/Os. The 16-bit input adder 72 can be of the type as illustrated in FIG. 3. More particularly, the 16-bit input adder 72 can be comprised by four 4-bit adder portion 74. Cascaded 4-bit adders forming 16-bit adder with carry (overflow) used to generate highest/maximum value of 0xFFFF when overflow occurs. In an example, the 4-bit adder portion 74 can be of the type as illustrated in FIG. 4. In an example, the 4-bit adder portion 74 can be of the type as illustrated in FIG. 5 and further including Schmitt triggers 76. The adder portion 74 of FIG. 5, for example as manufactured under PN CD74HC283, is a 4-bit binary full adder with added OR gates connected to carry bit to illustrate how carry bit can be used to force high values with modifications to output 0xF if carry bit is set (0xF for 4-bits, 0xFFFF for 16-bis in cascaded 16-bit adder). In an example, Schmitt trigger 76 can be of a 8-bit inverting/non-inverting buffer type with 3-stage outputs, as illustrated in FIGS. 6-8. This Schmitt trigger 76 can be manufactured under P/N SN74AHC8541. In such Schmitt trigger 76, T/-C input may be held high to select non-inverting output operation. When −OE is being held high, all outputs are disabled (high-impedance). When −OE is being held low, data is passed through to outputs via conditioning Schmitt triggers. In an example, Schmitt trigger 76 can be a hex non-inverting precision Schmitt trigger, for example as manufactured under PN 74HC7014. The 74HC7014 is a hex buffer with precision Schmitt-trigger inputs. The precisely defined trigger levels are lying in a window between 0.55 VCC and 0.65 VCC. It makes the circuit suitable to operate in a highly noisy environment. Schmitt trigger of FIGS. 9A-9B inputs transform slowly changing input signals into sharply defined jitter-free output signals.

Figure 10:
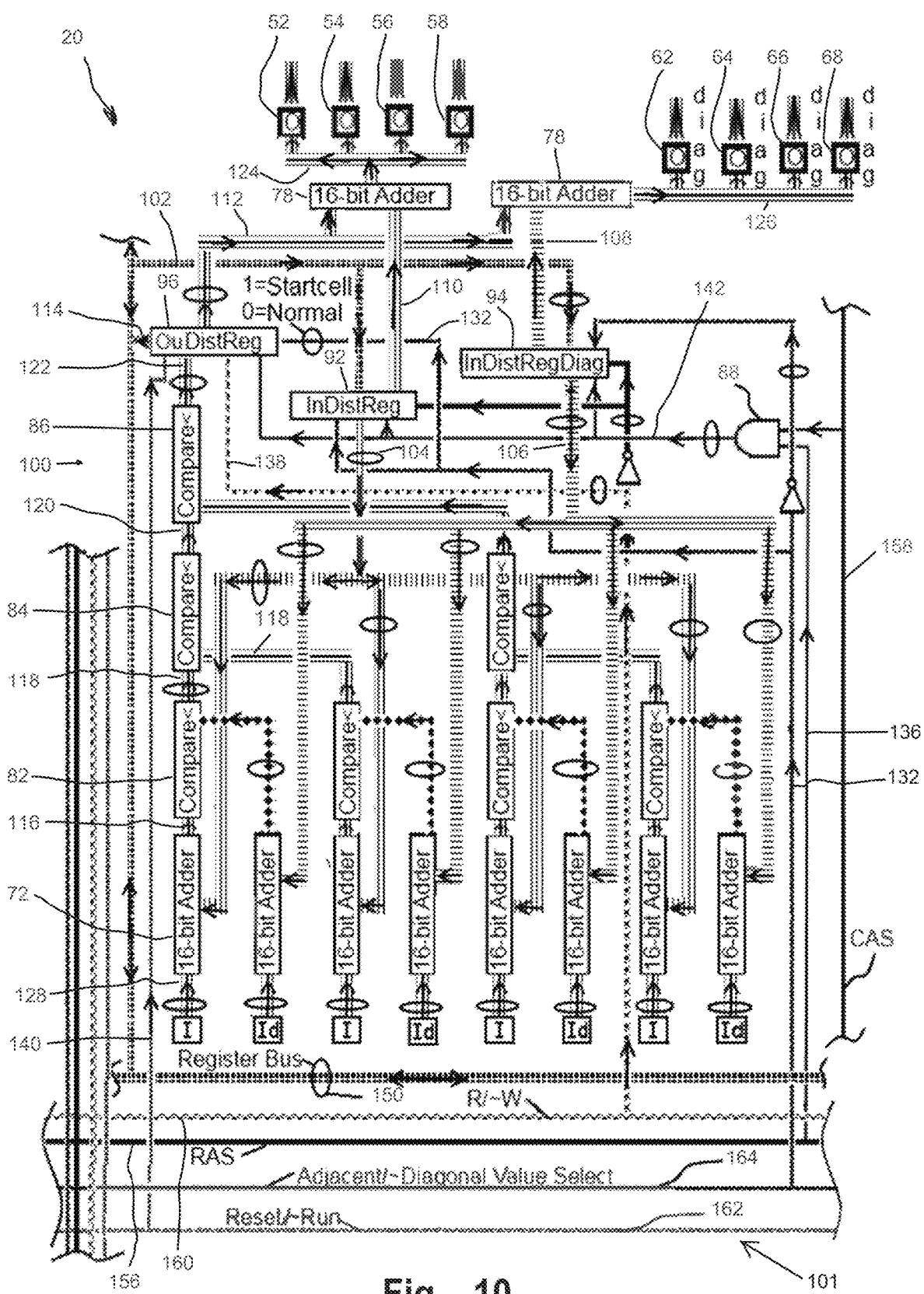
FIG. 10 illustrates internal components within a single cell and their connections to cell data bus.
Figure 11:
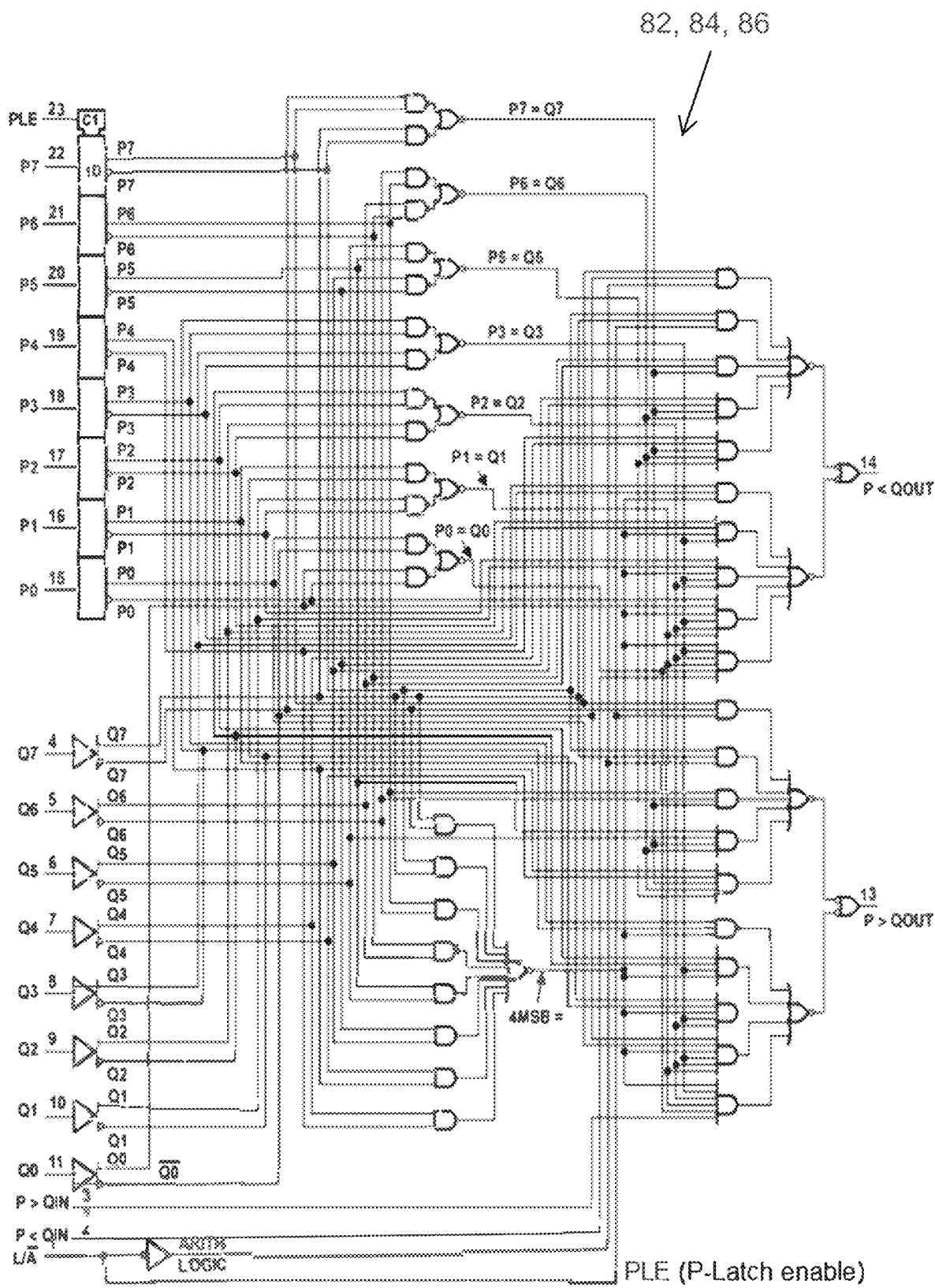
FIG. 11 illustrates an exemplary 8-bit comparator circuit that outputs a greater or a lesser value result condition status.
Figure 12:
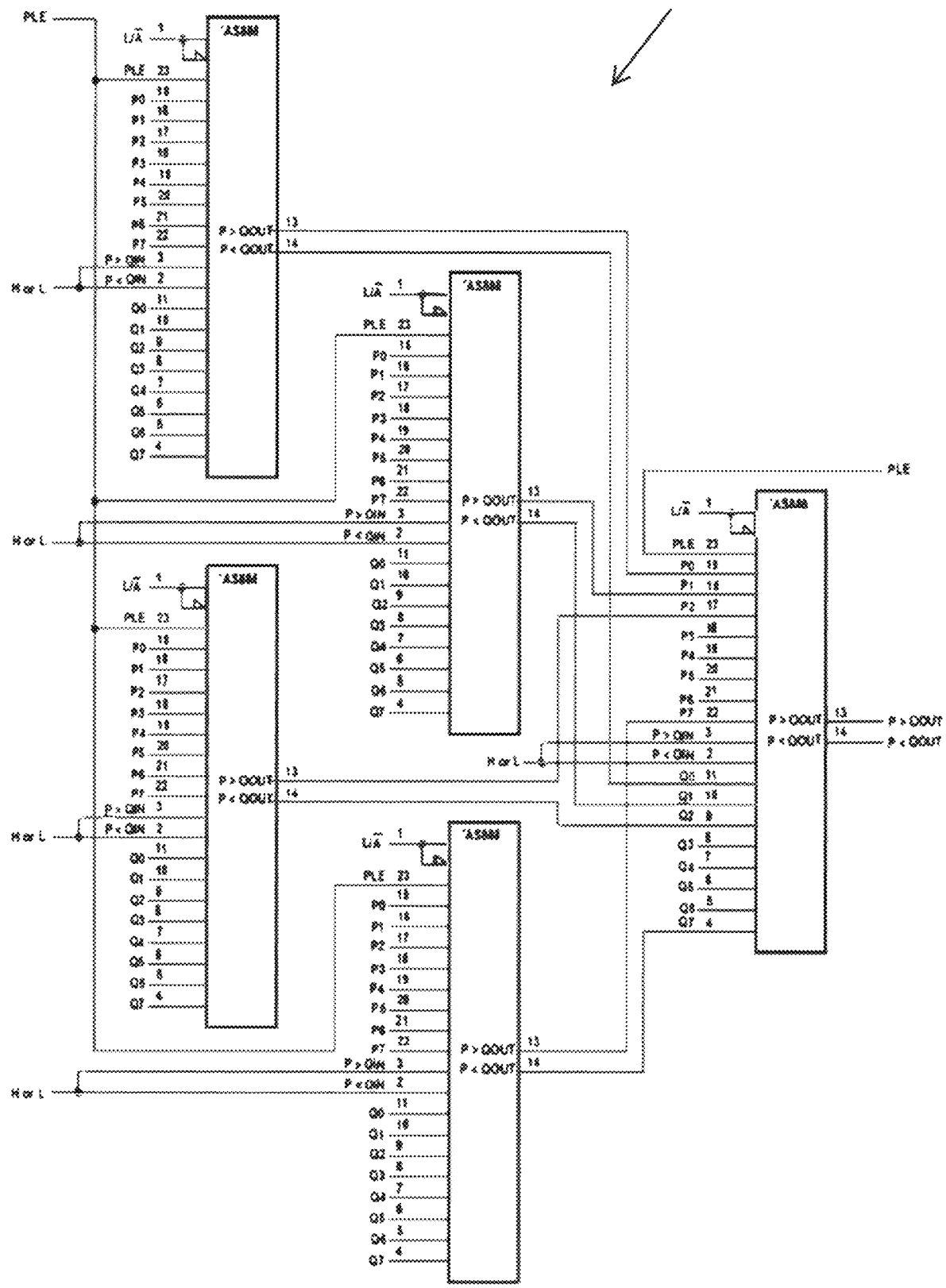
FIG. 12 illustrates an approach of combining four 8-bit comparator circuits of FIG. 10 to generate a larger number of bits comparison, for example such as a 32-bit, comparator circuit, that can also function as a 16-bit comparator circuit or a 24-bit comparator circuit.
Figure 13:
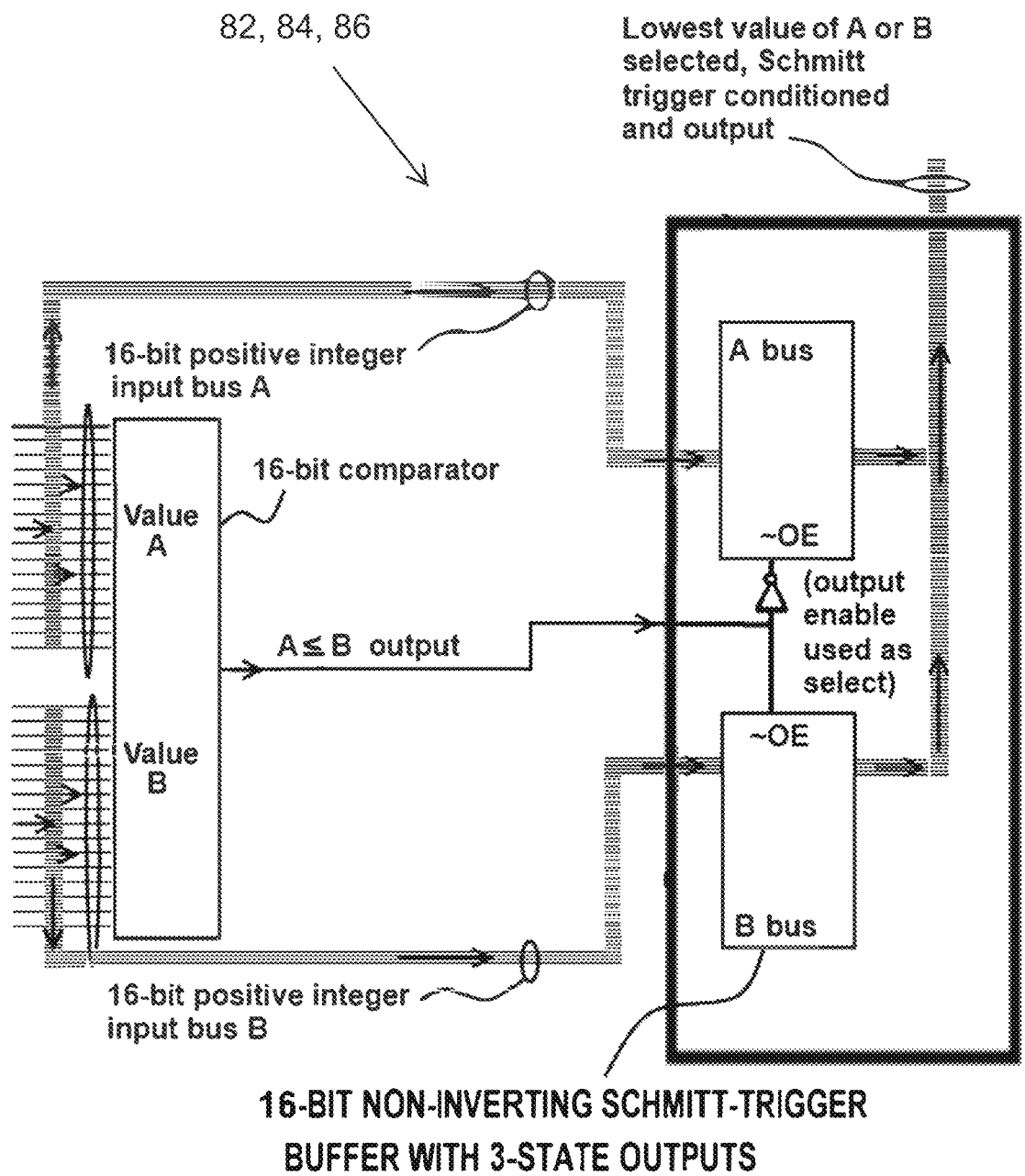
FIG. 13 illustrates details of a 16-bit comparator circuit employed within the cell design of FIG. 9, also illustrating two non-inverting Schmitt triggers whose outputs are connected to a tri-state bus.
Figure 14A:
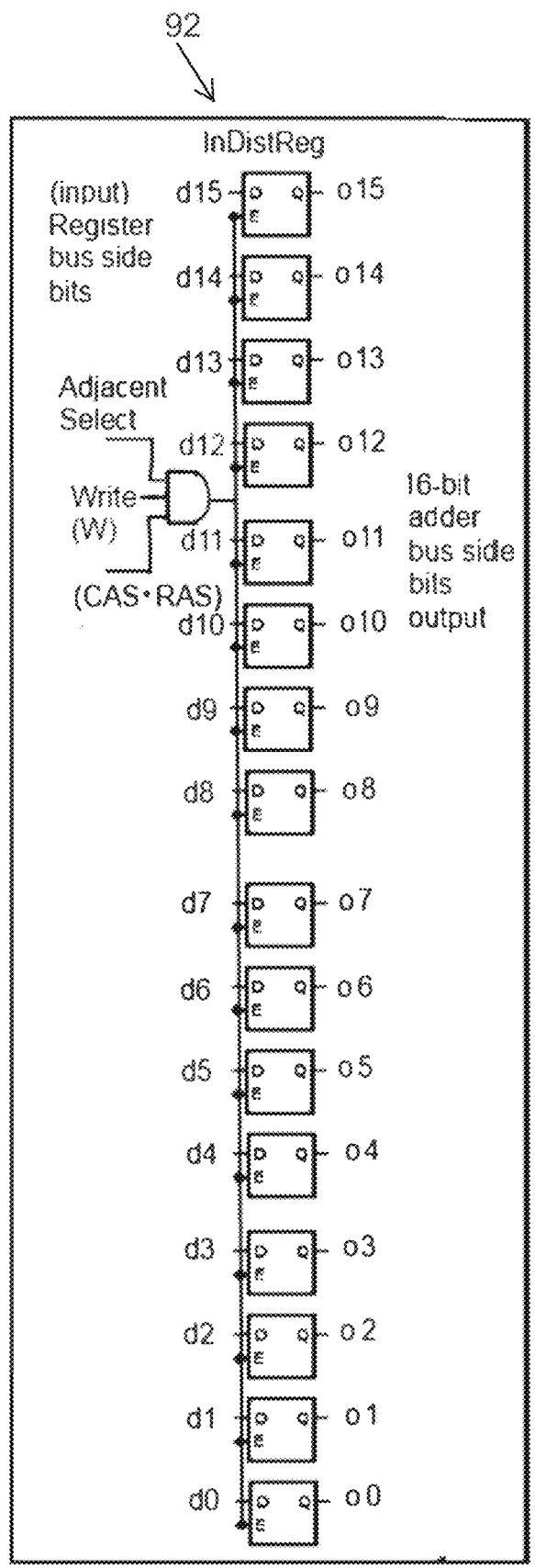
FIG. 14A illustrates a symbolic representation of an exemplary input register employed within the cell of FIG. 9 and employing the gated D-latch memory elements of FIG. 16A-16C.
Figure 14B:
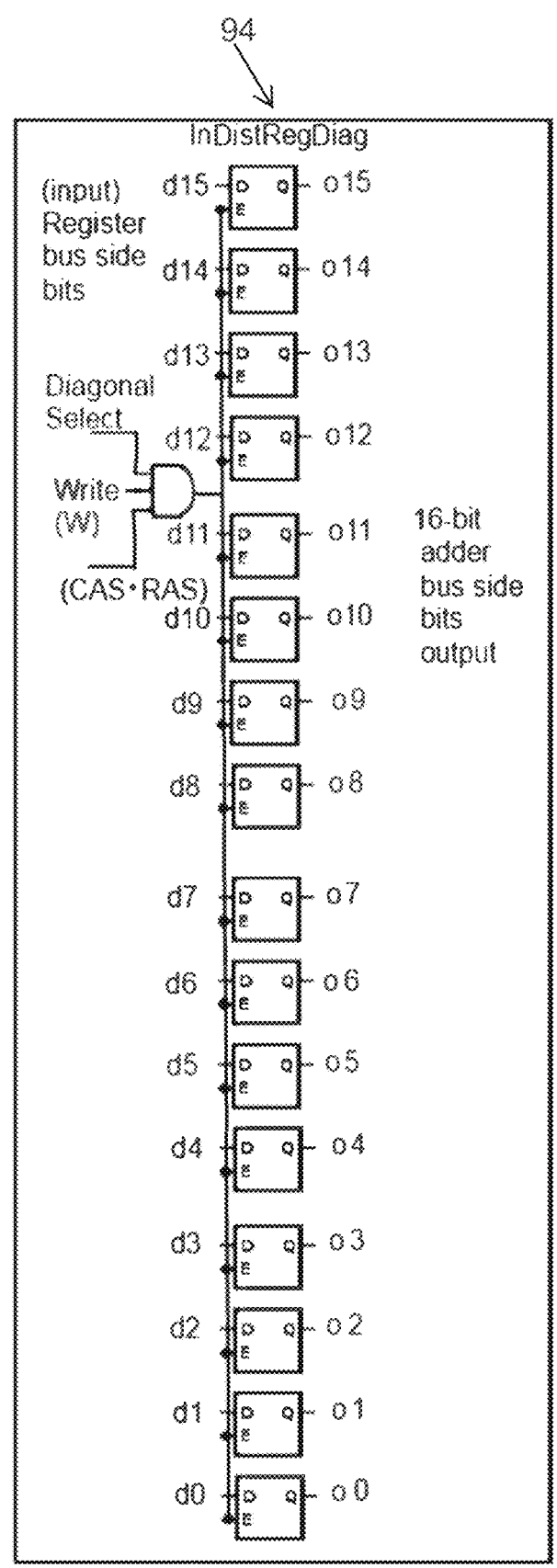
FIG. 14B illustrates a symbolic representation of an exemplary input register employed within the cell of FIG. 9 and employing the gated D-latch memory elements of FIG. 16A-16C.
Figure 15:
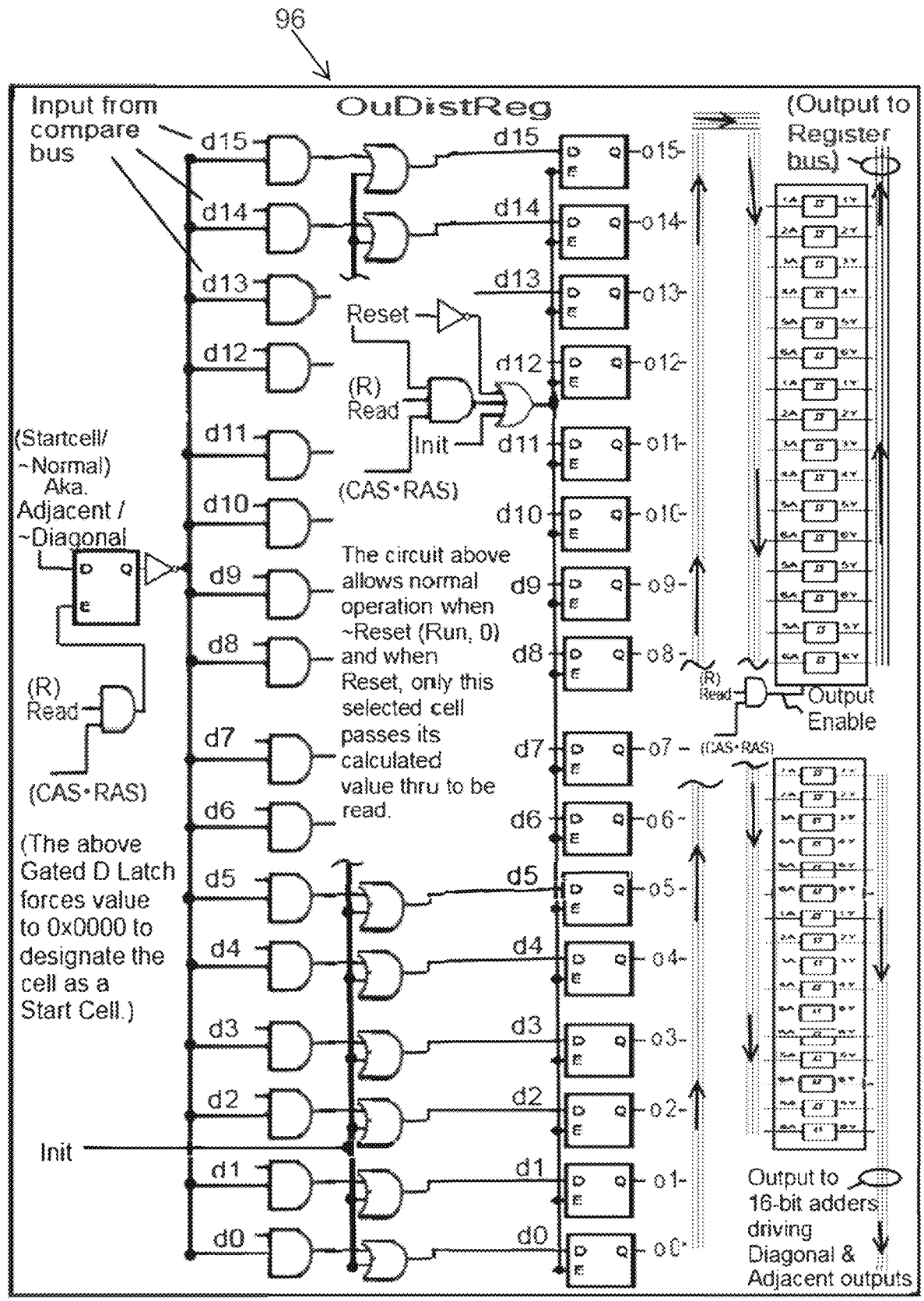
FIG. 15 illustrates a symbolic representation of an exemplary output register employed within the cell of FIG. 9 and employing the gated D-latch memory elements of FIG. 16A-16C.

In a further reference to FIG. 10, the cell 20 comprises first data comparator circuits 82, second data comparators 84 and third data comparator circuit 86. The first data comparators 82, second data comparators 84 and third data comparator 86 can be identical to each other and can be of a type as illustrated in FIGS. 11, 12, and 13. In an example of FIG. 11, the comparator can be an 8-bit Magnitude Comparator, for example as manufactured under a PN SN54AS885. In this comparator circuit, L/-A is being held high for logical positive integer comparison. PLE (P-Latch enable) is being held high for transparent non-latching. In an example of FIG. 12, the comparator can comprise cascaded 8-bit Magnitude comparators, for example as manufactured under PN SN54AS885, to form a 32 bit comparator or greater. L/-A pin held high for Binary comparison PLE (P-Latch enable) held high for transparent non-latching operation. In an example of FIG. 13, the comparator can comprise a 16-bit non-inverting Schmitt trigger buffer with a 3-state output. The Schmitt trigger is used to translate the slow or noisy edges into something faster that will meet the input rise and fall specifications of the following device. A perfect Schmitt trigger will not have rise time and fall time limitations, that is although its input voltage level may be slowly rising between the highest voltage designated to be a logic '0', thus through an intermediate region between logic '0' and logic '1' and below the lowest voltage region associated with logic '1', the output voltage will always be a voltage associated with a logic '1' or '0', and will not dwell in the intermediate region between them. Each first data comparator 82 being in a 16-bit register connection with two input adders 72 and receiving data from the two input adders 72. Each second data comparator 84 being in a 16-bit register connection with two first data comparators 82 and receiving data from two first data comparators 82. The third data comparator 86 is being in a 16-bit register connection with two second data comparators 84 and receiving data from two second data comparators 84. Now is a further reference to FIG. 10, the cell 20 comprises an orthogonal input value register 92, labeled as in distance register ("InDistReg"), that is best shown in FIG. 14A, a diagonal input value register 94, labeled as in distance register diagonal ("InDistRegDiag"0, that is best shown in FIG. 14B and an output value register 96, labeled as out distance register ("OuDistReg"), that is best shown in FIG. 15, two additional 16-bit output adders 78 and an AND gate 88. Each of the orthogonal input value input register 92, diagonal input value register 94 and the output value register 96 comprises a gated D-latch of FIGS. 16A-16C. The orthogonal input value register 92 and the diagonal input value register 94 can be identical with each other.

Figure 2:
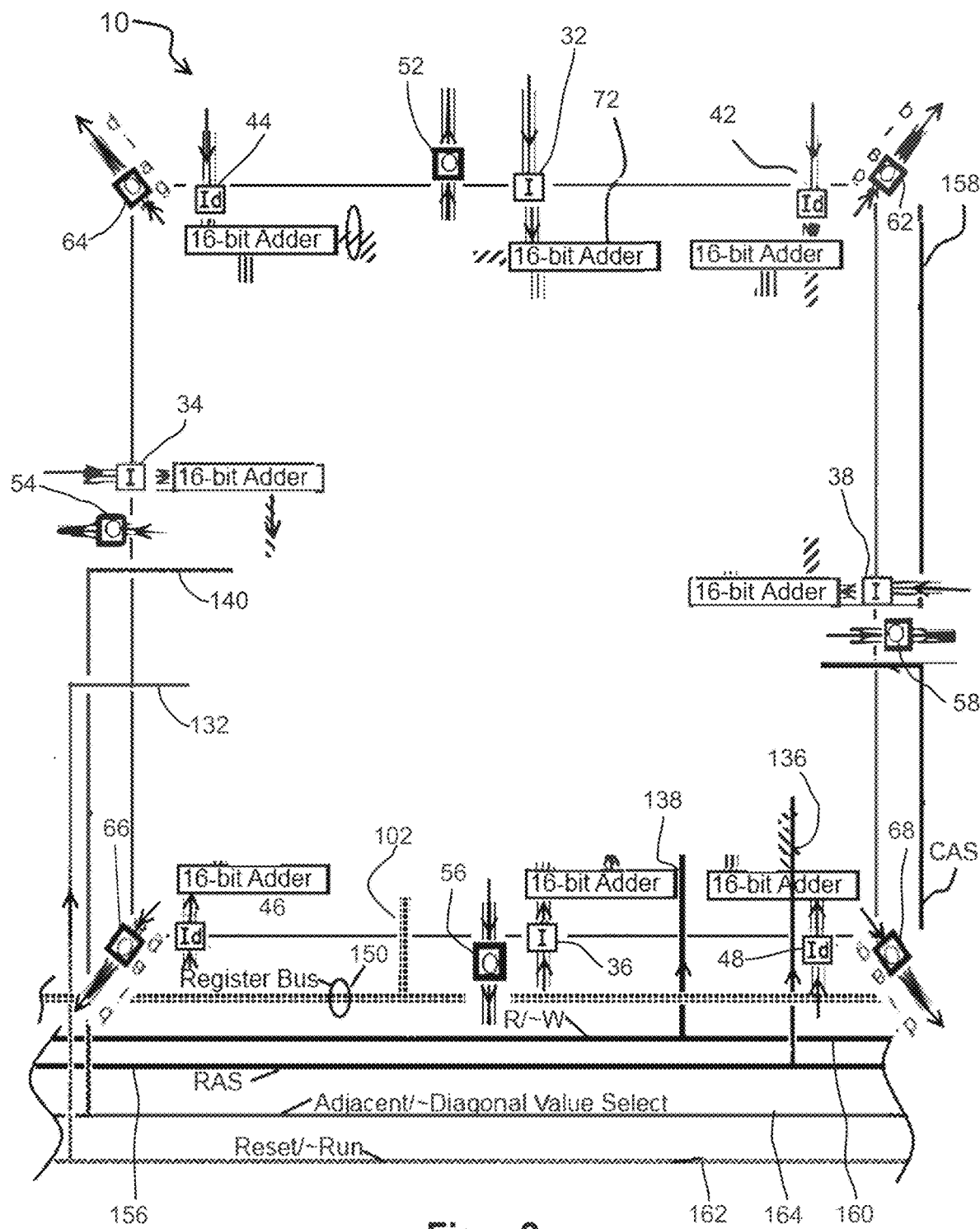
FIG. 2 illustrates internal components within a single cell and their connections to cell data bus and Control Lines.
Figure 19:
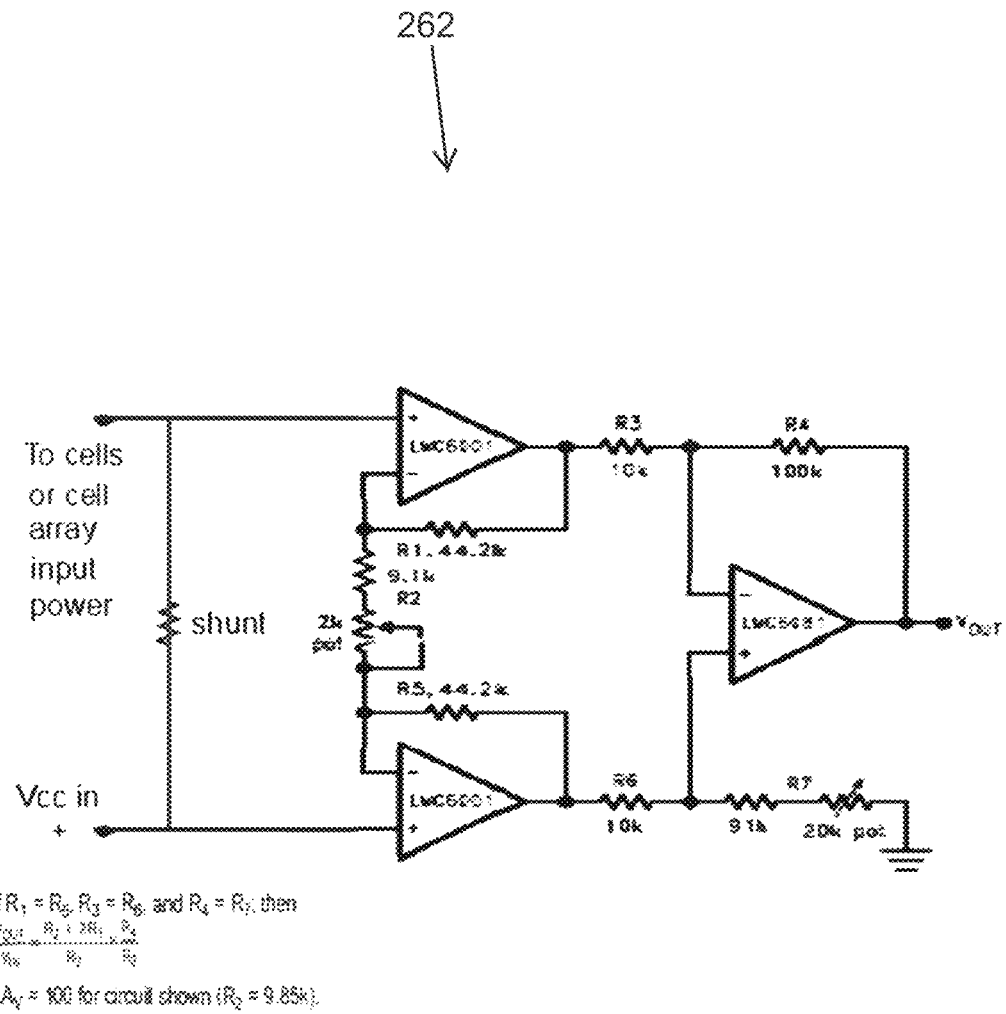
FIG. 19 illustrates an exemplary amplifier circuit that can be employed within a current sensor and comparator of FIG. 18.

Now in a further reference to FIGS. 1-2, 10, the cell 20 comprises a cell data bus 100 that comprises a plurality of 16-bit cell data register buses, 14-bit address busses or lines and control lines that connect various components within the cell 20 there between and/or connect various components within the cell 20 to components in other cells 20 within the cell array 10 and/or connect to the external controller, for example such as the controller 290 of FIG. 19. The busses and control lines are essentially circuit connections. More specifically, the cell data bus 100 comprises a cell data register bus interface 101 and a plurality of cell data register buses distributed throughout the cell. This plurality of cell data register buses comprises a first 16-bit cell register bus 102 that inputs a value from the cell data bus interface to the orthogonal input value register 92 and the diagonal input value register 94, a second 16-bit cell register bus 104 that reads a value from the orthogonal output value register 92 to four 16-bit input adders 72, a third 16-bit cell register bus 106 that inputs a value from the diagonal input value register 94 to four 16-bit input adders 72, a fourth 16-bit cell register bus 108 that inputs a value from the diagonal input value register 94 to one 16-bit output adder 78, a fifth 16-bit cell register bus 110 that inputs a value from the orthogonal input value register 92 to another 16-bit output adder 78, a sixth 16-bit cell register bus 112 that inputs a value from the output value register 96 to each of the two 16-bit output adders 78, a seventh 16-bit cell register bus 114 from the output value register 96 to the cell data bus interface 100, an eighth 16-bit cell register bus 116 from each 16-bit adder 72 to the first comparator 82, where two 16-bit input adders are coupled to one first data comparator, a ninth 16-bit cell register bus 118 that communicates a lowest value from each first comparator 82 to the second comparator 84, a tenth 16-bit cell register bus 120 from each second comparator 84 to the third comparator 86, an eleventh sixth 16-bit cell register bus 122 that communicates a lowest cell value from the third comparator 86 to the output value register 96, a twelfth 16-bit cell register bus 124 that communicates cell values from one 16-bit output adder 78 to four orthogonal cell outputs 52, 54, 56, and 58, a thirteenth 16-bit cell register bus 126 that communicates cell values from another 16-bit output adder to four diagonal cell outputs 62, 64, 66, and 68 and a fourteenth 16-bit cell register bus 128 that communicates cell values from each input to its respective adder 72.

The cell data bus 100 also comprises a plurality of control line interfaces. The control lines interfaces comprise a cell value select control line interface 132 that selects the inputting of a cell value to each of the orthogonal input value register 92, or the diagonal input register 94 or selects the StartCell state input status to output value register 96. The AND gate 88 inputs a column address selection control line interface 134 that inputs column value to the AND gate 88, and a row address selection control line interface 136 that inputs row value selected to the AND gate 88. A read/write control line interface 138 selects a write mode to the orthogonal input value register 92, or the diagonal input register 94 depending on the cell value select control line interface 132. The output value register 96 is also selected by AND gate 88. A reset/run control line interface 140 to the output value register 96, and a line interface 142 from the AND gate 88 to each of the orthogonal input value register 92, the diagonal input register 94 and the output value register 96. Not shown is a global unit control line "Init" which can be connected to all output value register 96 and initializes them before allowing the asynchronous clock-less operation phase of the cell array 10 to run freely.

Figure 17:
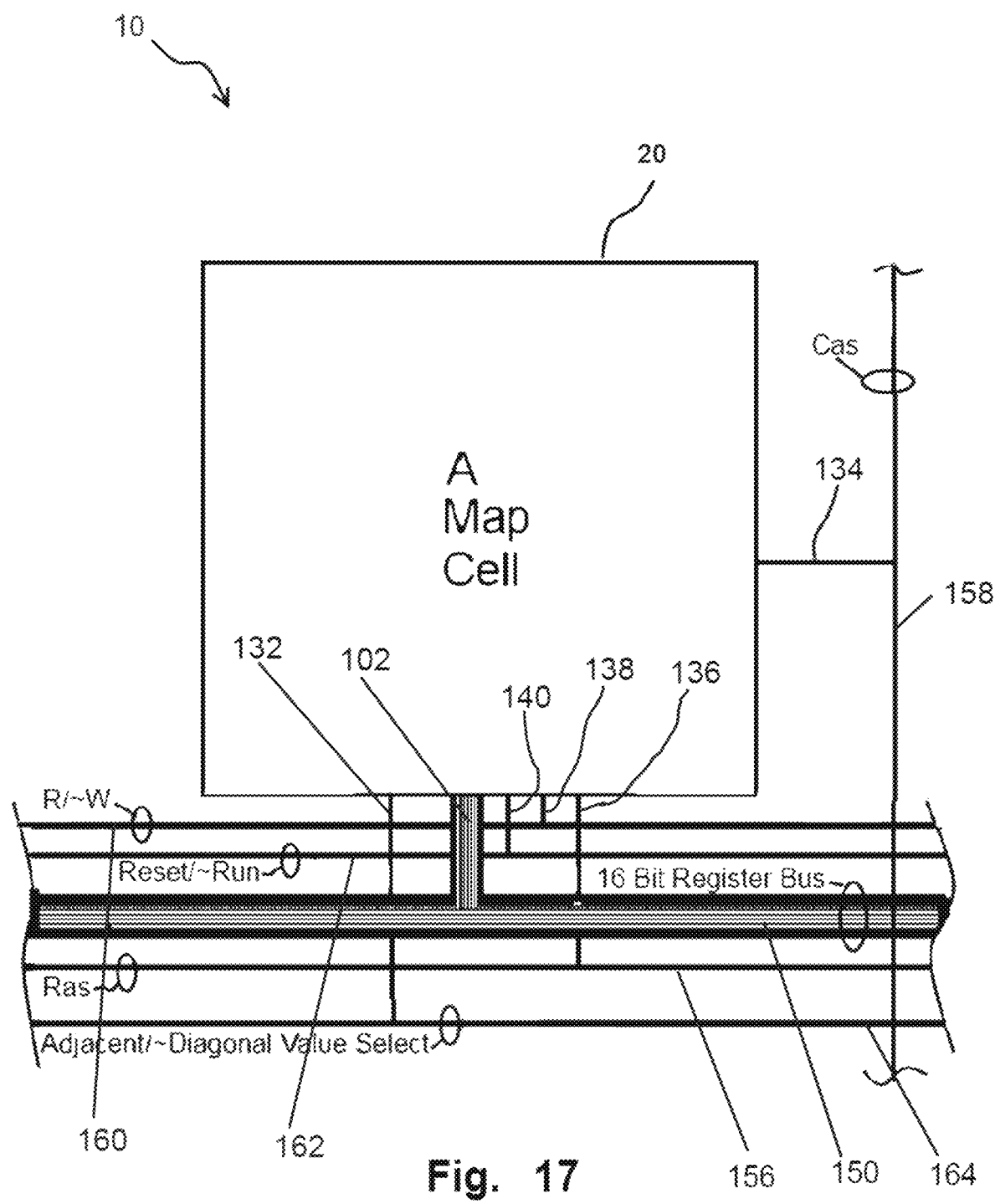
FIG. 17 illustrates a connection of a single cell to an array data bus and Control Limes.

Now in a further reference to FIGS. 1, 10 and in a reference to FIG. 17, the cell array 10 comprises an array data bus 150 that is provided and is accessible from an external environment of the cell array 10. The array data bus 150 comprises a 16-bit array register bus 152 is provided and is being configured to transmit register data between the array data bus interface 150 and each SELECTED cell data register bus interface 100. There is also a 14-bit array address bus 154 that translates to a plurality of row address selection control lines 156, each of the plurality of row address selection control lines 156 selects a row of cell 20 in a single row of addressable configurable cells, and a plurality of column address selection control lines 158, each of the plurality of column address selection control lines 158 selects a column of cell 20 in a single column of addressable configurable cells. The intersection of the row and column results in the selection of a single cell 20.

Additionally, there is a plurality of control lines, comprising a read/write array control line 160, a reset/run array control line 162, and a cell value array selection control line 164. The plurality of addressable configurable cells 20 are being interconnected by the data buses and control lines and are being configured to process, asynchronously and without a use of any clock, the data transmitted by the plurality of data buses and the plurality of I/O connections.

All cells 20 in the cell array 10 can be disposed in a single layer or in multiple layers. Likewise, the connections between the cells 20 can be disposed in a single layer or multiple layers. The cells 20 can be disposed in an abutting relationship with each other in one layer with I/Os, bus lines and control lines being disposed in one or more other layers either below or above the layer containing the cells.

The cell 20 is illustrated as being a square cell, however other cell configurations can be employed by varying I/O configurations. Thus a triangular or hexagonal cell pattern may be constructed.

The distances from a center of each cell 20 to its boundary, both in orthogonal and diagonal directions, are being chosen as integers for ease of computation and for speed of integer arithmetic processing in digital logic. Furthermore, exemplary values of 5 from center of the cell 20 to right, left, top or bottom boundary and value of 7 to each corner on a diagonal distance are used.

In the cell array core 10, the 16-bit array register data bus 150 writes relative local Weight^Length parameters into each cell 20, one cell selected and written at a time, for that specific cell based on properties of real world conditions to be represented by that cell 20 and later reads total absolute (external) Weight^Length results from the each cell 20.

In the cell array core 10, the cell input/output (I/O) connections transmit lowest absolute Weight^Length results from each cell 20 to immediately adjacent cells 20 and receive lowest absolute Weight^Length results from the immediately adjacent cells 20.

In the cell array core 10, the plurality of cell data buses transfer calculated (added) absolute Weight^Length results from neighboring cells and least-calculated absolute Weight^Length results between adders, comparators and registers within the each cell.

In the cell array core 10, a plurality of cell data buses transfer local Weight^Length parameters from registers to adders.

In the cell array core 10, the array control lines set a state of the cell array core 10 and select operational modes generally designated for (setup/run/read-results).

In the cell array core 10, the array control lines decode, specify and act to control/coordinate/activate/deactivate logic circuits and register activity within the cells based on values transmitted by the array control line. The array control lines are combined to create the states shown and described in detail in FIG. 34.

In the cell array core 10, the array control lines communicate the same logic value to all cells 20 simultaneously.

Now in a further reference to FIG. 15, the output value register 96 is configured to perform or operates to perform several functions:

1) It enables the cell to serve as a StartCell or not. A StartCell can be set or reset as a StartCell or Normal cell. As a StartCell, it is designated and functions to always add 0 to its InDistReg and InDistRegDiag registers before outputting an orthogonal or diagonal value to its neighbors; 0x0000+ InDistReg to its non-diagonal neighbors and 0x0000+InDistRegDiag to its diagonal neighbors. The input values from its neighbors are ignored and forced to be 0, unlike a Normal cell which compares to find the lowest input value and then adds this lowest input value found from its neighbors and then outputs them to its neighbors;

2) It allows the register's output values to be latched and output regardless of the input values if desired, preventing calculation changes from propagating through the cell array 10 and drawing more power than needed if operation is not yet needed. For example, a new map may be being constricted or accessed and the shortest distance calculations will be soon discarded so there is no point in drawing power to perform them;

3) It sends result outputs to both the local output 16-bit Adders for the Adjacent Orthogonal Neighbors and for the Diagonal Neighbors to communicate the lowest value output to these cell neighbors;

4) It conditionally sends result outputs of the cell's Weight/\Distance to the global external Register Bus to be read by the Controller when the Controller asks for it via the Address bus and Control Line state settings. It uses a tri-state bus to allow only one Cell's OuDistReg to write to the global external Register Bus at a time; and 5) It Schmitt triggers and buffers the outputs to reduce current draw if the calculation bit lines are dwelling for a long period of time in an intermediate state between the logic '0' voltage and logic '1' voltage, and sharpening the rise and fall times.

6) It accepts the Init input Control Line common to all cells but not shown and uses it to signal the initialization of all OuDistReg to 0xFFFF before beginning to execute Asynchronous Clockless calculating minimum distance to StartCell mode.

Furthermore, multiple StartCells are contemplated herewithin. This can be valuable if one needs to find the shortest path from multiple vehicle locations (and which vehicle to use) to arrive at a specific destination quickest.

Figures 16A, 16B, 16C:
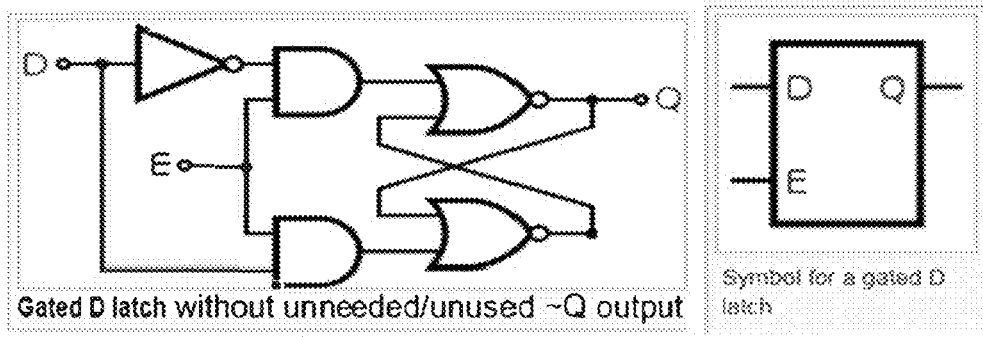
FIGS. 16A-16C illustrates a schematic circuit, a symbolic representation and a truth table of an exemplary gated D-latch memory element.

Furthermore, to designate or de-designate a cell as a StartCell or NormalCell, a commonly known Gated D-Latch serving as a memory element, best shown in FIGS. 16A-16C, within the OuDistReg is set or reset. Specific control lines state combinations allow Set, Reset, and the selection and control of the functions shown above and detailed in FIG. 34. One method of state sequence of loading the cell's registers of a cell, executing calculations, and unloading results is shown in FIG. 35. Intermediate steps are designated as 'A' or 'B' and can be chosen based on if the cell is a StartCell or a NormalCell.

Figure 18:
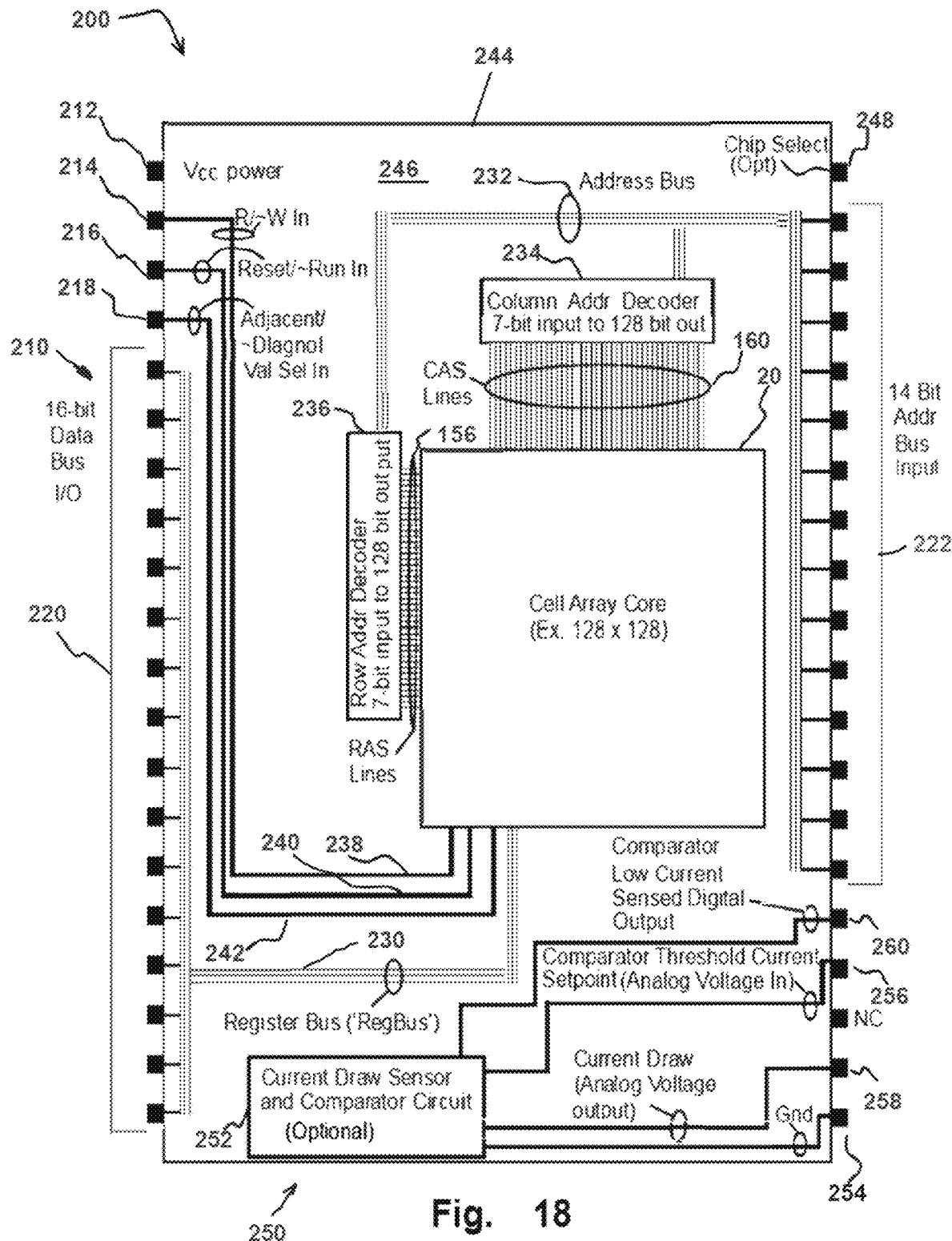
FIG. 18 illustrates a reconfigurable, asynchronous, and clock-less data co-processor comprising a reconfigurable, asynchronous, and clock-less cell array core that only executes arithmetical operations.

Now in a reference to FIG. 18, therein is illustrated an embodiment of a reconfigurable, asynchronous, and clockless data co-processor (or processor, or chip) 200 that comprises a reconfigurable, asynchronous, and clock-less cell array core 10 that only executes arithmetical operations; an input/output (I/O) terminal interface 210 that comprises a power terminal 212, a read/write control terminal 214, a reset/run control terminal 216, a cell value selection terminal 218, 16-bit register data bus I/O terminals 220, and 14-bit address bus input terminals 222. The Register data bus I/Os create a 16-bit, positive integer, 0 to 65,356 in value if 16-bit Map weighting is chosen, the I/O outputs write 16-bit map weights into registers InDistReg and InDistRegDiag for straight and diagonal motions, and the I/O outputs read a cell's result minimum distance from a start cell from the cells OuDistReg. Address bus input lines, (for example 14 bits (7 bits for row 0-127, 7 bits for column 0-127) in a 128×128 map cell array), appearing as a 16K memory space in total), are converted into Row Address Select and Column Address Select lines inside co-processor 200. The Read/~Write Input control line is used to select between writing 16-bit Map Weights^Distance for straight or diagonal motions to a cell 20 or reading a final result 'path minimum length to start node found' from a cell 20. The Reset/~Run Input control line is used to control if the co-processor 200 weighting is being initialized or the co-processor 200 is in a state to be allowed to freely run asynchronously to find shortest paths. A 16-bit data register bus 230 is configured to transmit register data between the input/output (I/O) terminal interface 210 and the array data bus (Register Bus) 150 in the cell array core 10; a 14-bit address bus 232 configured to transmit row and column address selection data between the input/output (I/O) terminal interface and the cell array core 10 through column address decoder 234 and row address decoder 236; while using associated read/write control line 238; a reset/run control line 240; and a cell value selection control line 242.

The co-processor 200 can be provided as a MCM, as a semiconductor logic die, instantiated in an Asynchronous processing FPGA, in a circuit arrangement, for example as a part of a circuit board assembly (not shown) or can be provided as a discrete, stand-alone component/integrated circuit by being adapted with a casing and a die 246 disposed within the casing 244, the cell array core 10 and the plurality of data buses being disposed on the die 246, and the input/output (I/O) terminal interface accessible from exterior surface (s) of the casing.

In the co-processor 200, the (I/O) terminals can further comprise an optional processor select terminal 248.

Cell array 10 is being illustrated in FIG. 18 as a 128×128 cell array, although other array sizes can be used.

The 16-bit positive integer size is matched well with a 128×128 array (16,384 cells) of interconnected cells 20, assuming a default movement perfect road value weighting of 10 for non-diagonal motion (example straight ahead, left or right) and 14 to approximate diagonal motion, wherein 14.1423 would be a more accurate value (10*sqrt(2)) diagonally. Alternatively, a typical default perfect road value of 5 and 7 may be used without more accuracy loss. Thus even if the shortest path is through 50% of the whole array's cells in a complex formation such as a maze, a very unlikely optimal path, 16,384 5 0.50 or 40,960 of the maximum 16-bit value of 65,535 may be reached. This is a reasonable trade-off of array size vs. PBP size and resolution vs. total accumulated path length with added path PBP accumulated values, as the path may most likely be far simpler than traversing 40% of all the cells in the array or 6,553 cells. A minimal path would traverse 128 cells whereas a typical path would only traverse approximately 300-500 cells. A very complex practical path would traverse at the most 1000-2000 cells. Thus, the maximum 65,535 value may not be reached in practical applications, even if numerous PBP values are added to weight an impractically complex path. Larger integer sizes and corresponding bus number of lines widths allow higher resolution results, in many cases are not necessary. 3D embodiments typically can use higher resolution due to 26 neighboring cells, not 8.

Similarly, cell array 10 is being illustrated as using 16-bit weighting registers and result registers, although more or less weighting accuracy, or resolution can be obtained using more or less bits to represent the individual Cell Weight^Distance parameters or results. If a larger array size of cells is desired, a larger number of weighting register bits may be chosen to represent a wider range of Weight^Distance results. Also, floating numbers such as a 32-bit floating number or 64-bit floating number may be used to represent Weight^Distance even more accurately. If this is used a cell would typically employ floating number adders and floating number comparators. Interconnect buses between cells and within cells would also change with regard to the number of lines to carry the differing bit sized values.

In a further reference to FIG. 18, the co-processor 200 can further comprise a current draw comparator sensor 250 that monitors actual current drawn by the operating cell array 10 versus a reference current. The sensor 250 comprises a circuit arrangement 252 and a ground terminal 254, a comparator voltage input terminal 256 inputting a voltage representing and proportional to a current threshold to be compared, a current draw representation output voltage terminal 258 outputting a voltage representing the current being drawn, a circuit current comparator result digital logic output terminal 260 outputting a '1' if the current is above a threshold and a '0' if the current drawn is below a threshold such as that set by the voltage representation of terminal 256. The above described inputs and outputs of the sensor 250 can be part of the I/O interface of the co-processor 200.

The sensor 250 can be configured to monitor the entire cell array 10, each cell 20, or only a region of cells 20. The region of cells 20 may be separately powered and separately power-monitored (such as a 16×16 region of cells or a smaller region of 8×8 cells) within a 128×128 cell array 10. It is further contemplated that a plurality of sensors 250 or a plurality of circuits 252 within a single sensor 250 can be provided to monitor current within a dedicated region of the cell array 10.

The current draw sensor circuit 252 may be used to determine if a co-processor 200 or a sub region of the co-processor 200 is still processing path planning or is completed or may be used in embodiments for speed increase if needed, to detect completion or near completion earlier. It may use a analog to digital converter to convert current flow to a digital value and a digital comparator to decide if a value is above a threshold or below it. It may use pure analog circuitry to compare an analog current flow representation to an analog voltage. It may be omitted in simpler dies and a fixed period of time be used to allow the processing to occur before acquiring and reading the Weight^Distance results from the cells. The circuit current comparator result digital logic output terminal 260 co-processor 200 or regions containing such a circuit may be combined into a single 'processing completed' interrupt line or used as an interrupt line to the Controller when the current drawn goes below a prechosen threshold value indicating at or near processing completion. Instead or also, a maximum time to completion may be chosen before operations for entire co-processor 200 are considered, for example as by an external controller 290 of FIG. 19, to be done and the Dijkstra's traceback from finish to start to find the best path is completed. In an example, the most complex map on a 180 nm co-processor 200 may be known to complete in 800 μs max (microseconds).

Co-processor processing current drawn terminal 258 can optionally indicate if the co-processor 200 is still processing path planning or is completed, it may be a digital signal sending a digital value such as an I2C or SPI BUS line sending a serial value or it may be analog, or may be omitted in simpler dies.

The sensor 250 may include an analog comparator threshold current register containing a value to trigger a digital output state change, and may be embodied in a memory mapped register whose address may be 00000000 or 00000001. Further, embodiments may be chosen to digitally implement output value state change detection in digital logic on any internal data Weight^Distance communication bus or selected such buses, but as this requires a substantial number of gates, some embodiments may rely on analog current detection and or comparison means detecting total current draw by the cells' logic instead.

FIG. 19 illustrates an exemplary amplifier circuit that can be employed within a current sensor and comparator 250 of FIG. 18. More particularly, the circuit is an instrumentation amplifier that features high-differential and common-mode input resistance 0.01% gain accuracy at Av=1000, excellent common mode rejection ration (CMRR) with 1-MO imbalance in source resistance. Input current is less than 20 IA and offset drift is less than 2.5 μV/'C. R2 provides a simple means of adjusting gain over a wide range without degrading CMRR. R1 is an initial trim used to maximize CMRR without using super precision matched resistors. For good CMRR over temperature, low-drift resistors should be used. The circuit of FIG. 19 can be manufactured for example under a PN LMC6001.

The Current Draw analog voltage output 258 may implement the circuit such as seen in FIG. 19 which uses a Shunt interface seen in FIG. 19 to measure the total current used to power a cell, portion of a cell such as the OuDistReg, the cell array 10, or a group-region of cells, by using a voltage drop developed across a shunt resistor in the path of the current source. Multiple channels of current measuring devices for this may each have a programmable gain amplifier to adjust gate change detection sensitivity, may be converted to a digital value using integrating-type 16-bit or 24-bit sigma-delta ADC, and may implement filter options independently configurable for each channel. Filter options may be tuned to select short term high frequency current variations due to individual gates or cells changing state or longer term overall regions still processing state changes within. Some cell regions such as those on the periphery or at the corners may be chosen to be larger and have less total sensitivity to individual gate logic switch operation current draw to reduce total circuitry and cost.

It is important to note that in many cases the user may not need to or want to wait until all gates have stopped changing state and the best path is found. The user may pre-decide or pre-establish a current threshold indicating a 'good enough' path likely has been found.

A digital representation of the device's current measurements may be transmitted through a serial peripheral interface such as SPI bus or I2C bus to the Controller or may be converted to Analog voltage for output to terminal 258. The digital representation may be digitally compared to a digital current setpoint value to determine the output logic state of Comparator Low current Sensed Digital output 260. The Comparator Threshold Current Setpoint Analog voltage in 256 may be converted to a digital value to be compared with the digital representation of current drawn. Alternatively, an all analog current representation may be compared using an analog comparator to the Comparator Threshold Current Setpoint Analog voltage in 256 to provide the basis for communicating a low current condition and few or no gates processing or processing completed or substantially completed to the logic output Comparator Low current Sensed Digital output 260.

The current sensor may include an internal temperature sensor for temperature compensation and greater accuracy over a large temperature range, and because the device operates at very low power, internal self-heating is negligible. The biggest sources of error in the sensor interface are the gain stage's drift over temperature, and an ADC reference's drift over temperature. These errors can therefore be eliminated if the temperature drift characteristics are known. These characteristics can be determined by calibration.

A shunt in the 5-10 milli-ohm range with a highly linear, offset-free, and high-resolution signal-conditioning device, for a current sensor system design may provide sufficient accuracy when measuring current draw under 1 μA. Alternatively, a pico-ammeter or pico-ammeter circuit may be used.

Again it is important to note that the above analog current detection method may be used to detect completion or non-completion of the distance-to-start-cell calculations, offering less total circuitry and a simple method. Alternatively, additional logic may be added to detect and signal or transmit a change in bus data values received by a cell, region of cells or from all cells. For example, an additional 16-bit register may be contained in one, many, or all of the OuDistReg and maintain the current value of the OuDistReg; if any bits are detected to change from a newer comparison input value being received as compared to the current value, an output signal may be sent to a dedicated logic line indicating detection of a change. This requires substantially more semiconductor die real estate and additional interconnect lines. The change detection logic output may be presented on the output logic state of Comparator Low current Sensed Digital output 260 or on a separate logic output terminal.

Figure 20:
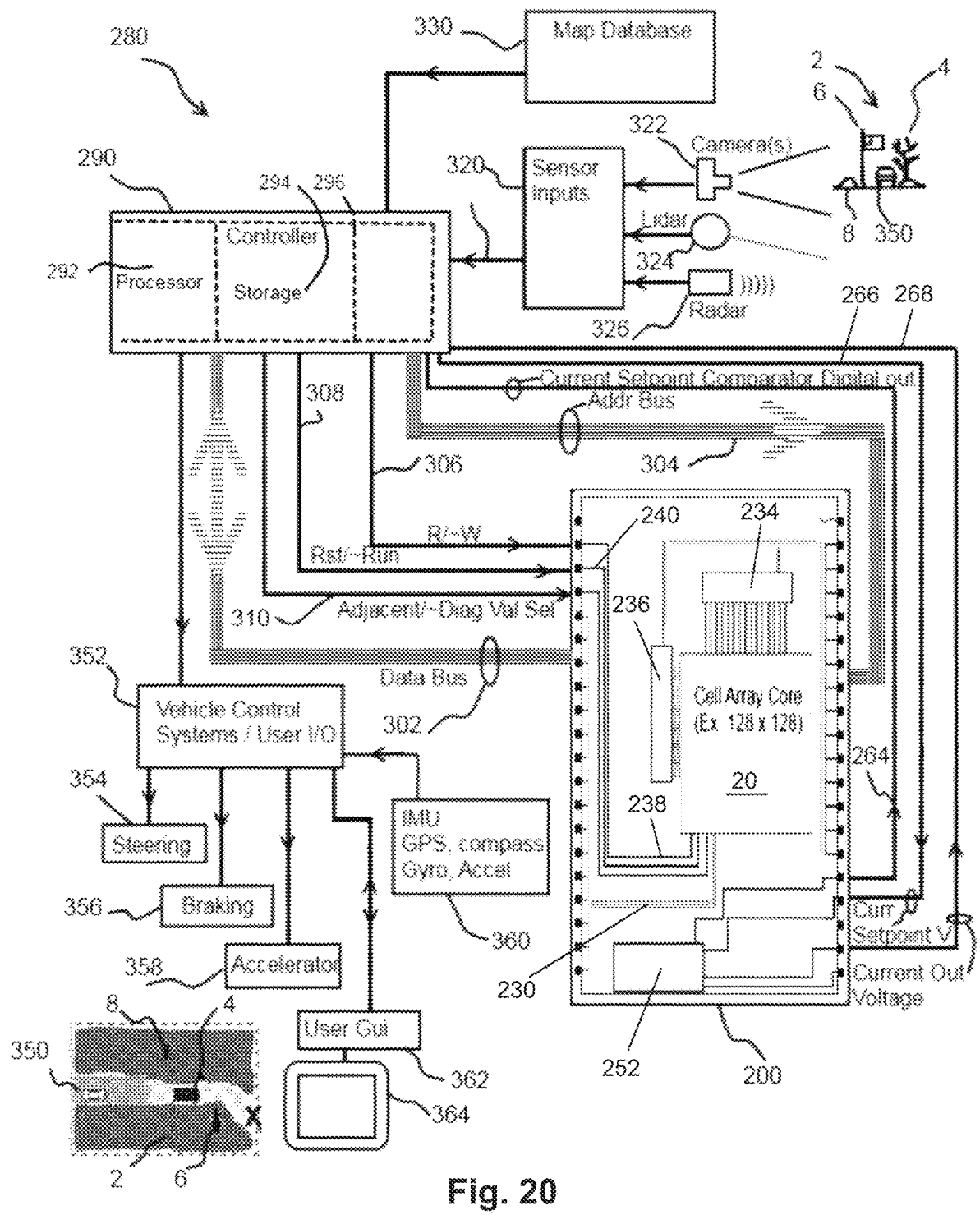
FIG. 20 illustrates an exemplary controller employing the co-processor of FIG. 18.

In an embodiment of FIG. 20, a control arrangement (or system) 280 is provided to control a movement of a self-directed vehicle 350. Generally, self-directed vehicles (i.e. vehicles operated without presence of a human being inside the vehicles) can include Unmanned Ground Vehicles (UGV), Unmanned Aerial Vehicles (UAV), Unmanned (naval) Surface Vehicles (USV), Quadcopters, Drones, robots, self-driving autos, pick and place robots in a crowded environment, and delivery robots. The control arrangement 280 of FIG. 19 comprises a controller 290. The controller 290 can be also referred to as a central processing unit (CPU). The controller 290 can comprise one or more processors 292, a data storage medium 294, a non-transitory computer readable medium residing in non-transitory data storage medium or memory and comprising executable instructions and additional components that are employed in control systems. Such additional components can include I/O buffers 296, user interface, communication module(s) and the like. Tangible computer readable medium means any physical object or computer element that can store and/or execute computer instructions. Examples of tangible computer readable medium include, but not limited to, a compact disc (CD), digital versatile disc (DVD), blu-ray disc (BD), usb floppy drive, floppy disk, random access memory (RAM), read-only memory (ROM), erasable programmable read-only memory (EPROM), electrically erasable programmable read only memories (EEPROM), dynamic random access memories (DRAM), synchronous dynamic random access memories (SDRAM), double data rate memories (DDR), flash memories, optical fiber, etc. It should be noted that the tangible computer readable medium may even be paper or other suitable medium in which the instructions can be electronically captured, such as optical scanning. Where optical scanning occurs, the instructions may be compiled, interpreted, or otherwise processed in a suitable manner, if necessary, and then stored in computer memory.

Alternatively, it may be a plugin or part of a software code that can be included in, or downloaded and installed into a computer application. As a plugin, it may be embeddable in any kind of computer document, such as a webpage, word document, pdf file, mp3 file, etc.

The control arrangement 290 of FIG. 20 further comprises one or more of the selectable above described reconfigurable, asynchronous, and clock-less data co-processor 200 that only executes arithmetical operations. The co-processor 200 comprising a reconfigurable, asynchronous, and clock-less cell array core 10, an input/output (I/O) terminal interface 210, data buses 302, 304 configured to transmit data between the input/output (I/O) terminal interface and the cell array 10; and a plurality of control lines 306, 308, and 310 configured to transmit data between the controller and the co-processor 200 and, more particularly, its I/O interface 210.

Controller 290 also comprises connections 264, 266 and 268 with the current draw comparator sensor 250.

The control arrangement 280 can further comprise control modules of the vehicle 350, each of the vehicle control modules being in an operative coupling with the controller 290 through the vehicle control interface 352. A control module is defined here as an isolatable element that performs a defined function and has a defined interface to other elements. The modules may be implemented in hardware, software in combination with hardware, firmware, wetware (i.e hardware with a biological element) or a combination thereof, all of which are behaviorally equivalent. For example, modules may be implemented as a software routine written in a computer language configured to be executed by a hardware machine (such as C, C++, Fortran, Java, Basic, Matlab or the like) or a modeling/simulation program such as Simulink, Stateflow, GNU Octave, or LabVIEWMathScript. Additionally, it may be possible to implement modules using physical hardware that incorporates discrete or programmable analog, digital and/or quantum hardware. Examples of programmable hardware comprise: computers, microcontrollers, microprocessors, application-specific integrated circuits (ASICs); field programmable gate arrays (FPGAs); and complex programmable logic devices (CPLDs). Computers, microcontrollers and microprocessors are programmed using languages such as assembly, C, C++ or the like. FPGAs, ASICs and CPLDs are often programmed using hardware description languages (HDL)

such as VHSIC hardware description language (VHDL) or Verilog that configure connections between internal hardware modules with lesser functionality on a programmable device. Finally, it needs to be emphasized that the above mentioned technologies are often used in combination to achieve the result of a functional module.

The vehicle control modules can comprise at least one of steering control module 354, braking control module 356, acceleration control module 358, global positioning system (GPS) module 360, and user graphical interface (GUI) 362 with a display 364.

The control arrangement can further comprise one or more sensors 320, for example such as a camera 322, a Lidar 324 and a radar 326. Each of the one or more sensors 320 being in an operative coupling with the controller.

The co-processor 200 can be mounted within the self-directed vehicle 350 or can even be mounted on an exterior surface thereof. Furthermore, the controller 290 can be mounted in a remote location, for example such as a control or a command center (not shown) with the co-processor 200 being adapted to communicate, for example wirelessly by way of a wireless communication interface (not shown), with such remotely disposed controller 290.

The data storage comprises a database 330 with a geographical mapping to one or more world regions.

The control arrangement 280 can further comprise a current draw sensor configured to monitor a current drawn by the co-processor during operation of the control arrangement and an operative coupling between the current draw sensor and the controller.

In the control arrangement, at least the co-processor 200 can be mounted within or on the self-directed vehicle 350.

In an embodiment, a self-directed vehicle 350 can comprise the above described control arrangement 280 configured to generate a shortest travel path based on geographical parameters of a terrain to be traveled by the self-directed vehicle 350. The self-directed vehicle 350 can only include the above described co-processor 200 with a communication module that communicates to a remotely disposed control arrangement.

In an embodiment, particularly in a reference to FIGS. 21-37, therein is illustrated a method of generating a shortest travel path based on geographical parameters of a terrain 2 to be traveled by the self-directed vehicle 350. The co-processor 200 basically appears as a memory-mapped RAM device and memory region to a controlling CPU 290, with a few additional I/O lines and operations. The map of a geographical region, represented by the map database 330, is loaded into the cell array 10 by being overlaid over cells 20 and the resulting shortest path from a starting node to an end node is read out after a processing phase is completed.

Figure 21:
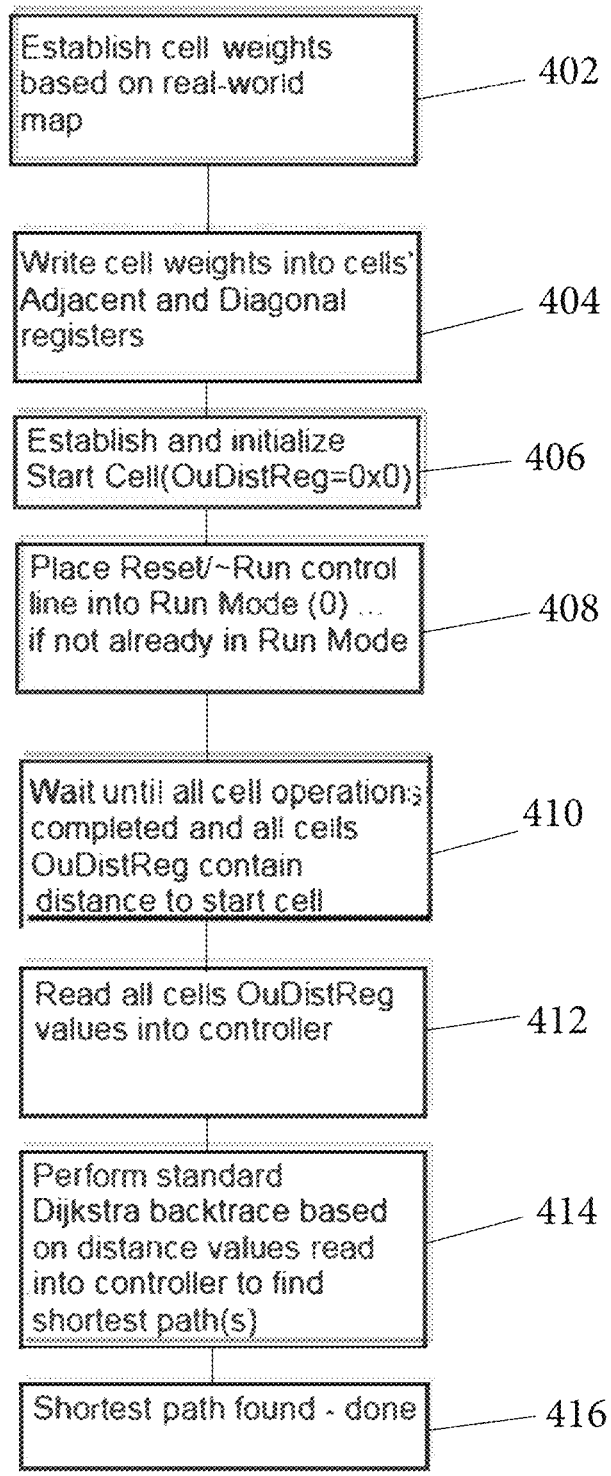
FIG. 21 illustrates a flowchart of an exemplary method of determining a shortest travel path.

In a further reference to FIG. 21, the method comprises the steps of providing a reconfigurable, asynchronous, and clock-less data co-processor 200 that comprises a plurality of addressable configurable cells 20 arranged as a multidimensional orthogonal array and that only executes arithmetical operations; establishing cell weights based on real-world map. The map thus reflects the properties of the vehicle's spatial context and the desirability or undesirability of each map coordinate or spatial location to be used in a possible path solution.

The method may begin in step 402 as establishing cell weights based on real world map. For example, different weights can be given to features of the geographical terrain 2, for example, such as the three 4, flag post 6, mound 8 and the like features. Cell weights can be also adjusted for a specific type of the self-directed vehicle 350. A four-wheel drive vehicle may have differing abilities than a van and may thus have differing weighting over muddy regions for example. Thus cell weights for the same terrain feature can vary between self-vehicles 350 of different types. For example, the mound 8 can be represented by a higher value if the vehicle 350 is a conventional tired vehicle and can be represented with a lower value if the self-directed vehicle 350 is equipped with caterpillar tracks. Similarly, a body of water will be assessed with a higher weight value for a land-only vehicle versus a vehicle 350 with amphibious capabilities. The cell weight can be also varied based on a size of the terrain feature. For example, a river will receive a higher weight factor than a stream or a brook. Likewise, a larger river can be represented with a higher weight factor than a smaller river. The established cell weights are loaded into the map 330. However, step 402 may be an optional step when the cell weights are already contained in the map database 330. A 16-bit positive integer capable of ranging between 0 and 65,535 is used to numerically reflect decreases in the Map coordinate's desirability due to such factors as reduced speed limit, poor road conditions, higher elevation, greater danger of a land mine, or at the high value of 65,535, an impassible obstruction such as a wall, chasm, or building. The number may reflect a combination of factors at that point, combining such factors as elevation and speed limit and reduced road quality. The number's reflection of path undesirability is applied to bias the path planner hardware away from that coordinate, relative to the Path Bias Properties (PBP) of adjacent or other coordinates. As it is relative, it can be used to bias towards a coordinate or regions of coordinates if that region is given a low value relative to a higher default value of all other coordinates. For example, if the default PBP value is 500 indicating an open muddy field, a roadway may be given a PBP value of 10 or even 0, strongly biasing the planner hardware to choose the road pathway first. A wall or building may still be given a value of 65,535 indicating relative impassibility.

Figure 22A:
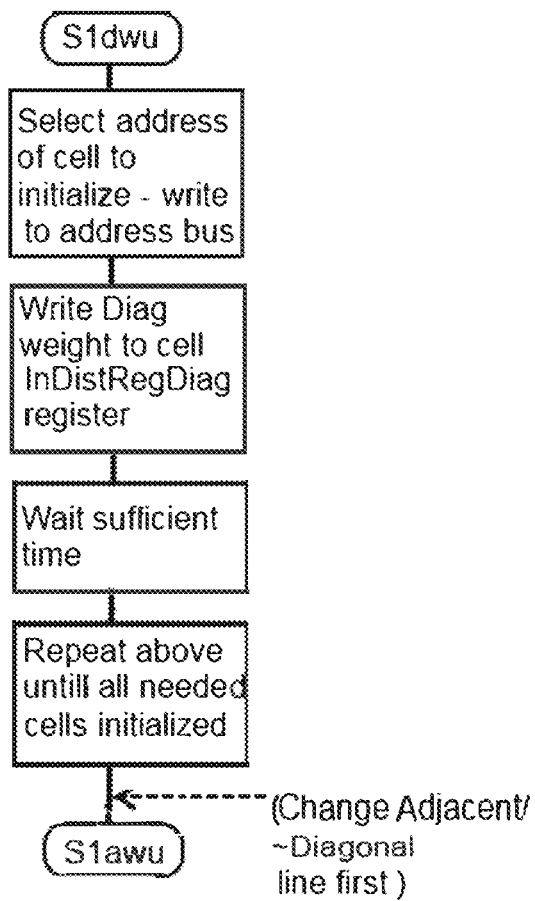
FIG. 22A illustrates a flowchart of an exemplary sequence to load the InDistRegDiag values into cells.
Figure 22B:
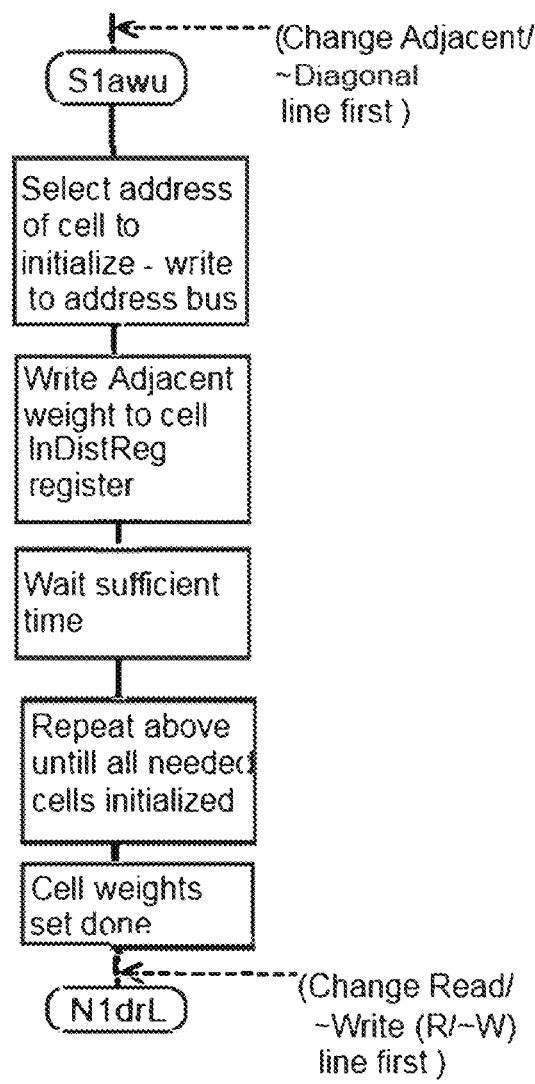
FIG. 22B illustrates a flowchart of an exemplary sequence to load the InDistReg values into cells.
Figure 23:
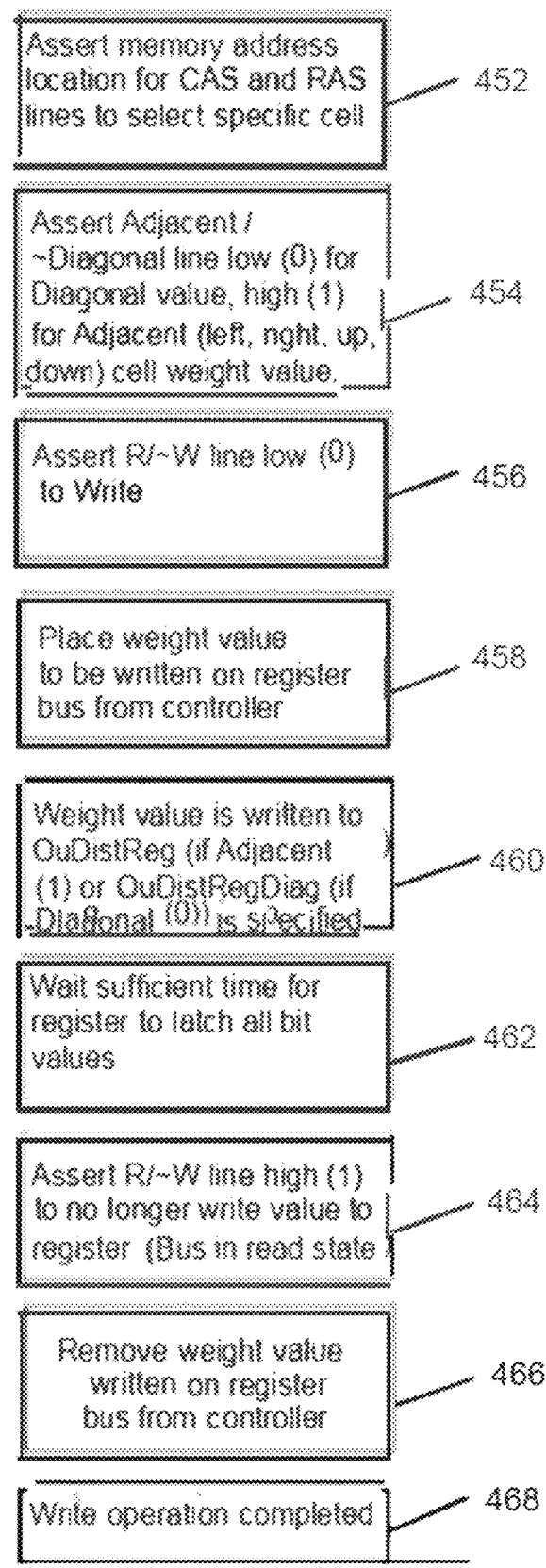
FIG. 23 illustrates a flowchart of an exemplary method writing cell weights to registers by detailing Control Line hardware values.
Figure 24:
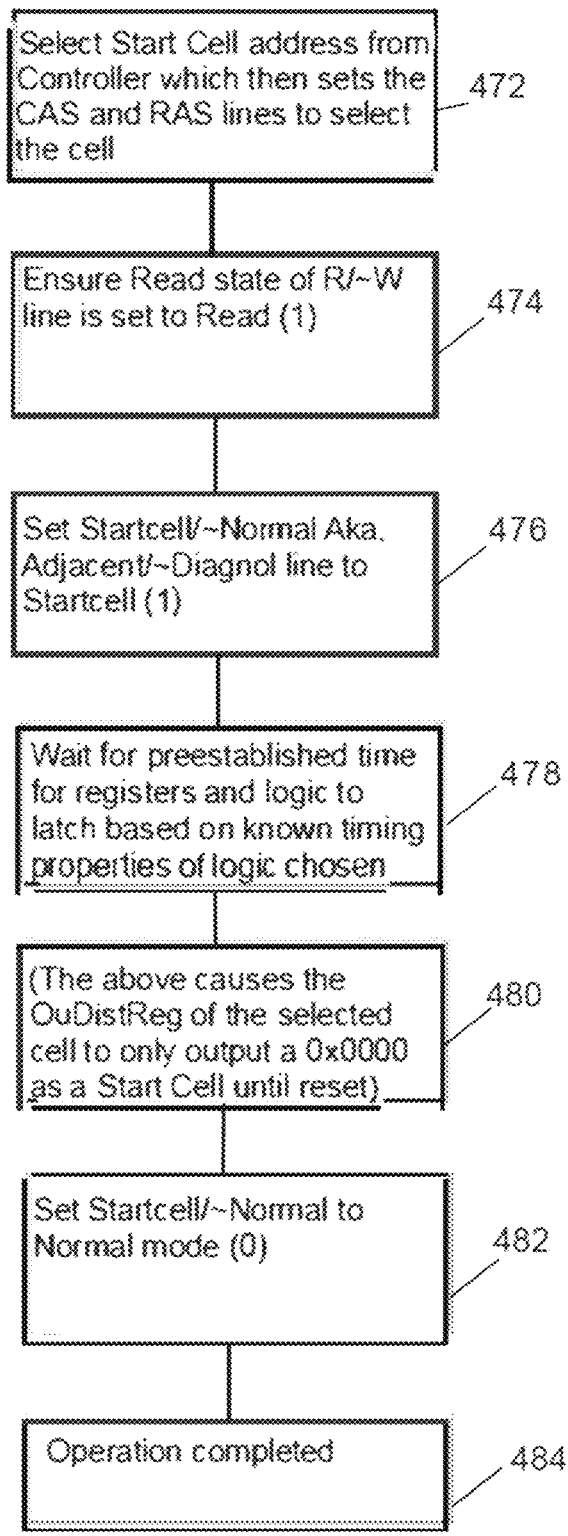
FIG. 24 illustrates a flowchart of an exemplary method of designating a start cell in the cell array after the geographical map region is overlaid over the cell array.
Figure 25:
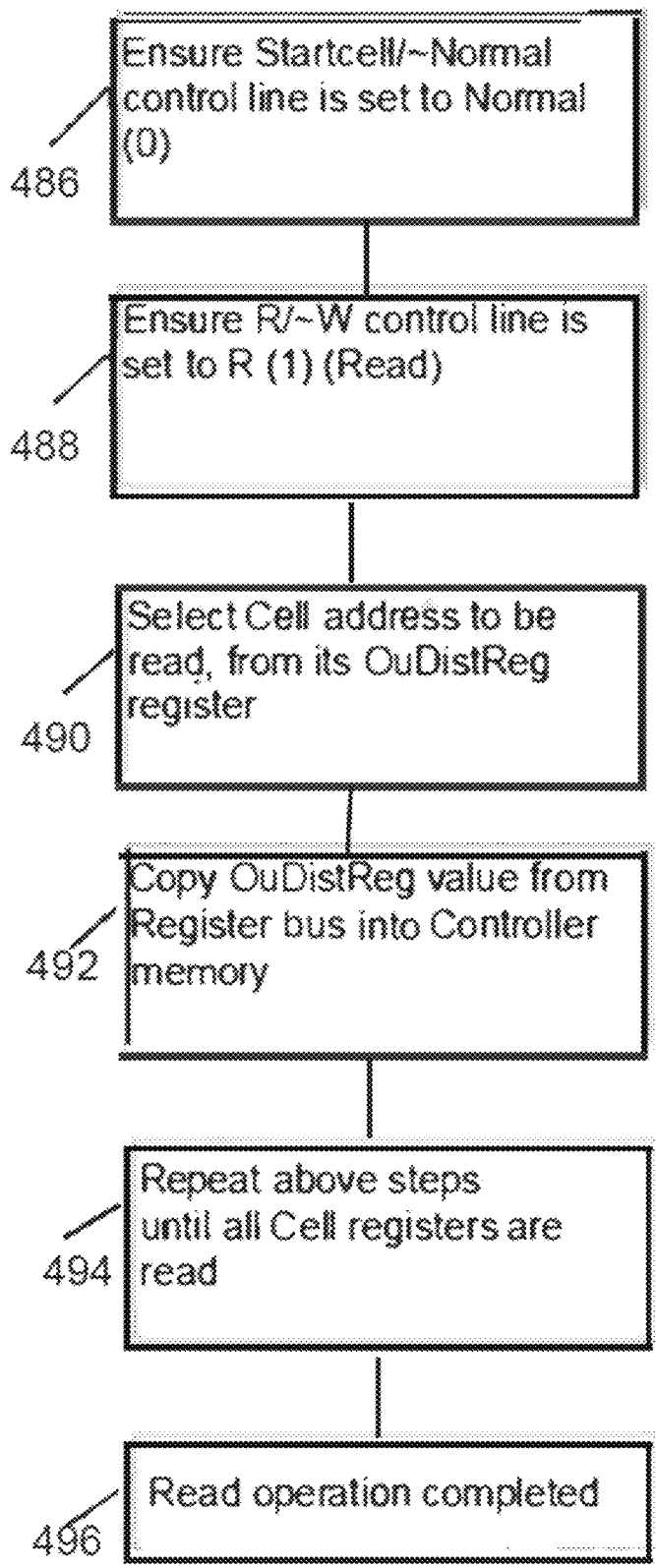
FIG. 25 illustrates a flowchart of an exemplary method of reading output cell Weight/\Distance results by detailing Control Line hardware values.

Next, in step 404, the map is overlaid over the cell array 10 and a portion of the geographical region is assigned to each cell 20. More specifically, this is achieved by writing or loading the cell weights into adjacent or orthogonal InDistReg registers and diagonal InDistRegDiag registers, as is best shown in FIGS. 22A and 22B with the controller 290. The order by which the cell weights are written is not important. The step 404 is explained in more details by the module of FIG. 23 by detailing Control Line hardware values. More specifically, the memory address locations for CAS and RAS are asserted to select a specific cell. Then, Adjacent/-Diagonal line values are set in step 454 and R/-W line value is set in step 456. In step 458, the controller 290 communicates the weight value onto the register bus 302 that is coupled to co-processor register bus 230 and further to cell array bus 150. In step 460, the weight value is written to each InDistReg and InDistRegDiag registers. After a wait time within the controller 290 to allow sufficient register latching in step 462, the value of the R/-W line changed to terminate cell weight writing. Written weight value is removed from the register busses by the controller 290 in step 466 and the write sub-routine is completed in step 468. In a further reference to FIG. 21, the method continues by selecting, in step 406, by the controller 290, a start cell 20 from the plurality of addressable configurable cells 20 and initializing the start cell as OuDistReg with a constant distance value of =0X0000 from the start location—that is, AT the start location. The step 406 is best defined in FIG. 24 by steps 472, 474, 476, 478, 480, 482 and 484. It will be understood that the start cell defines a starting point from which the self-directed vehicle 350 begins travel or is currently located in the map. In step 408, the Reset/~Run control line 308 is placed into run mode (for example "0") if not already in such run mode. When all cell operations are completed and OuDistReg contains values for all cells 20 in step 410, all OuDistReg values are read by the controller 290 in step 414. The module containing logic, procedure or sub-subroutine for step 414 is best illustrated in FIG. 25 by steps 486, 488, 490, 492, 494 and 496. Then, when a method similar to a Dijkstra backtrace is performed in step 414 based on absolute minimum distance values read in step 412 to find the shortest path(s), the method ends in step 416.

It must be noted that the map database does not have to contain the entire region that the self-directed vehicle will travel and may be loaded in increments. In other words, the method anticipates that one or more intermediate end points can be used that become as a new intermediate start point when the next map region is overlaid over the cell array 10.

Figure 26:
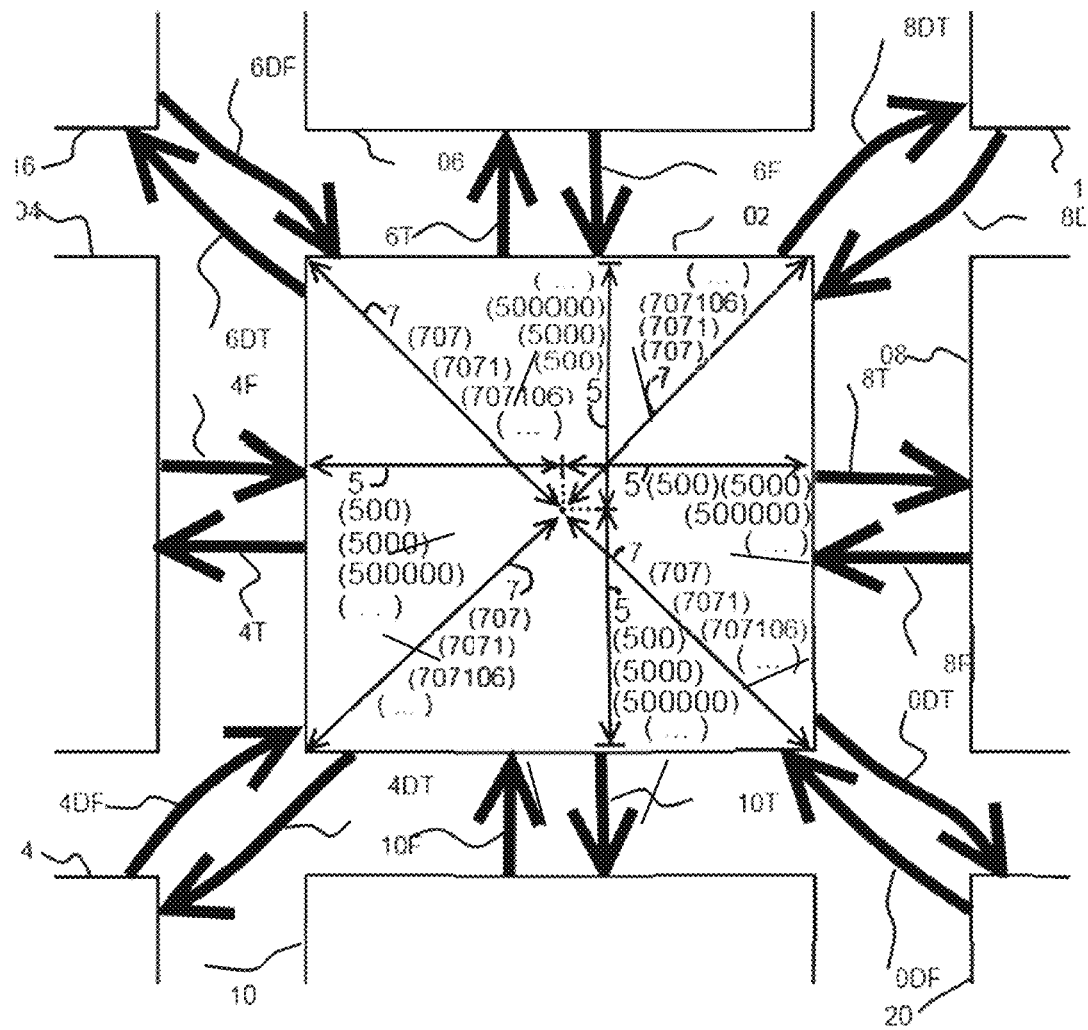
FIG. 26 illustrates exemplary values that can be employed in calculating the shortest travel path.

The above described method is further illustrated in the example of FIGS. 26-33. FIG. 26 illustrates exemplary values that can be employed in calculating the shortest travel path using varied degrees of precision and hence varied bit-size integers and sized integer-communicating bus registers and lines in buses. A set of 24-bit or 32-bit buses, integer adders, registers and comparators is envisioned for larger maps with more cells and/or higher resolution of weighting capability. Essentially, each cell 20 is being illustrated as a square shaped cell with a distance value from the center to the boundary in any orthogonal direction being selected at 5 which sets a distance value from the center to each corner (diagonal) at 7. Various multipliers of values 5 and 7 can be used as well if additional precision is needed. Although integer values are being used, real numbers, floating point numbers, or fractions are also contemplated herewithin.

Figure 27:
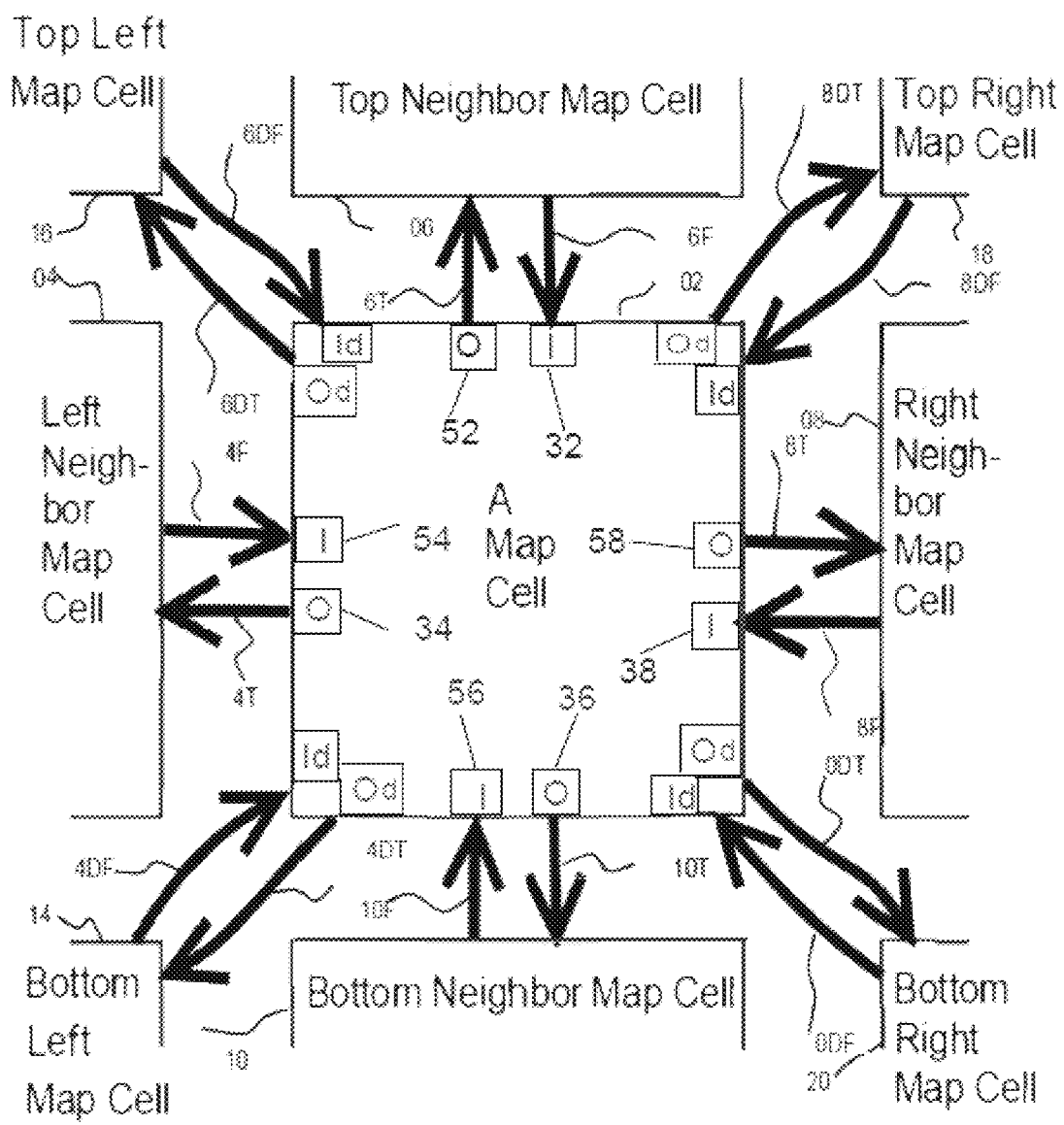
FIG. 27 illustrates a nomenclature of designating adjacent cells in a relationship to a single cell.

FIG. 27 illustrates a nomenclature of designating immediately adjacent cells 20 in a relationship to any single cell. As is illustrated, all 'T' links communicate its calculated current minimum path length FROM a MAP CELL TO all its neighbors continuously. All 'F' links communicate their calculated current minimum path length FROM all neighbors TO a MAP CELL continuously. Each link may be a bus of 16 bits or wires recommended for a 128×128 cell array. 16 bits is sized to carry a positive integer 0 or 0x0000 in hex to 65535 or 0xFFFF in hex.

Figure 28:
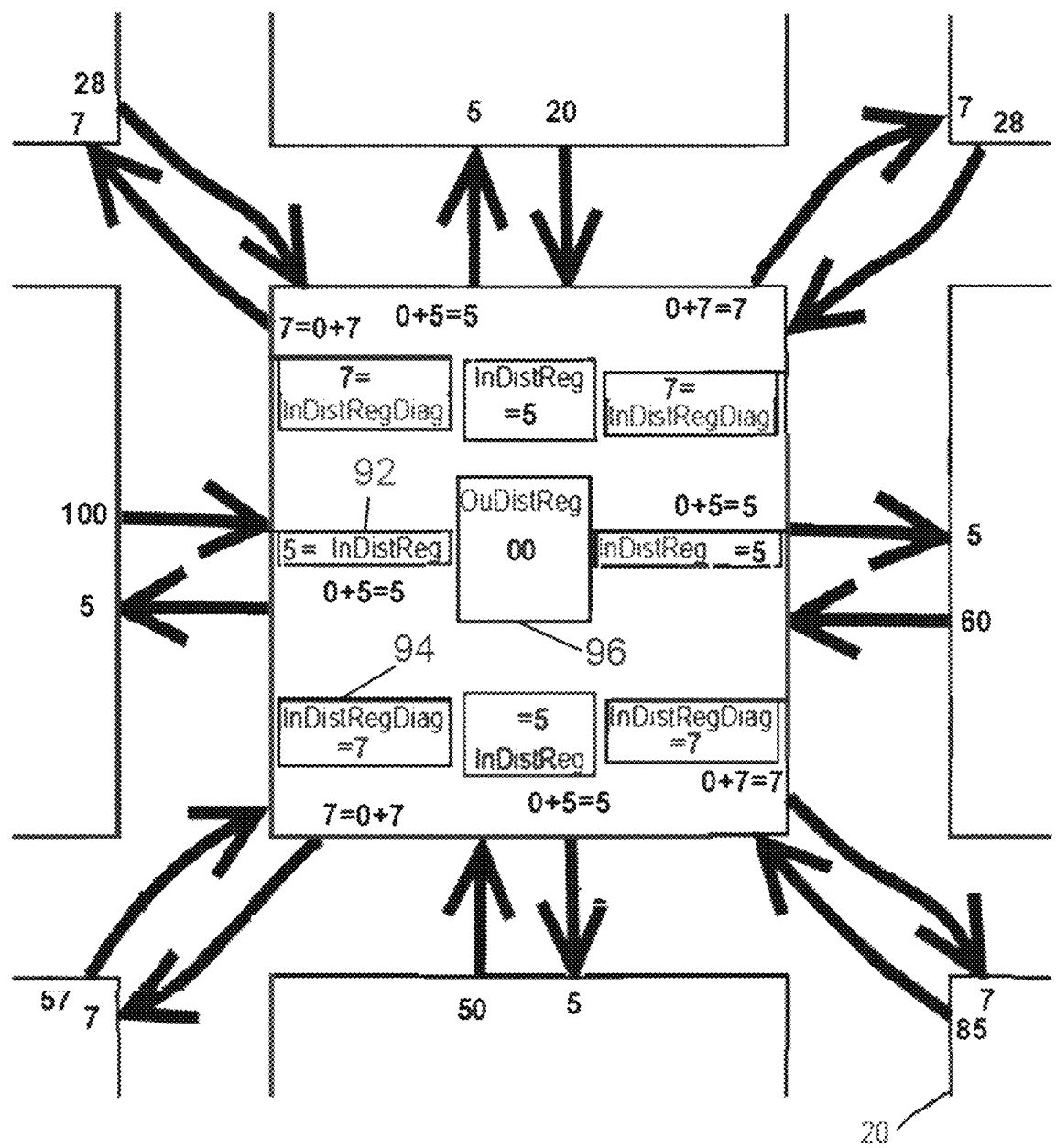
FIG. 28 illustrates a representation of a cell operation as a start cell.
Figure 29A:
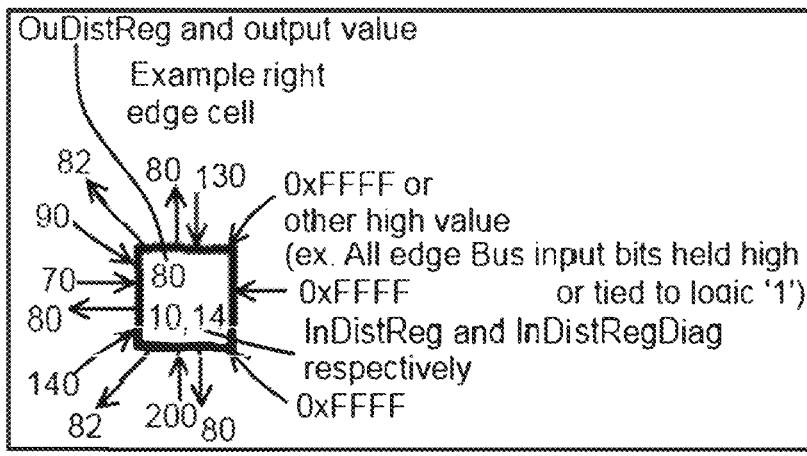
FIGS. 29A-29E illustrate I/O connections in exemplary cells in the cell array.
Figure 29B:
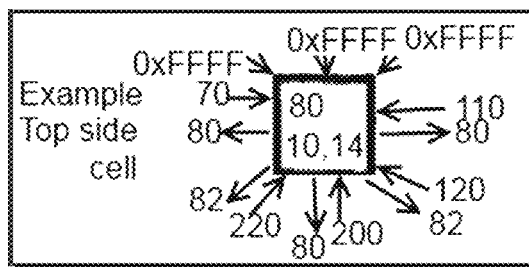
Figure 29C:
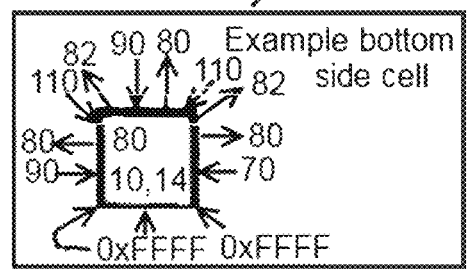
Figure 29D:
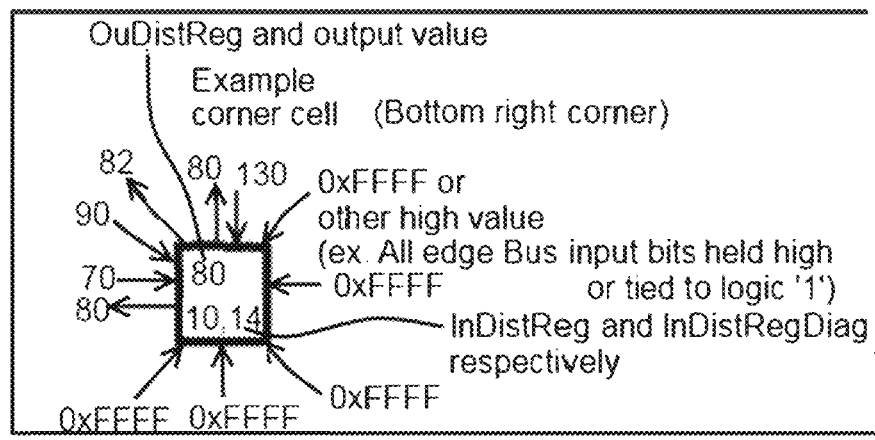
Figure 29E:
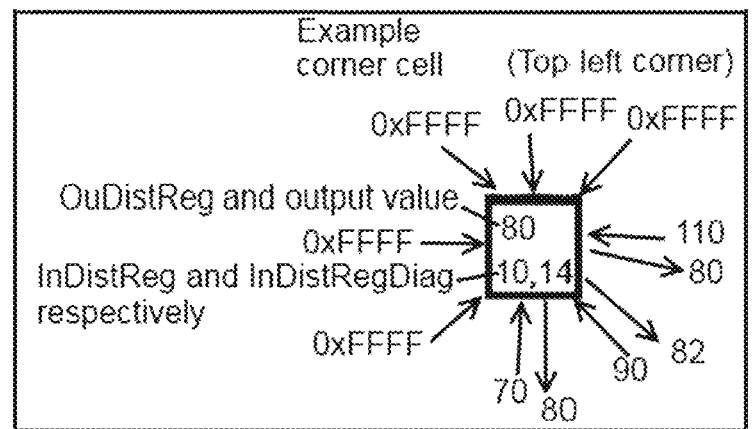

FIG. 28 illustrates operation of the cell 20 being selected as a StartCell and calculations, exemplary inputs and outputs. Illustrated is the StartCell's ignoring inputs from neighbor cells and constantly outputting its constant distances from its center reflecting its status as a StartCell.

FIGS. 29A-29E illustrate I/O connections in exemplary cells in the cell array 10. It would be understood that the cell 20 on an edge or in a corner of the cell array 10 will not have all valid I/O connections external to the edge of the cell array 10. Thus, some I/Os inputs are hardwired to be set to infinity by a representation of 0XFFFF.

Figure 30:
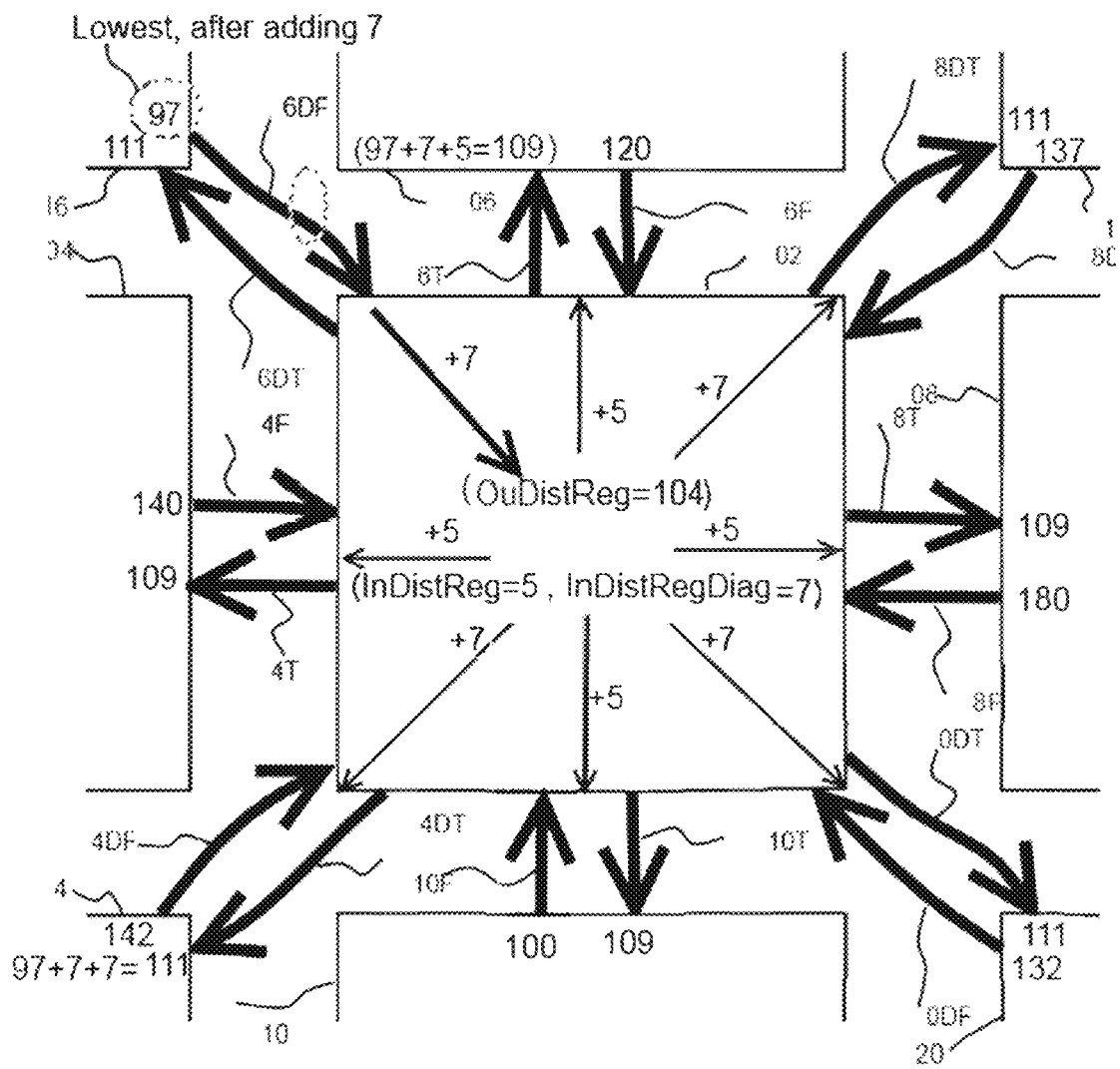
FIG. 30 illustrates input and output operations and results of a cell and its neighbors which all have a InDistReg=5 and InDistRegDiag=7 and example input values and calculated outputs and OuDistReg outputs wherein the lowest value of 97 comes from a diagonally located cell.
Figure 31:
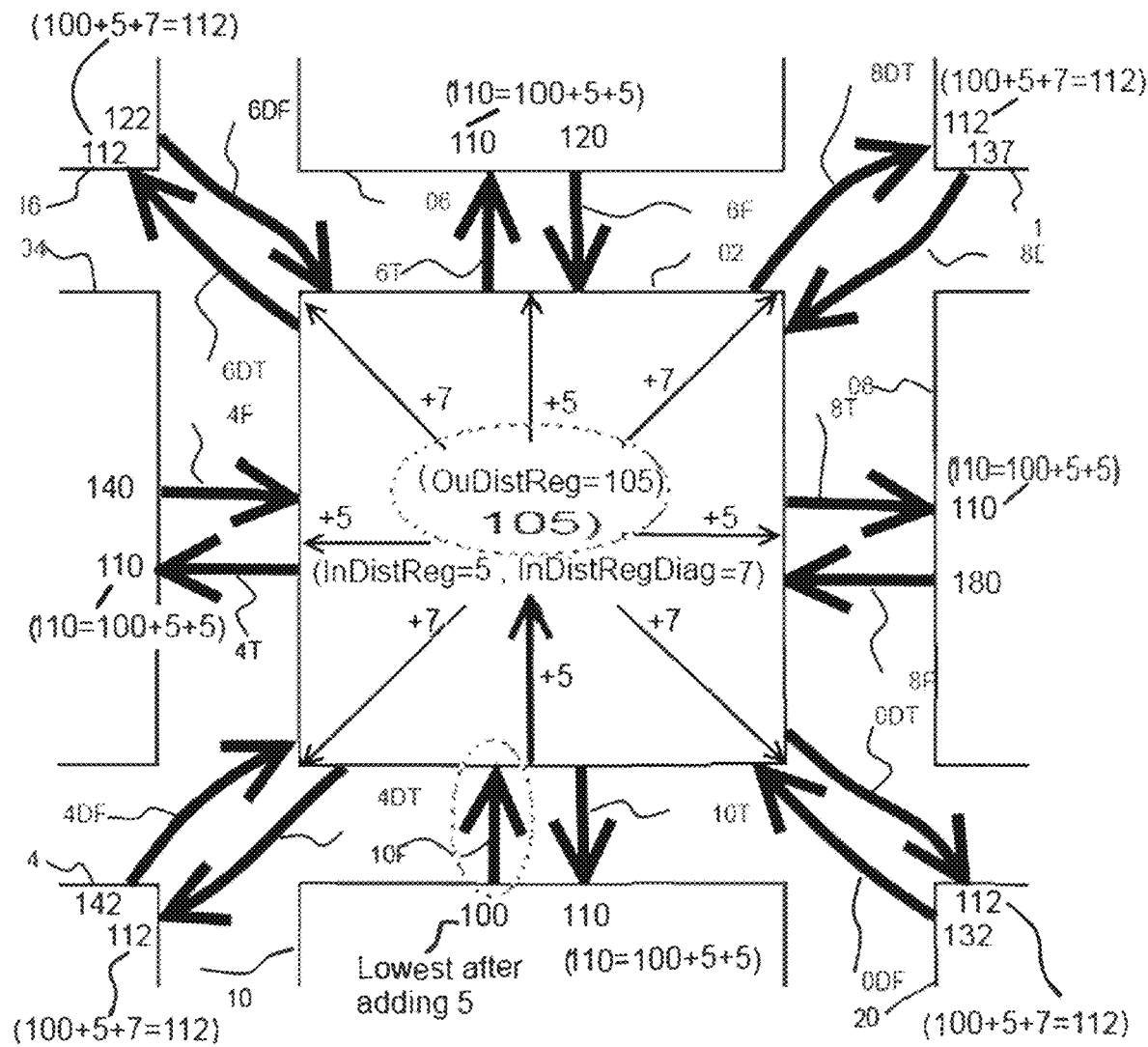
FIG. 31 illustrates input and output operations and results of a cell and its neighbors which all have a InDistReg=5 and InDistRegDiag=7 and example input values and calculated outputs and OuDistReg outputs wherein the lowest value of 100 comes from a non-diagonally located cell.
Figure 32:
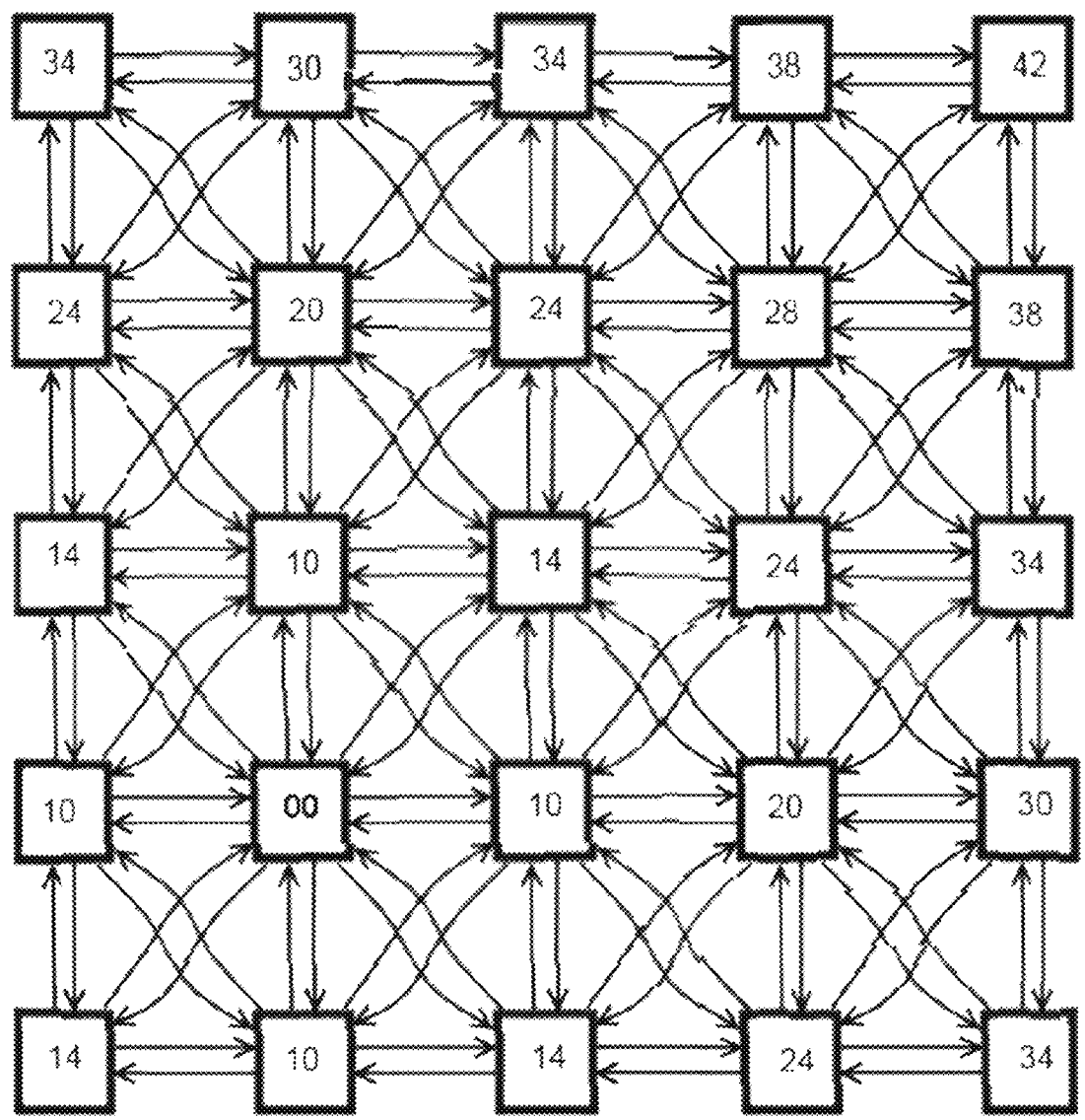
FIG. 32 illustrates an exemplary 5×5 cell array with values calculated from a starting cell, designated as 00.

FIG. 30 illustrates input and output operations and results of a cell and its neighbors which all have an InDistReg=5 and InDistRegDiag=7 and example input values and calculated outputs and OuDistReg outputs wherein the lowest value of 97 comes from a diagonally located cell. FIG. 31 illustrates input and output operations and results of a cell and its neighbors which all have a InDistReg=5 and InDistRegDiag=7 and example input values and calculated outputs and OuDistReg outputs wherein the lowest value of 100 comes from a non-diagonally located cell;

FIG. 32 illustrates an exemplary 5×5 cell array with values calculated from a starting cell, designated as 00 in accordance with the above disclosure, particularly in a reference to FIGS. 27-31. Start cell OuDistReg contains 00 value and will not be updated by neighboring cells' distances. Shown in the cells is the result of the distance calculations from the start cell as contained in each cell's OuDistReg after all updates are complete as a sum executed in all cells containing the same InDistReg value of 5 and InDistRegDiag value of 7.

Each cell 20 asynchronously calculates the path loss aka 'accumulated distance to it and thru it to its center' and sends this LOWEST calculated path value to its 8 neighboring cells. All cells 20 in the cell array 10 thus settle into their lowest possible value, asynchronously. Any individual cell may be updated to a lower value from adjacent cells at any time until no lower value can be achieved. As a path through a cell 20 imposes a minimum path penalty of 5 or 7 depending on register values set and if a straight or diagonal distance to cell edge (or 10 or 14 if a higher resolution design is chosen), no unending looping can occur as any higher value would be rejected as non-minimum. Stated another way, the cell has no reason or capability to loop to a higher value, and cannot be set to a lower value than its surrounding cells allow it. A whole 128×128 cell array for example thus settles into a minimum path state asynchronously, where the resulting minimum distance to each cell from the StartCell is stored in each cell including the destination cell.

The initial value of the output and hence input bus lines for all cells but the starting point cell is set to the maximum value, 65,535, FFFF hexadecimal, or 1111 1111 1111 1111 binary. This is set when the Init line common to all cells is held high or at a '1' level. The PBP values are loaded into each cell from a common bus also, with the appropriate cell selected by a 'Row Address Select' (RAS) and 'Column Address Select' (CAS) line and the R/~W line held low to cause a write to the cell's PBP 16-bit register. When all cells are initialized with PBP values, the 'Map' is completed and the Rst/~Run line goes low to a '0' value to cause all cells to cascade and calculate asynchronously and output to race to the lowest value possible by reflecting the lowest found calculated path length+added length to the center (InDistReg or InDistRegDiag)+added length back to the outside along the path thru that cell.

The detection of completion can be accomplished by a variety of means, from simply sensing the reduction of chip total current draw to below a predetermined value, to setting a changed output detected line for each cell which then is ORed together with all other cell's changed output status lines and sent out the co-processor 200 to a controller interrupt for example. It is envisioned in some embodiments a more sophisticated means may be eventually configured to detect sufficient or 'near completion' as the distance to outlying non-goal cells are unneeded and may be ignored, enabling stopping the process sooner and faster, and drawing less total current, depending on the complexity of the map. A simple cubic spline may later smooth a complex irregular path result. A more sophisticated embodiment may use approximately 1.4142278 as a multiplier on a straight path PBP to establish the length of a diagonal path. The result of 1.4142278 straight path PBP value may be calculated outside the chip by a CPU and stored in a separate register in the cell (typically in integer form) which is added to calculate the path length result if a diagonal path is taken. An exemplary calculation result would be:

If (straight thru cell is the minimum) THEN Output-
Value to 8 neighbors and(/as output)
register=the Minimum one of 8 input cell's
InLength+PBP            (Case A)

If (diagonal motion thru cell is the minimum) THEN
OutputValue to 8 neighbors and(/as output)
register=the Minimum one of 8 input cell's
InLength+1.414 PBP            (Case B)

This can be implemented in simple asynchronous logic.

Once completion is determined, the distance to each cell 20 is selectively read from the 'Goal' or 'Target' cell's OuDistReg from the Controller back along the substantially shorter or shortest path (evaluated by the correct valued path verified as the next cell in path wherein it is the one where current cell's OuDistReg–path distances thru both cells=next closer to StartCell cell's OuDistReg OR more simply but sometimes less accurate the neighbor cell containing the lowest OuDistReg) to the 'Start' cell similar to as is done in the Dijkstra Algorithm. Some post processing performed in a Controller 290 calculates the more minimal path if multiple path solutions are found. Here an opportunity to perform higher dimensional evaluations and considerations presents itself where a 'smooth' turn of constant angular velocity and/or angular acceleration is preferred and chosen. As the co-processor 200 may appear to the Controller 290 as a simple memory mapped (ex.) 16-bit 128×128 memory RAM,—read, write and processing speeds are fast and simple. Again, the cell undesirability (ex. vehicle speed limit thru the region associated with that map cell) may be written into the cell as a 16 bit positive integer typically, and the distance to that cell's center from the StartCell center is read out as a 16 bit integer. Other or higher integer sizes may be chosen, especially for a larger map or if more terrain granularity/resolution is needed.

If a small number of differing PBPs are anticipated such as a vehicle on a salt lake terrain or a UAV in open air with only occasional obstructions, an implementation hardware addition enabling the including the step of initializing the defaults quickly to the same hardcoded or register value automatically preset and them set the obstruction location(s) scattered in a small subset of cells may save time.

A shorter duration path finding process, in for example a 128×128 cell map, is to repeatedly and typically periodically update the map with new information, such as newly observed added obstacles and/or vehicle motion location (typically) forward. Because the process is asynchronous and may be implemented in relatively high-speed CMOS logic, even a ridiculously improbable worst case solution containing a minimal path of ~8000 cells (rather than a typical path solution of ~500 cells) is calculated to require less than 1 ms using a 180 nm fabrication process under 125 ns per cell in the path. In real world applications, a typical optimal path solution spanning ~500 cells in a 128×128 cell Map requires under 100 µs and would typically apply, excluding CPU downloading and processing time of under 500 µs (4 bytes/cell*16K cells=64K bytes (over 16 bit bus) or 128 MB/sec rate.

It is important to note that a square cell array configuration on chip using throughout eight neighboring cells and weighting connections to each of the eight neighboring cells arrangement is sufficient to usefully find and represent any angled or curved path at any resolution. A hexagonal design cell with 12 neighbors, although offering more paths and 30 degree resolution increments instead of 45 degree increments, would not inherently offer better final path angle and circuitous path resolution, based on chip area used, circuitry design and circuit bus interconnect lines area needed and used. Complex map regions can be represented more accurately by implementing them on a separate map, or a zoomed-in map of a map region offering more total cells for a given area in that region. Curved paths including narrow complex curved paths are initially represented as a series of straight and diagonal paths. Any such region can be further scrutinized and processed to finer and finer resolution as desired, requiring only greater processing time or multiple co-processors 200 or multiple separate regions at higher spatial resolution of the co-processor 200 implemented on the same die. Alternatively, in most cases simple interpolative means may be employed such as a Cubic Spline to join and smooth the initially irregular paths comprised of straight, 45 degree and 90 degree bends. This processing step requires little CPU time and power on general purpose CPU circuitry and may initially be done in the general purpose CPU used to feed new Map updates and read new minimum distance results out of the co-processor 200.

Any cell start point and end point. The overall chip and its ADL logic cells is designed to allow any cell to be a start point or and end point. The design simultaneously and asynchronously determines the shortest distance from the start point to any other cell.

Any cell can be considered to be the end point. If the endpoint changes drastically, only the endpoint need be updated by external logic addressing only that cell, then path recalculation can be allowed to occur. This recalculation may be automatic or stopped or started by external control at any time.

Each cell 20 selects one of the neighbor cells 20 immediately around it which is sending out the shortest path and calculates a new distance thru the cell and then outputs that distance back to its neighbor cells. This is not done serially as in a CPU But done concurrently/simultaneously as fast as the logic runs and in parallel, making each node $x_{ij}$ an asynchronous concurrent simultaneous processing element whose final distance to the origin start node is based on the minimum value of its eight neighboring cells+an additional distance inherent in moving forward into that node (such as 10 or 5 (=10/2) for an directly adjacent neighbor and 14 (=~10*sqrt(2)) or 7 (=14/2) for a diagonal neighbor)+a weighting factor reflecting that nodes relative undesirability due to any number of extra factors such as speed limit thru that node, node elevation, road quality of that node, 'danger level' of that node or etc. The weighting factor for a diagonal node may be hardcoded, stored or prestored in the cell's memory typically as the weighting factor for a directly adjacent neighbor*sqrt(2). At times diagonal motion may be highly undesirable and the diagonal weights set may be disproportionally higher than 1.4*non-diagonal weights such as flying into a crosswind. Thus, travel on a diagonal path can be made to account for the added distance and added undesirability factor applied to that distance. Further, due to the asynchronous logic design, each node only changes state and draws more than the minimum power when its calculated distance from the start node changes which is based on the selected minimum value of all eight of its neighbor's calculated distance from the start node and a change in that value. Each cell is a complete and independent processing unit, containing 16-bit binary asynchronous adders and comparators and constantly seeking the minimum distance to the start node from its 8 neighbor's minimum distance calculation and outputting that cell's new minimum distance to those same 8 neighbors. Changes are propagated thru the cells and the entire chip as fast as the logic can change state and is not dependent or waiting on a clock edge to proceed, nor do any logic circuits within it draw unnecessary power as they only draw a very small leakage current unless and until a input line from a neighbor changes state. A cell may change calculations multiple times as the minimum values propagate thru the chip, but the final state of a cell and the entire chip may be reached when all cells in the chip have reached their minimum path to the start cell. A new Map update may only change a single cell's PDP, but this change may propagate through the entire chip, finding new minimum distances and a new minimum path solution.

Ultra-low power and very fast solution result as typical start-location-update change often occurs, by moving start cell forward 1 cell along shortest path already found and already established in the map, no other cells (or only one cell—the previous start cell) need changed or to be changed An implication of the design and capability of designating any cell to be a start cell is that a motion (typically forward one cell in map, but it can be any direction) can be simply represented as the new StartCell location, usually being an adjacent cell in the previously found minimal path. As the vehicle is presumably mostly in the shortest path and following it, and there are no map updates for a large percentage of the time, a simple technique can be used to move the start cell and increment its internal weight, resulting in a brief change to only two cells and minimal power draw for that update.

Power sense in cell regions can be used to save power and increase speed by only reading out regions which draw or have drawn power during current update operation, or are not in start to end path The whole co-processor 200 need not be read in after every move and update, only the selected regions that are sensed to have changed. Also, only the regions containing the minimal path(s) need be examined by the CPU. However, the ADL chip still automatically maintains the remainder of the Map and all shortest distances from start-cell to all cells independently.

Any portions of the Map may be updated any time, as much or as little as needed, without requiring a full Map reload.

This is conceptually simpler while saving time and power. Large or minor changes to Map regions characteristics may be specifically made without influencing any other part of the map. These changes may immediately begin processing the minimal path search architecture inherent to the chip in all regions and cells, at all scales large or small, saving time and power.

Figure 33:
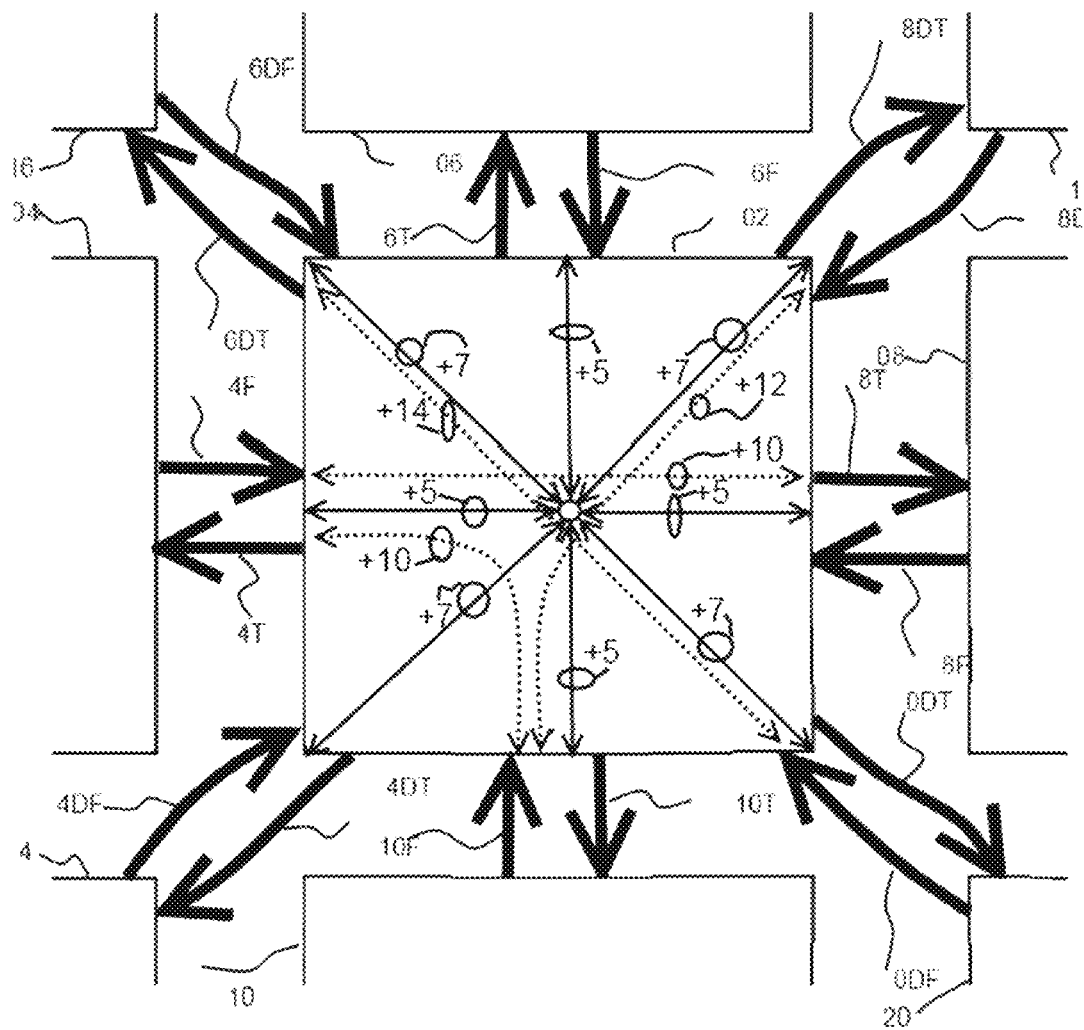
FIG. 33 illustrates an example of calculating travel paths within a cell.

FIG. 33 illustrates an example of calculating distances of shortest travel paths thru a cell depending on the location of the lowest adjacent cell and the output bus location, standard initial cell weighting distances were chosen for simple illustrative purposes;

FIG. 34 illustrates an exemplary truth table of all possible control line and cell states and functionality, with State names chosen for reference purposes. It assists in determining what is happening in a cell when Control Lines are set to specific value combinations and to decide what state to jump to next to achieve the objectives of loading cells running the array initializing cells, reading results etc. ;

If all the cell's in the array read/write timing is sufficiently consistent and known, there will be no possibility of brief intermediate states causing unwanted operations, and any state can be set from any other state.

The Map Cell may be designed to add gates and Control Lines for them to initialize InDistReg and InDistRegDiag to all 1's or high-values or Hex FFFF upon power up. This enables a quicker reset of the whole chip than by cycling power off then on to assume a default of impassibility everywhere. Thus small maps need only be placed and written to a small region of InDistReg and InDistRegDiag without updating interference and performed quickly. Alternatively several smaller maps may be placed in the chip and separated by impassible regions, thus several maps may execute concurrently. Another advantage of this optional feature is that lower power is consumed by updating cells as the numerous high-value preset cells will not cause neighbors to update to change state to lower values as the high-values will never be lower than any other value.

The controller 290 may be configured to control operation of the co-processor 200 in all phases of operation including cell initialization, distance to start cell execution and all cell distances read out results by changing only 1 control line bit at a time or 1 address line bit at a time and waiting a foreknown pre-designed needed time for the gates and registers to process the new state, or receive or send data from or to the Register Bus.

An advantage of this 1-bit-only-change approach, using a 'Grey Code' type method for example, is that no undesired fleeting brief intermediate states can occur if only 1 bit of the control lines or address lines is changed at a time. Thus, a typical 'next' write after register 3 (binary 0000 0011) would be register 4 (binary 0000 0100), but a 'Grey Code' method would change only 1 bit and a binary 7 (0000 0111), binary 2 (0000 0010), binary 1 (0000 0001), binary 11 (0000 1011), or binary 19 (0001 0011), or so fourth, may be next. As variations in logic gate speed can occur, a binary 3 address increment may briefly change to a binary 5 (0000 0101) before settling in to a binary (0000 0100) as one line switches faster than another. Thus the data in address 5 may quickly change and be corrupted. This is especially true if logic of mixed speeds is used, some cells operating faster than others. The above method prevents such problems. It may now be practical and be desirable to configure a region of the cell array to be faster but require more space than another region. For example some situations may require fast path planning only in regions near a StartCell, a Startcell may be always chosen to exist in a fast region such as the center, with slower regions in the corners requiring less gates but containing more cells and a higher cell density. FIG. 34 shows an example of a Grey Code method of addressing the first 16 addresses without using the usual counting sequence.

FIG. 35 illustrates an exemplary state change sequence to load, read and write cell results. FIG. 35 similarly shows a sequencing of Control Lines wherein only 1 line at a time changes yet all registers are loaded, distance to StartCells calculations start and complete, and results are read without changing more than 1 line at a time. Thus intermediate states do not exist even briefly. The sub-sequence within the exemplary sequence indicated by 'A' and 'B' are used to set a cell as a Normal or StartCell as desired.

FIG. 36 illustrates the possible numeric values and sequence that can be achieved by Grey Code method by changing only 1 bit at a time. This can be applied to any size integer number to serve as an address to access all registers without changing more than 1 address bit at a time. This may be done instead of incrementing the addresses by one in binary as is often done.

A more complex, more space consuming but more operationally flexible design can be made using additional control lines and registers to eliminate any desirability for such a Grey Code scheme. Thus the OuDistReg may have added logic and a control line to allow it to be preset to any value, also acting as a memory location. This may also be desirable to perform diagnostics in memory operating in an environment exposed to ionizing radiation. Similarly, a Control Line may be added to allow the InDistReg(s) and InDistRegDiag (s) to be both read and written to. Thus in a cell array of varied speed cells, cell register values may be verified as being written to properly and containing the correct value before processing starts. Further, a control line and gates may be added to initialize all registers to 0xFFFF or to a value specified by the Register Bus, for faster initialization or to reduce current draw as some Gated D-latches may power up in random states. The added lines may be used to add capability of reading intermediate results from cells while the path processing is occurring, for example to discern if completion is near.

An external clock line may be added and applied to sequentially or alternately enable/disable calculation in a region of cells or every other cell as in a checkerboard pattern with each cell being a square of the checkerboard.

Alternately enabling or disabling calculation in a region of cells does not violate the spirit of clock-less circuitry and maintains speed advantages as the processing within the region is fast and clock-less.

Figure 37:
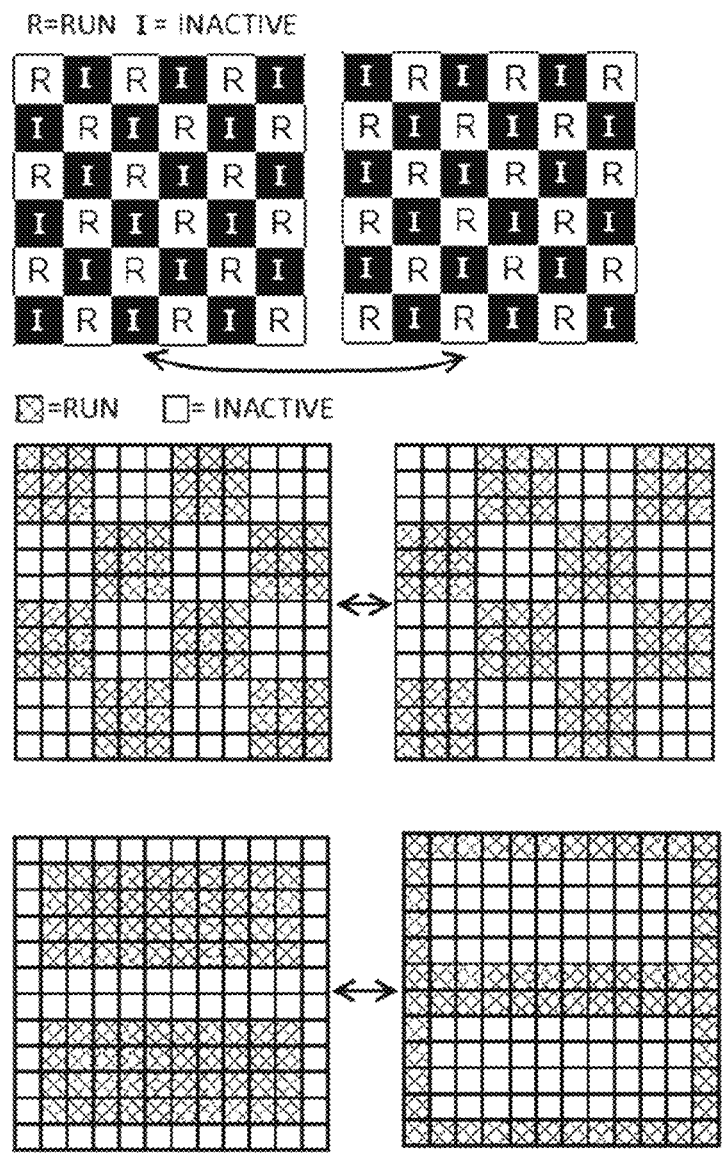
FIG. 37 illustrates an exemplary approach of enabling or disabling a group of cells.

FIG. 37 illustrates an exemplary approach of enabling or disabling a group of cells. Regions of cells may be allowed to actively calculate asynchronous clock-less least distance to start cell until decision to stop is issued, for example from the controller 290. Active regions alternate multiple times, a long duration of metastable state is thus prevented. The results progress through the region until the region boundary is encountered. Then the adjacent region is enables and processing continues. This also limits the duration of any possible metastable condition within a region. A clock line from the controller 290 may for example serve to output a signal to a dedicated logic line configured via added logic to latch the OuDistReg outputs on in a prespecified or predesigned region, preventing changes from passing thru the frozen processing in that cell or region, or temporarily force a 0xFFFF output. Temporarily forcing a 0xFFFF output is more useful when applied to lines of boundary cells 20 in a region of cells to temporarily isolate cells in intermediate states.

To save space, Schmitt Triggers may be only applied to every other cell 20 or to a 'line' of cells 20 while still substantially achieving the same edge-sharpening, metastability reducing, power reducing results.

A current comparator 250 may be configured to measure the current of a cell 20 or group of cells 20 and if it is excessively large for a longer than a pre-established period of time, cause the power to be withdrawn for a delayed period of time and then reapplied. This can be done if Schmitt Triggers are not used to limit current draw when lines are not switching quickly but dwelling unusually long between voltage states for logic '0' and logic '1' while switching states in a device. This reduces current draw in unusual conditions and prevents burnout of logic gates if they are not designed to handle such conditions for an indefinite period of time, or the Schmitt Trigger circuits are of lesser quality and allow a narrow voltage region to output an intermediate voltage for a significant period of time. A current limiting means may also be applied to a cell 20, a region of cells 20 or the whole cell array 10 to limit total current flow. Alternatively robust burnout proof logic gates may be designed and implemented in a semiconductor die to handle any Metastability issues occurring in very large cell arrays allowing a metastable state to be present indefinitely which should not occur.

Although the method has been illustrated on an example of adding positive values, negative values can be also used.

The disclosed method may be implemented in the form of software stored on a computer-readable non-transitory information storage medium such as an optical or magnetic disk, a non-volatile memory (e.g., Flash or ROM), RAM, and other forms of volatile memory. The information storage medium may be an internal part of the computer, a removable external element coupled to the computer, or unit that is remotely accessible via a wired or wireless network.

The method may take the form of a computer program containing one or more sequences of machine-readable instructions describing a method as disclosed above, or a data storage medium (e.g., semiconductor memory, magnetic or optical disk) having such a computer program stored therein.

Computer program code for carrying out operations for aspects of various embodiments may be written in any combination of one or more programming languages, including an object oriented programming language, such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

It is envisioned that further speed enhancements can also be gotten by added bus lines and calculations to farther neighbor cells, in addition to or 'skipping' immediately adjacent ones. Usually, default movement in the same direction is the optimal solution and a processing 'jump' to a cell directly ahead . . . but 2, 4 or 8 or more units away can result in even faster solution times. This comes at the cost of the added die area used in allocating those additional bus lines and logic.

An above described approach can be applied to achieve low SWaP while rapidly determining the minimum path to the start cell, the most time consuming phase of the Single Direction Dijkstra Algorithm.

In accordance with above disclosure, a numerical envelope of the mission can be constructed (e.g. for a ground vehicle—a set of differing maps of simple to very complex containing an envelope of path/roads, obstructions, terrain elevations). Start points and destination points may be placed anywhere and changed anytime. This Map/digitized envelopes (2D, 2½D MAP with region/path equivalent speed capabilities (which may also be or combined with equivalent elevations, road quality metrics, and/or speed limits) may contain, as a property of each point, terrain speed and/or location characteristics. The digitized model of the envelope may be interactive and is modifiable by the sensors (for example, Lidar or human) in the process of vehicle movement.

It must be noted that the human brain cannot typically nor easily perform the path-planning asynchronous parallelized simultaneous logic described herein, especially on a larger scale of over 100×100 cells, to quickly and exactly facilitate finding the shortest path, and in an error free manner, therefore it can only be done in a mechanized manner such as a computer or other mechanical device. It must typically be implemented in a specifically designed logic circuit to achieve greatest efficiency.

An N×N-unit cell co-processor design may be configured to implement a variant of the uni-directional (or bi-directional) Dijkstra algorithm in chip-hardware level with Tanner, Mentor, or Cadence EDA compatible engine.

Sensory information may determine map start location or current vehicle location and destination or stop cell as vehicle progresses and may be adjusted by the vehicle speed and vector. Realtime map modifications resulting in changing speed and vector of movement are typical inputs, control outputs may be generated based on the direction of the next cell on the shortest path for vehicle travel and enable motion on map.

In an embodiment, a cell array 10 of 180 nm in size is suitable to achieve well under 1 ms response with worst case complexity map configurations, without smaller and faster process geometries needed, with a SWaP power draw for 128×128 average map scenarios and maximum complexity map scenarios is well below 1 watt average, and the resulting die size conforms to a SWaP requirement for platforms under 1000 grams and the map can be updated, rewritten, and processed based on the current design in well under 1 ms.

Embodiments may instantiate hardware circuitry to implement the developed invention with needed I/O for tape-out, with focus on implementing the single direction Dijkstra processing (SDDP) circuitry in silicon with external I/O hardware interface circuitry and lines to the cell array. Issues resolved may be what type of bus may be chosen to interface to the chip to load the map's cell weights and readout the optimal path results. Embodiments of busses include one or more of SPI bus, I2Cbus, memory mapped address and data lines, 1 Gbps or 10 Gbps Ethernet, and/or a LVDS line.

In an embodiment, the co-processor 200 may be used in a ruggedized hardware design for vehicular platforms of varied sizes and capabilities, and be from chip scale, board-level, handheld systems to multi-board solutions.

Embodiments include a very high density logic (VHDL) design in hardware model, a programmable logic device such as an FPGA or a fully taped-out, instantiated 2D CMOS hardware chip capable of supporting any robotics 2D or 2½ D-based platform. Invention's sensors technology platform may be interfaced with cameras, LIDAR, motor controls, motor current feedback sensors, Inertial Measurement Unit (IMU), battery level sensor, and GPS for the newly created SDDP chip to support automated motion planning, by providing necessary realtime, real-world sensor and motor drive I/O for map creation and continual updating. This supporting hardware may be implemented to increase the planning dimensionality of the developed system, accounting for platform travel limitations (top speed, remaining fuel, maximum acceleration/deceleration, maximum angular rotation velocity on current road surface or in air at current speed and altitude, maximum change in angular rotation velocity on current road surface or in air ($2^{nd}$ derivative), etc. and improving the decision capability while maintaining lower power requirements. These factors can be incorporated to an extent in a Map cell's single undesirability parameters. Multiple undesirability parameters or weights (InDistReg, InDistRegDiag) for each cell are contemplated to be processed mathematically and with constraining logic also.

In an embodiment, the co-processor 200 can be configured or operable to perform vehicle (robotic) actuator coordination and control, and resource allocation optimization based on the results of the ADL chip and other related continuous realtime input variables and constraints. For example, multiple equally shortest paths may be presented by the ADL logic results, but some paths may be more optimal to implement based on mapped road's speed limits or road quality speed limits, sensed wheel slip, maximum vehicle angular velocity versus speed, minimum turn radius, current vehicle wheel angle direction degree position, current aircraft control surface position, calculated lift, flaps position, airspeed vector, wind direction vector, map visibility-certainty regions, location of adjacent UAVs/UGVs in the swarm, and/or camera-detected, LIDAR or RADAR forward visibility. An enhanced automated decision and control technology is enabled by this disclosure.

A comprehensive set of implemented I/O parameters may include the following UGV/UAV input sensors and output control parameters applied to a 2½ D or 3D map of mountainous terrain or airspace. A set of sensors and actuators may include the following sensors and actuators as shown in Table 1.

TABLE 1

Inputs/Outputs advised by path-planning which may be used for full 3-axis operation and control, typically by motion control techniques.

| Control Parameter | Minimal | Advanced | Control Parameter | Minimal | Advanced |
|---|---|---|---|---|---|
| Inp-Magnetic compass | (1-axis) | (3-axis) | Inp-Gyro | No | (2-axis) |
| Inp-GPS Location | (2-axis) | (3-axis) | Inp-Accelerometer | No | (2-axis) |
| Inp-GPS Speed | (2-axis) | (3-axis) | Inp-Battery/Gas level % | No | |
| Inp-GPS coordinates goal | (2-axis) | (2-axis) | Inp-Motor speed RPM | No | YES |
| Out-Steering Dir Req | (1-axis) | (2-axis) | Inp-Motor draw amps | No | YES |
| Out-Motor speed Req | No | YES | Inp-Comm signal dBm | No | YES |
| Inp-Steering Direction | No | YES | Inp-Cameras/LIDARs | No | III |

Embodiments may thus provide guidance for which cell to go to next corresponding to a physical location for vehicle actuator coordination and control, based on the results of the ADL chip and other related continuous realtime input variables and constraints. The map may include not only information about flight path, but weather conditions and tolerance to their deviations.

Some embodiments may implement a fully 3D stacked die version which can do true 3D motion planning applications. Bumped Die interconnects may be used to communicate between the layers, using either a high speed serial local bus between adjacent cells above and below, or a more direct connection means such as individual I/O lines.

Some embodiments may be extending, interconnecting, and combining the individual dies into a Multi-Chip-Module (MCM) solution to increase the total number of 2D cells in a plane from a 128×128 solution to a 256×256 cell capability in a single package. It is envisioned that reduced process geometries (ex. a more expensive and leading-edge 20 nm, 14 nm, or 7 nm [ ] process instead of a 180 nm process can greatly reduce size, increase density, reduce power consumption and/or increase the number of total cells by orders of magnitude). MCM packaging and reduced process geometries can also extend capability beyond a 1024×1024×256 3D dedicated high speed low power CMOS motion planning single-chip solution with more path and node PBP resolution granularity beyond 65K in each node. Floating point numbers instead of integers may be used for greater variability and characterizing map cell values with more detail which may create more accurate results in some terrains with slight to large gradations.

Other embodiments may use designs to increase speed such as implementing a Dual-Directional Dijkstra Algorithm variant rather than the simpler single direction approach. This is a more complex design wherein a Dual-Directional approach starts from both the starting point and ending point and works towards the middle. The single direction approach only starts at the beginning and works towards all possible end points. Other approaches may include multiple interleaved simultaneous executions on multiple chips where the current map is updated on other chips while the path-planning is executed on a currently-designated primary chip. An additional enhancement may simply add a bus within the chip to create and control map motion representative of real motion and/or rotation by shifting the mapped values of each cell to its neighbor. Thus, a complete map reload is seldom needed.

Exemplary embodiments may include operation on CMOS compatible 128×128 cell ADL logic chip embodiments packaged in a BGA or possibly a lower pin-count but high speed serial interface package (LVDS or 10 GBPS Ethernet) for implementation in customer robotics platforms or UGV, UAV, or USV platforms for path planning purposes, embodiments as single board implementations which are plug-and-play in a 3U Compact PCI bus form factor, a MCM module either in mezzanine module form or chip form all may be done. A development kit may be offered for implementation of all embodiments, with interface to a PC via USB port, as well as other ports being made available including Ethernet, I2C, and SPI bus. As the Map update usually only involves minor changes to a few locations in the array, once the map is setup the lower speed busses are suitable for communicating as only the start location, stop location, and map updates may be needed in many applications. An onboard CPU/microcontroller may perform all necessary path retrace, map change, map readout, and/or region change or current sense operations. It may only need to report the next direction of movement to take. However, it may optionally be requested by a higher level vehicle supervisory control to provide the entire solved Map in its current state. A CPU core may thus be added to a chip embodiment or MCM.

The embodiments may offer increases in cell count (256× 256 to beyond a 1024×1024 ADL version), as well as 3D implementations of the technology. Smaller, lower power and faster process offerings well below 65 nm such as using a 14 nm or 7 nm feature sizes with FinFET based gates fabricated using EUV lithography may enable such capabilities while eliminating SWaP considerations for customers. Invention is also operable in an embodiment in a 14 nm process.

The disclosed subject matter may be usefully applied by someone of ordinary skill in the art to interfaces for applications including hardware and/or software interface to and control or advisement of a wide range of systems for Robotic and UAV, UGV, USV, and intelligent automobiles, warehouse automation and logistics, medical and healthcare, service robotics in education and research institutes, ground-based service robotics systems automating the warehouses, personal service robots, logistics and telepresence robots, ground-based service robots, applications such as telepresence and inspection and maintenance are applications for the invention and the overall service robotics market including service robots in defense, domestic robots, and education and research and hobbyist sectors, the marine, milking robots, and logistics robots, elderly healthcare and the personal assistance robot, self-driving autos, Unmanned Ground Vehicles, Unmanned Aerial Vehicles, Unmanned (naval) Surface Vehicles, Quadcopters, Drones, robots, delivery robots, semi-autonomous or fully autonomous real-time control systems for real-time adaptive Path-Planning, robotic path and arm motion optimization, and automated and semi-automated warehousing operations where robots are directed based on current or predicted obstructions to travel the best path, automated security guards, asset tracking, assistive robotics technology for the elderly and disabled, and law enforcement monitoring, robotic floor cleaners, crop farming field operations robots, hospital tasks automation, and automated search and rescue emergency operations and coordinated swarms of automated units such as for high gathering quality and real time geographic and sensor data, the aerial photography & remote sensing, aerial photography and remote sensing, collecting surveillance data for 3D mapping in various industries, such as oil and gas, agriculture, and logistics, among others, for photography, inspection, and monitoring, for mining and construction purposes, automated and semi-automated warehousing operations where robots may be directed based on current or predicted obstructions to travel the best path to a placement or retrieval destination.

Selected individual cells or single regions of cells or multiple regions of cells may selectively only be allowed to update, wherein other regions not needing minor updating may be inhibited from performing update processing (saving time and/or power). The decision to perform and which regions to perform on selectively may be made by human, AI, heuristic, and/or statistical processes. One means to do select region(s) is by adding select lines and associated logic circuits to the hardware array in the chip to address, inhibit or select and enable those regions' Rst/~Run lines or individual cell Rst/~Run lines separately, where in some configurations of map, power and time is saved during update-execution. A region may typically be an 8×8 region of cells, but larger or irregularly sized regions may be created. This may typically be done for example when a update of a new obstruction is sensed nearby-and-behind the vehicles start location and nowhere near the stop target cell location, opposite the direction of the stop target cell location relative to the start location, and nowhere near the current shortest path. The region with the cell(s) representing the new obstruction may thus then be the only region allowed to run and updated, preventing minor changes from propagating and consuming power which do not impact the shortest path found and needed.

Multiple start and stop cells for multiple vehicles may be contained in the Map and processed simultaneously. If a specific start and stop cell is associated for a vehicle's location and destination (the start cell typically representing the vehicles current location, however the stop cell may be used as the vehicles current location instead with the start cell representing the target destination—creating the same path), a region of the map may be isolated using a plurality of methods. If one set of start and stop cells for one vehicle are very far apart from another's vehicle, a large distance separation method alone from the other set of start and stop cells for another vehicle may be sufficient, especially if the terrain is not complex or mazelike. Another method is to provide a means to disable crossing a line of cells or prevent calculating outside an area of cells by creating a boarder of intermediate interposing cells with high-value (ex. 0xFFFF), creating a separation or wall between arbitrarily carved out regions. This method of simply adding pseudo-obstructions or walls as a line of cells substantially adjacent or further from the start and stop vehicles' map locations creates a boundary neither can cross. It may in some cases it may not be crossed anyway, if the shortest motion path is nowhere near the walls.

If multiple start locations set and stop locations chosen are placed in the ordinary embodiment of the invention, it can find the shortest path lengths for all vehicles to a nearest stop location cell as the shortest length to the every cell from any start point will be generated in the initial ADL execution, and working back from each stop cell the minimum distance path will arrive the program at the nearest start cell.

Alternatively, multiple start location cells may be created or designated by low values or 0 value cells as usual and the shortest path associated with the start cell to a single stop cell can be found. This can be used to determine the destination cell with the shortest path associated with it by effectively reversing the meaning of the start and stop cell, thus the chip can for example find the closest exit based on the shortest path to it, and thus determine the shortest path to this discovered best exit. The result may appear similar to a river bed with tributaries, spokes of a wheel, a tree with branches and/or a combo of all three.

More information and more complex information may be usefully passed between cells in a more sophisticated design wherein the number or statistics of changes in path direction at each cell on (or off) the shortest path may be accumulated and passed forward by additional bus lines, allowing for possible allowable acceleration approximations along a straight line. Passing and knowing the path direction of the previous lowest cell(s) provides the info for this to be accumulated, calculated and maintained. An unchanged path direction or lesser changed path direction statistic passed forward indicates greater acceleration potential. Thus the quickest path being straighter and allowing for straight line acceleration may be found if desired rather than the shortest winding circuitous path. More complex math processing in each cell may be employed to achieve this, such as multiplication, trig functions, exponents and so forth needed to more accurately be used for and support physics-based mass, motion, acceleration, and velocity calculations and modeling of the situation in 2D, 3D or higher dimensions. The degree of change of the previous cells' minimum cell direction relative to the direction of the current cell's minimum cells' direction can be weighted to determine and weight the degree of path change, more severely for a right angle for example. The weight multiplier for a 90 degree turn being greater to much greater than a weight multiplier for a 45 degree turn, depending on the maneuverability characteristics of the vehicle modeled. Alternatively, added bus lines skipping the adjacent cells but connected to further surrounding cells may be used to acquire and send turn data and shortest distance calculations, increasing processing speed especially in straight line situations or path areas. Weights for these bus lines outputs and inputs would need to be adjusted according to distance and/or direction, 2× for skipping adjacent cell, 4× for skipping 3 cells, etc.

In an embodiment, a parallel-processing ADL chip typically appears as a memory-mapped RAM device and a memory region to a controlling CPU, with additional I/O lines and operations for setup, reset, halt, etc. The Map representation of the vehicle's 2D surrounding reality is written into the chip's ADL memory cells as weighting values and the resulting shortest path to any node including the node representing the designated ending location within the Map is read out from the chip after the chip's internal path-planning processing phase is completed. In addition to low power due to ADL logic, its inherent advantages are low power and high speed, with lower power used and higher speed attained during simpler path processing conditions or no significant map updates causing a change in the minimal path.

ADL logic, although very fast and very low power, has been known for decades but has rarely been used in large circuits and has never been attempted in a large-scale application. The timing sensitivity of the gate delays combined with the number of gates creates an exponentially growing complex number of interactions between possible state changes in the design. The simulation of even a moderate scale standard ADL (Asynch Digital Logic) typically requires significant effort to certify consistent and correct circuit results. Variations in gate speeds across the die due to semiconductor dopant gradations inherent in chip manufacturing processes influence the CMOS transistor speeds therein. Consistent result certainty has thus been unavailable for all but the simplest designs. However, the invention embodies a SDDA (Single Direction Dijkstra Algorithm) variant which is uniquely well suited to embodying an ADL approach and which is immune to timing variations, and indeed could be implemented in a platform containing drastically dissimilar logic speeds without affecting the correctness of the logic's optimized path planning results.

A further advantage of applying the invention SDDA ADL architecture is its inherent absence of 'race conditions' which traditionally plague ADL designed devices and have limited their adoption to all but simple circuits or small experimental CPUs. Because no race conditions can exist in the design, the ability to significantly reduce its size and power consumption using smaller semiconductor process geometries and associated lower voltages, such as in a 130 nm, 90 nm, 65 nm, 45 nm, 32 nm, 20 nm or smaller feature sizes 14 nm and upcoming 7 nm presents itself if desired. The design of the solution automatically compensates for variations in gate speeds across the die. No expensive, complex, lengthy design-time, interrelated gate-timing considerations and simulations need be considered or modeled when moving to smaller geometries (for example, a chip design can be implemented using a 14 nm process FinFET transistor based chip well suited for implementation of this design.)

In an embodiment, the topology of the real-world map is directly modeled and represented by the topology of the ADL cells, their internal 16-bit register weights, and their immediate interconnections to their neighboring cells within the chip. 'The Map is the chip, the chip is the Map.'

In an embodiment, the initial state initializes all path values to 65,535 or highest values possible.

In an embodiment, the start location cell is then given an initial path distance of 0 within its weight and its output weight lines to neighboring cells are set to reflect this.

This new minimum point on the chip creates a cascading effect, propagating outward from the start location cell in all directions, if incorporating default path lengths (10 or 14 (or analogous 5 or 7) for example) and calculating the distance, /temporary path length to the starting cell.

In complex configurations, an initial 'wave' of temporarily shortest paths spreads outwards, but simultaneous to this and 'behind' this the more circuitous minimum paths are being calculated and established. As they wind around, they update the initially created distance calculations to lower values.

The chip only reaches a final lowest minimum state for all cells reflecting their shortest distance to the start point after all lower-minimum paths have been completely propagated thru the chip.

Any update to any cell's weight or moving the start cell may typically (but not always) result in new minimum path ripples propagating along the shortest path routes. This may or may not intersect and influence the shortest path(s) between the start and end point cells Basically, the chip and its paths reach a kind of equilibrium where no lower distances can be found between any two cells anywhere, and processing changes updates propagations to any/all cell path distances stops A perpetual loop cannot happen anywhere within the chip, the values and interconnects for each cell stop updating when no lower input from any of its neighbors to each cell is sent, and each cell thus then cannot and may not send a lower, higher or different value to update its neighbors.

Metastability issues are eliminated, there are no 'latching' intermediate registers, the whole chip settles into its final resting state, not any single register. Put another way, the time window for state capture is 100's to 1000's times longer (or more) than a designed flip-flop would be. There are no flip-flops or runtime registers, only unrestrained gate-level adders, comparators, and simple glue logic of AND/OR/XOR gates; the initial Map registers may only be initially 'Latched-in' by the highly predictable and timing-defined CPU's R/~W line. The output weight results may not be latched in, but remain stable due to the final settled state of the chip. A change may cause a disruption that propagates until a new stable state is set.

In an embodiment, therein is provided a custom-designed clock-less asynchronous-digital-logic approach to create a high-speed, low-power, 'low-level' path-planning/shortest path(s) finding, single-purpose dedicated processing chip to quickly and simultaneously search the current best path(s) to target.

This embodiment can create an instantiated Single-Directional variant of the Dijkstra Algorithm (SDDA) in an array of ADL unit cells (detailed below) which may be on a 180-nm process die with an estimated node cell size of 82 microns. Using the common and inexpensive 180-nm process, a 128×128 granularity processing path capability may conservatively consume a 10.5 mm×10.5 mm area of the resulting die in a $2^{1/2}$Dimension path planning solution while providing a 16-bit (65,536) level weighting resolution for each node. An additional $0.8=^2$ of die area may be set aside for Path Weighting Input Logic (PWIL) and Optimal Path Results Output (OPRO) interface logic to a Ball Grid Array (BGA) located in the bottom of the chip package for Printed Circuit Board (PCB) connection and placement. As an ADL approach only consumes power when its logic gates switch (change state, e.g. 0 to 1 or 1 to 0), the gates and associated nodes which have already determined their shortest path to the starting point or ending point may immediately cease drawing normal switching current and thus cease generating heat, only consuming a much smaller minimal leakage current needed to maintain their logic voltage state. The ADL approach requires power commensurate with the path complexity and thus reduces or stops power consumption and heat generation as a solution is being reached. This contrasts with FPGAs, CPUs, and GPUs which continuously use RTL logic and its associated distributed clocks, wherein the power consumed and resulting heat dissipation required is much greater. Further, each logic gate in the ADL approach inherently switches at its maximum speed (and only when it NEEDS to switch), thereby running faster than a RTL-based approach implemented in the same area using the same process. Further, the power consumed by the logic gates' switching spreads out from the start node and end (target location) node as the solution inherently progresses outward, and does not remain concentrated in specific regions of the chip. A symbiotic benefit of the reduced power characteristics applies well to a future stacked 3D die of enhanced 2D 128×128 node cells; a true exclusively hardware based 3D path planning capability (ex. 128×128×32 nodes) can created, each node with 65K-level weighting, of the same processing speed and constructed using a BGA interconnected and stacked multi-die solution of multiple 2D dies in a single package volume. This is possible because the inner layers consume only minimal power when and if they are switching, and may not accumulate excessive heat and necessitate additional thermal mitigation architecture.

In an embodiment, a self-directed vehicle comprising a control arrangement with an unclocked CMOS logic chip using a parallelized approach with Asynchronous Digital Logic (ADL), the control arrangement being configured to generate a shortest travel path based on geographical parameters of a terrain to be traveled by the self-directed vehicle.

In an embodiment, a self-directed vehicle comprising a control arrangement with a reconfigurable, asynchronous, and clock-less data co-processor that only executes arithmetical operations, the control arrangement being configured to generate a shortest travel path based on geographical parameters of a terrain to be traveled by the self-directed vehicle.

In an embodiment, a method of generating a shortest travel path based on geographical parameters of a terrain to be traveled by the self-directed vehicle comprises the steps of providing a reconfigurable, asynchronous, and clock-less data co-processor that comprises a plurality of addressable configurable cells arranged as a multidimensional orthogonal array and that only executes arithmetical operations; overlaying a map of a geographical region over the array and assigning a portion of the geographical region to each cell; selecting a starting cell from the plurality of addressable configurable cells; selecting an end cell; and calculating, using a Dijkstra algorithm implemented in a hardware format by way of the cell array, the shortest travel path between the starting cell and the end cell based on absolute minimum values calculated from the starting cell.

A feature of this embodiment is that the method can further comprise a step of assigning a weight factor to each portion of the geographical region based on a type of a terrain in the each portion prior to the step of calculating the shortest travel path and a step of assigning the weight factor to a respective cell from the plurality of addressable configurable cells.

A feature of this embodiment is that the method can further comprise a step of monitoring a current drawn by during a calculation of the shortest travel path.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The chosen exemplary embodiments of the claimed subject matter have been described and illustrated, to plan and/or cross section illustrations that are schematic illustrations of idealized embodiments, for practical purposes so as to enable any person skilled in the art to which it pertains to make and use the same. As variations from the shapes of the illustrations as a result, for example, of manufacturing techniques and/or tolerances, are to be expected. It is therefore intended that all matters in the foregoing description and shown in the accompanying drawings be interpreted as illustrative and not in a limiting sense. For example, a region illustrated or described as flat may, typically, have rough and/or nonlinear features. Moreover, sharp angles that are illustrated may be rounded. Thus, the regions illustrated in thefigures are schematic in nature and their shapes are not intended to illustrate the precise shape of a region and are not intended to limit the scope of the present claims. It will be understood that variations, modifications, equivalents and substitutions for components of the specifically described exemplary embodiments of the invention may be made by those skilled in the art without departing from the spirit and scope of the invention as set forth in the appended claims.

It should be appreciated that reference throughout this specification to "one embodiment" or "an embodiment" means that a particular feature, structure or characteristic described in connection with the embodiment is included in at least one embodiment of the disclosed subject matter. Therefore, it is emphasized and should be appreciated that two or more references to "an embodiment" or "one embodiment" or "an alternative embodiment" in various portions of this specification are not necessarily all referring to the same embodiment or the same variation. Furthermore, the particular features, structures or characteristics may be combined as suitable in one or more embodiments of the disclosed subject matter.

Similarly, it should be appreciated that in the description of embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

Any element in a claim that does not explicitly state "means for" performing a specified function, or "step for" performing a specified function, is not to be interpreted as a "means" or "step" clause as specified in 35 U.S.C. § 112, ¶ 6. In particular, any use of "step of" in the claims is not intended to invoke the provision of 35 U.S.C. § 112, ¶ 6.

Any numerical value inherently contains certain errors necessarily resulting from the standard deviations found in their respective testing measurements.

Anywhere the term "comprising" is used, embodiments and components "consisting essentially of" and "consisting of" are expressly disclosed and described herein."

What is claimed is:

1. A reconfigurable, asynchronous, and clock-less cell array core that executes arithmetical operations, said cell array core comprising:

a plurality of addressable configurable cells arranged as a multidimensional orthogonal array, each cell from said plurality of addressable configurable cells comprising:

a cell input/output (I/O) interface, said I/O interface comprising a plurality of cell input/outputs (I/Os), each cell I/O from said plurality of cell I/Os connects one cell input to one output from one immediately adjacent cell, a plurality of 16-bit input adders, each input adder from said plurality of 16-bit input adders being in a 16-bit register connection with one cell input from said plurality of cell I/Os, four first data comparators, each first data comparator from said four first data comparators being in a 16-bit register connection with two input adders from said plurality of 16-bit input adders and receiving data from said two 16-bit input adders, two second data comparators, each second data comparator from said second data comparators being in a 16-bit register connection with two first data comparators and receiving data from said two first data comparators, a third data comparator being in a 16-bit register connection with said two second data comparators and receiving data from said two second data comparators, an orthogonal input value register, a diagonal input value register, an output value register being in a 16-bit register connection with said third data comparator, an AND gate that has an output connection to said orthogonal input value register, said diagonal input register and said output value register, two 16-bit output adders, each 16-bit output adder comprising 16-bit connections to four cell outputs from said plurality of cell I/Os, a cell data register bus interface, and a plurality of cell data register buses, comprising:

a first 16-bit cell register bus that inputs a value from said cell data register bus interface to said orthogonal input value register and said diagonal input value register, a second 16-bit cell register bus that reads a value from said orthogonal input value register to four 16-bit input adders, a third 16-bit cell register bus that inputs a value from said diagonal input value register to four 16-bit input adders, a fourth 16-bit cell register bus that inputs a value from said diagonal input value register to one 16-bit output adder circuit, a fifth 16-bit cell register bus that inputs a value from said orthogonal input value register to another 16-bit output adder circuit, a sixth 16-bit cell register bus that inputs a value from said output value register to each of said two 16-bit output adders, and a seventh 16-bit register bus from said output value register to said cell data register bus interface;

an eighth 16-bit cell register bus from each 16-bit input adder to a respective first data comparator from said first data comparators, where two 16-bit input adders are connected to one first data comparator, a ninth 16-bit cell register bus that communicates a lowest value from each first data comparator to said second data comparator, where two first data comparators are connected to one second data comparator, a tenth 16-bit cell register bus from each second data comparator to a third data comparator, an eleventh sixth 16-bit cell register bus that communicates a lowest cell value from said third data comparator to said output value register, a twelfth 16-bit cell register bus that communicates cell values from one 16-bit output adder to four orthogonal cell outputs, a thirteenth 16-bit cell register bus that communicates cell values from another 16-bit output adder to four diagonal cell outputs, and a fourteenth 16-bit cell register bus that communicates cell values from each cell input to its respective 16-bit input adder;

a cell value select control line that inputs a cell value selection to each of said orthogonal input value register, said diagonal input register and said output value register;

a column address selection control line with an input to said AND gate;

a row address selection control line with an input to said AND gate;

a read/write control line with an input to each of said orthogonal input value register, said diagonal input register and said output value register;

an array data bus interface;

a 16-bit array register bus configured to transmit register data between said array data bus interface and each cell data register bus interface;

a 14-bit array address bus comprising:
  a plurality of row address selection control lines, each of said plurality of row address selection control lines transmits data to each cell in a single row of addressable configurable cells, and
  a plurality of column address selection control lines, each of said plurality of column address selection control lines transmits data to each cell in a single column of addressable configurable cells; and a plurality of control lines that communicate to all cells, comprising:
  a read/write array control line,
  a reset/run array control line, and
  a cell value array selection control line;

said plurality of addressable configurable cells interconnected by said plurality of said cell data register buses, and configured to process, asynchronously and without a use of any clock, said data transmitted by said plurality of data buses and said plurality of I/O connections.

2. The cell array core of claim 1, wherein said 16-bit array register bus writes, during operation of said cell array core, relative local Weight^Length parameters into each cell based on properties of real world conditions to be represented by that cell and reads total absolute (external) Weight^Length results from said each cell.

3. The cell array core of claim 1, wherein said cell input/output (I/O) connections transmit, during operation of said cell array core, lowest absolute Weight^Length results from said each cell to immediately adjacent cells and receive lowest absolute Weight^Length results from said immediately adjacent cells.

4. The cell array core of claim 1, wherein said plurality of cell data buses transfer, during operation of said cell array core, calculated (added) absolute Weight^Length results and least-calculated absolute Weight^Length results between adders, comparators and registers within said each cell.

5. The cell array core of claim 1, wherein said plurality of cell data buses transfer, during operation of said cell array core, local Weight^Length parameters from registers to adders.

6. The cell array core of claim 1, wherein said array control lines set, during operation of said cell array core, a state of said cell array and select an operational mode, said operational mode being one of a set-up, a run and a read-results.

7. The cell array core of claim 1, wherein, during operation of said cell array core, said array control lines decode, specify and act to control/coordinate/activate/deactivate logic circuits and register activity within the cells based on values transmitted by said array control lines.

8. The cell array core of claim 1, wherein said plurality of control lines communicate same value to said all cells simultaneously.

9. A reconfigurable, asynchronous, and clock-less data co-processor, comprising:
  a reconfigurable, asynchronous, and clock-less cell array core that executes arithmetical operations, said cell array core comprising:
    a plurality of addressable and configurable cells arranged as a multidimensional orthogonal array, each cell from said plurality of addressable and configurable cells being in an input coupling and/or an output coupling with each immediately adjacent cell,
    a plurality of data buses and control lines configured to transmit data between individual cells within said cell array core and transmit data within said each cell,
    said each cell comprises adders, numeric comparators, input registers and output registers, and
    said each cell is configured, during operation of said cell array core, to receive one lowest absolute value from said each immediately adjacent cell and transmit another lowest absolute value to said each immediately adjacent cell;
  an input/output (I/O) terminal interface;
  a data register bus configured to transmit register data between said input/output (I/O) terminal interface and said cell array core;
  an address bus configured to transmit row and column data between said input/output (I/O) terminal interface and said cell array core; and
  a plurality of control lines.

10. The co-processor of claim 9, further comprising a casing, a die disposed within said casing, said cell array core, and said plurality of data buses being disposed on said die, and said input/output (I/O) terminal interface accessible from exterior surface(s) of said casing.

11. The co-processor of claim 9, further comprising:
  a current draw sensor and comparator, and wherein said (I/O) terminal interface further comprises:
  a ground terminal;
  a comparator voltage input terminal;
  a current set point input terminal; and a circuit current comparator voltage output terminal.

12. The co-processor of claim 9, wherein said cell array core, when overlaid with a geographical map region, is configured to determine a shortest distance between two coordinate points in said geographical map region, a first coordinate point from said two coordinate points is associated with one cell from said plurality of addressable and configurable cells and defines a start coordinate point in said geographical map region and a second coordinate point is associated with another cell from said plurality of addressable and configurable cells and defines an end coordinate point in said geographical map region, and where each cell from at least some of remaining cells from said plurality of addressable and configurable cells, between said start cell and said end cell, receives a numerical value corresponding to a feature in said geographical map region.

13. The co-processor of claim 9, further comprising means for detecting a completion of operation within said cell array core.

14. A reconfigurable, asynchronous, and clock-less cell array core, comprising:
 a plurality of addressable and configurable cells arranged as a multidimensional orthogonal array, each cell from said plurality of addressable and configurable cells being in an input coupling and/or an output coupling with each immediately adjacent cell; and
 a plurality of data buses and control lines configured to transmit data between individual cells within said cell array core and transmit data within said each cell;
 said each cell comprises adders, numeric comparators, input registers and output registers;
 said each cell is configured, during operation of said cell array core, to receive one lowest absolute value from said each immediately adjacent cell and transmit another lowest absolute value to said each immediately adjacent cell.

15. The reconfigurable, asynchronous, and clock-less cell array core of claim 14, further comprising a current draw sensor configured to monitor a current drawn by said cell array core during operation.

16. The reconfigurable, asynchronous, and clock-less cell array core of claim 14, wherein said each cell is configured, during operation of said cell array core, to transmit a calculated value to all cells from said cell array core that are being disposed immediately adjacent to said each cell, said calculated value resulting from an arithmetic operation performed within said each cell based on values received from said all cells from said cell array core that are being disposed immediately adjacent to said each cell.

17. The reconfigurable, asynchronous, and clock-less cell array core of claim 14, further comprising an input/output (I/O) terminal interface, said plurality of data buses and control lines being further configured to transmit data to and from said I/O terminal interface.

18. The reconfigurable, asynchronous, and clock-less cell array core of claim 14, wherein at least one cell from said cell array core is configured to ignore, during operation of said cell array core, input values from immediately adjacent cells.

19. The reconfigurable, asynchronous, and clock-less cell array core of claim 14, wherein said each cell comprises a numeric weight factor.

20. The reconfigurable, asynchronous, and clock-less cell array core of claim 14, wherein said multidimensional orthogonal array defines a 2D array or a 3D array.

* * * * *